(12) United States Patent
Zhang et al.

(10) Patent No.: US 12,035,520 B2
(45) Date of Patent: Jul. 9, 2024

(54) THREE DIMENSIONAL MEMORY DEVICE CONTAINING DUMMY WORD LINES AND P-N JUNCTION AT JOINT REGION AND METHOD OF MAKING THE SAME

(71) Applicant: SANDISK TECHNOLOGIES LLC, Addison, TX (US)

(72) Inventors: Yanli Zhang, San Jose, CA (US); Peng Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 438 days.

(21) Appl. No.: 17/485,949

(22) Filed: Sep. 27, 2021

(65) Prior Publication Data

US 2023/0099107 A1 Mar. 30, 2023

(51) Int. Cl.
| | |
|---|---|
| *H10B 41/20* | (2023.01) |
| *H10B 41/10* | (2023.01) |
| *H10B 41/41* | (2023.01) |
| *H10B 43/10* | (2023.01) |
| *H10B 43/20* | (2023.01) |
| *H10B 43/40* | (2023.01) |

(52) U.S. Cl.
CPC ............. *H10B 41/20* (2023.02); *H10B 41/41* (2023.02); *H10B 43/20* (2023.02); *H10B 43/40* (2023.02); *H10B 41/10* (2023.02); *H10B 43/10* (2023.02)

(58) Field of Classification Search
CPC ........ H10B 41/20; H10B 41/41; H10B 41/10; H10B 41/27; H10B 41/40; H10B 43/20; H10B 43/40; H10B 43/10; H10B 43/27; H01L 29/40117
See application file for complete search history.

(56) References Cited

U.S. PATENT DOCUMENTS

| 9,985,098 B2 | 5/2018 | Matsumoto et al. |
| 10,008,570 B2 | 6/2018 | Yu et al. |
| (Continued) | | |

OTHER PUBLICATIONS

Notification of Transmittal of The International Search Report and Written Opinion of the International Searching Authority for International Patent Application No. PCT/US2022/030029, mailed Sep. 21, 2022, 8 pages.

(Continued)

*Primary Examiner* — Shaun M Campbell
(74) *Attorney, Agent, or Firm* — THE MARBURY LAW GROUP PLLC

(57) ABSTRACT

A three-dimensional memory device includes a first alternating stack of first insulating layers and first electrically conductive layers located over a semiconductor material layer, an inter-tier dielectric layer, and a second alternating stack of second insulating layers and second electrically conductive layers located over the inter-tier dielectric layer. A memory opening vertically extends through the second alternating stack, the inter-tier dielectric layer, and the first alternating stack. A memory opening fill structure is located in the memory opening, and includes a first vertical semiconductor channel, a second vertical semiconductor channel, and an inter-tier doped region located between the first and the second semiconductor channel, and providing a first p-n junction with the first vertical semiconductor channel and providing a second p-n junction with the second vertical semiconductor channel.

20 Claims, 49 Drawing Sheets

(56) References Cited

U.S. PATENT DOCUMENTS

| | | | |
|---|---|---|---|
| 10,020,363 | B2 | 7/2018 | Ogawa et al. |
| 10,566,059 | B2 | 2/2020 | Diep et al. |
| 10,580,787 | B2 | 3/2020 | Nishikawa et al. |
| 10,629,613 | B1 | 4/2020 | Shimizu et al. |
| 10,797,070 | B2 | 10/2020 | Mushiga et al. |
| 10,923,496 | B2 | 2/2021 | Mushiga et al. |
| 10,937,800 | B2 | 3/2021 | Kim et al. |
| 11,049,568 | B1* | 6/2021 | Yada ............... H10B 43/27 |
| 11,121,153 | B1 | 9/2021 | Obu et al. |
| 11,127,759 | B2 | 9/2021 | Obu et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2019/0043830 | A1* | 2/2019 | Sakakibara ......... H10B 43/27 |
| 2019/0333581 | A1 | 10/2019 | Diep et al. |
| 2019/0371800 | A1 | 12/2019 | Nishikawa et al. |
| 2020/0105778 | A1* | 4/2020 | Zhang ............ H01L 29/40117 |
| 2020/0203371 | A1* | 6/2020 | Lee .................. H10B 41/27 |
| 2020/0303399 | A1 | 9/2020 | Xiao |
| 2021/0020650 | A1 | 1/2021 | Yang et al. |
| 2021/0050362 | A1 | 2/2021 | Bicksler et al. |
| 2021/0159169 | A1 | 5/2021 | Zhao et al. |
| 2021/0265379 | A1 | 8/2021 | Obu et al. |
| 2021/0265380 | A1* | 8/2021 | Obu ............... H01L 29/41741 |

OTHER PUBLICATIONS

Endoh et al., "Novel Ultra High Density Memory with a Stacked-Surrounding Gate Transistor (S-SGT) Structured Cell," IEDM Proc. (2001) 33-36.

U.S. Appl. No. 17/158,395, filed Jan. 26, 2021, SanDisk Technologies LLC.

U.S. Appl. No. 17/375,476, filed Jul. 14, 2021, SanDisk Technologies LLC.

* cited by examiner

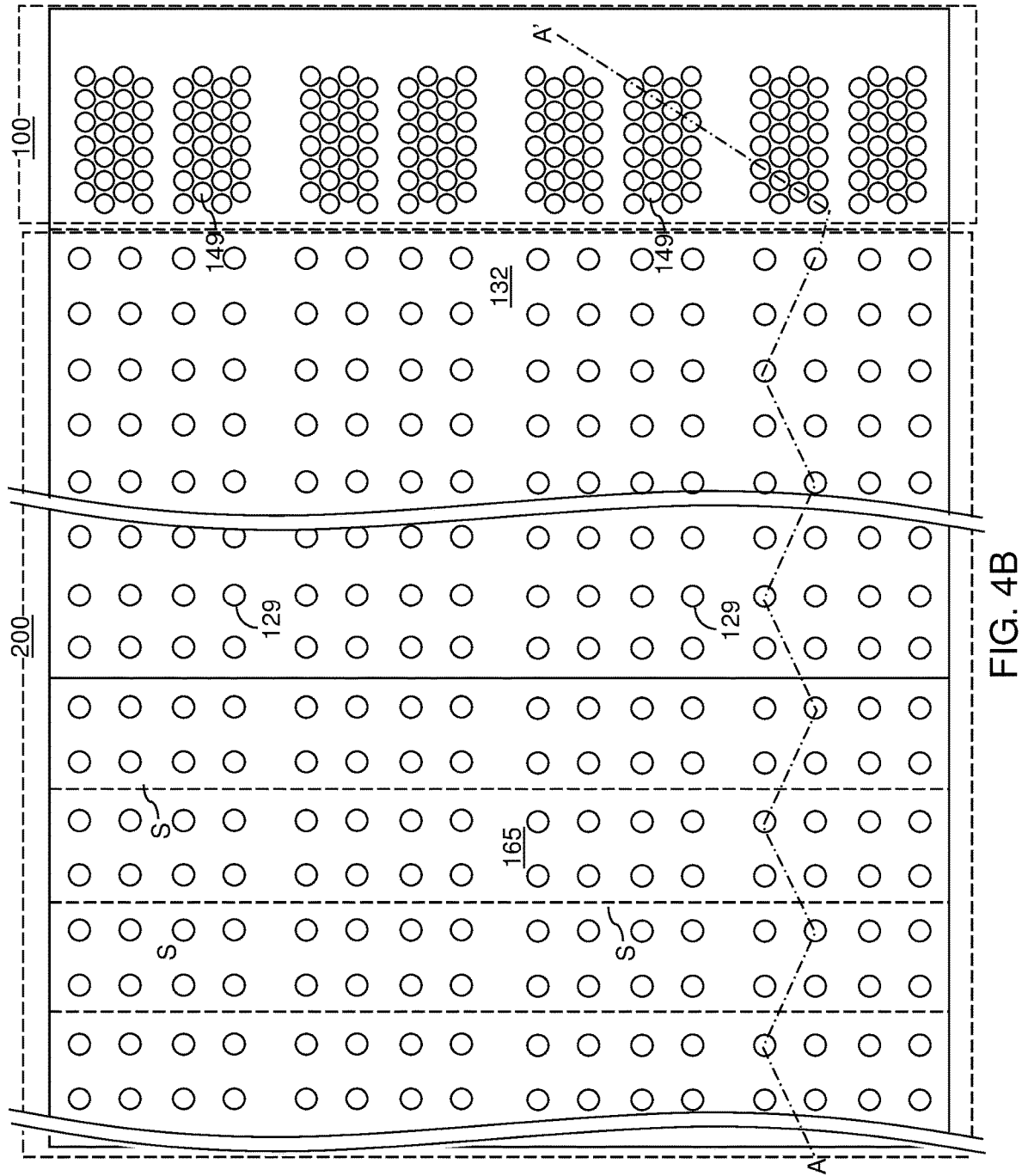

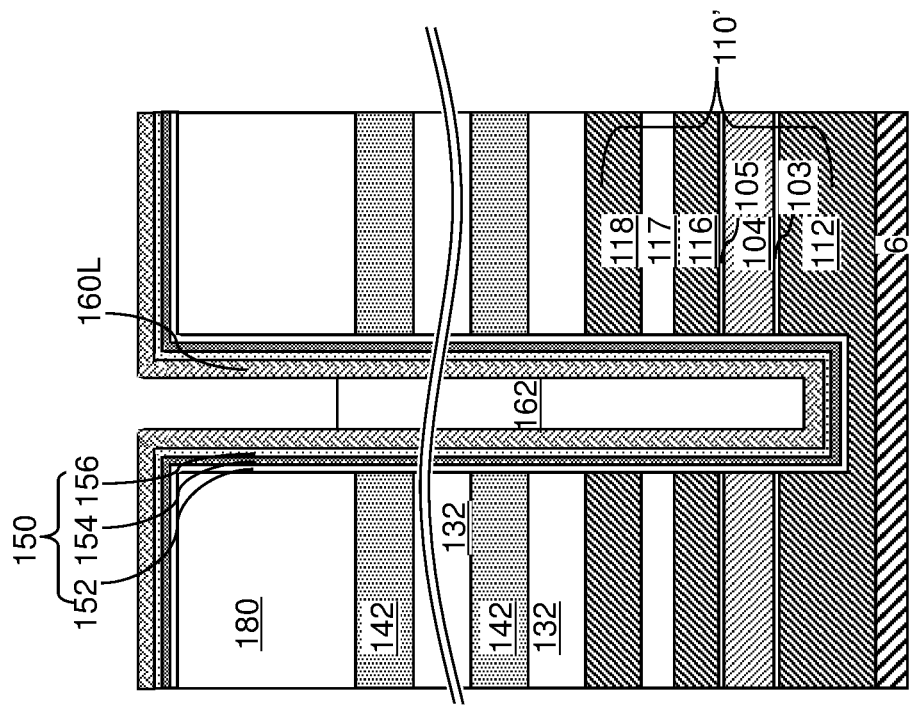
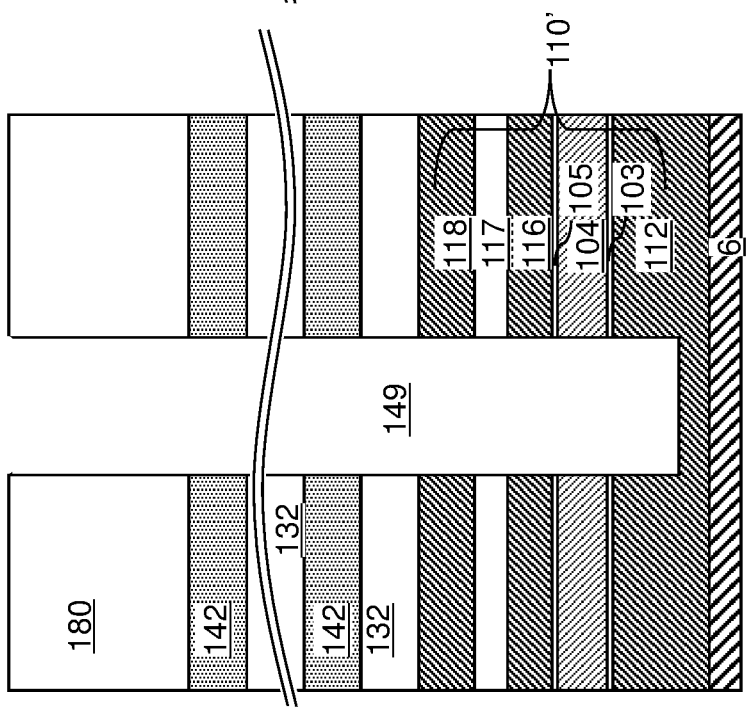
FIG. 5B
FIG. 5A

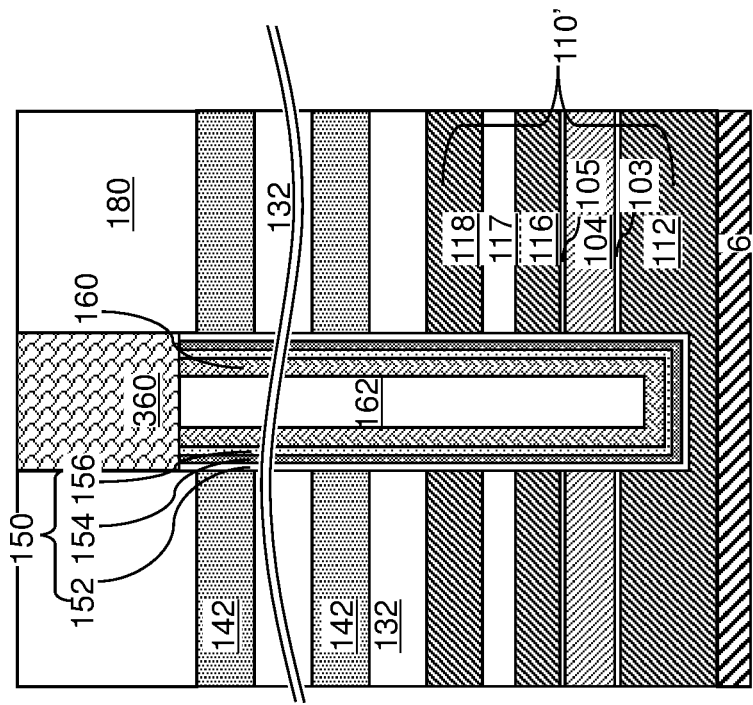
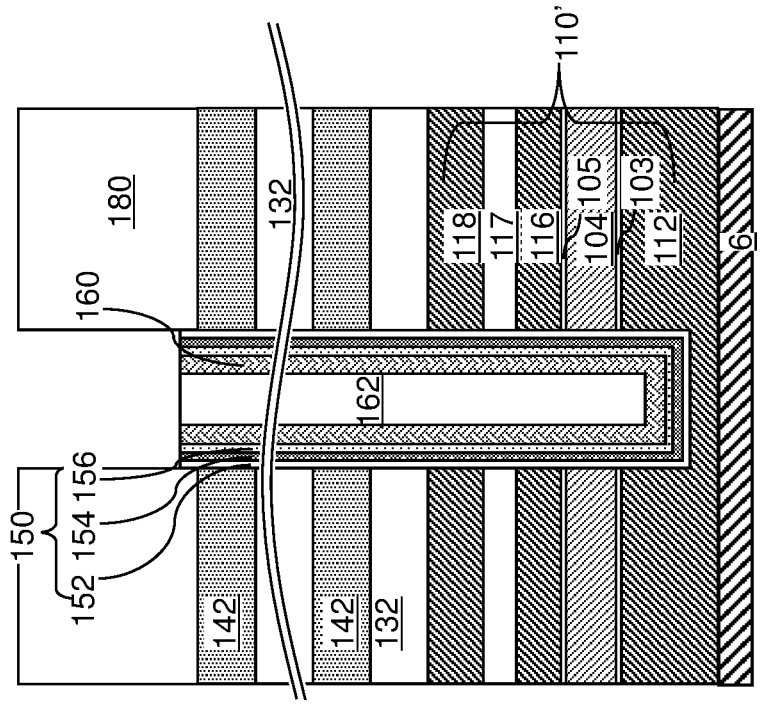

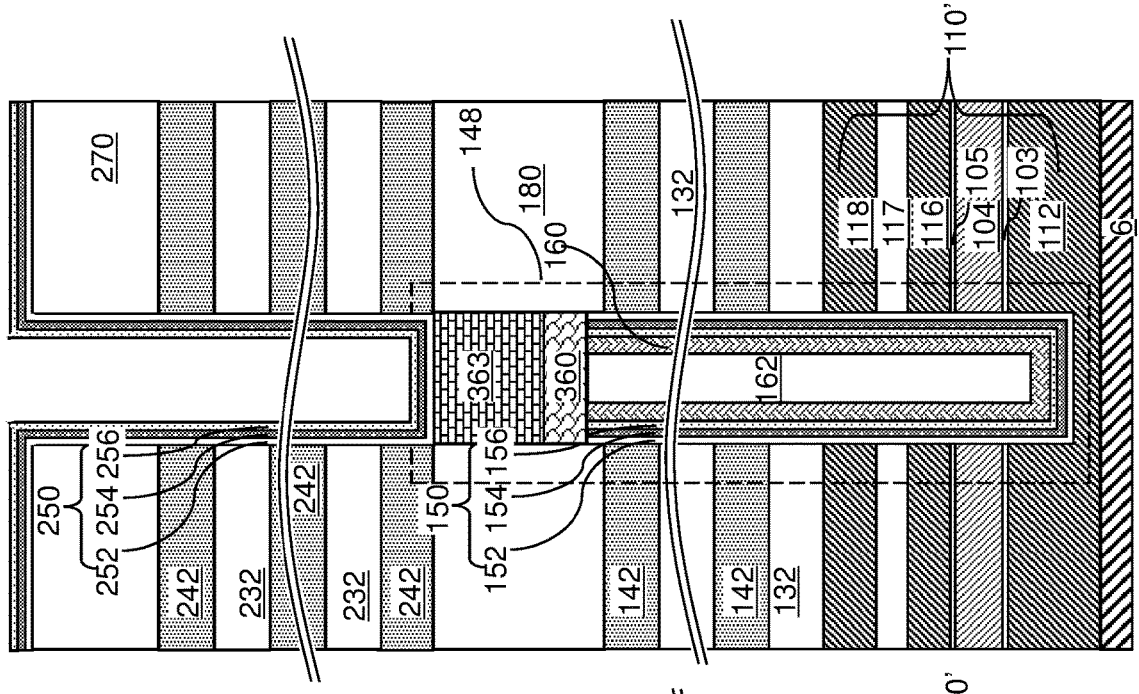

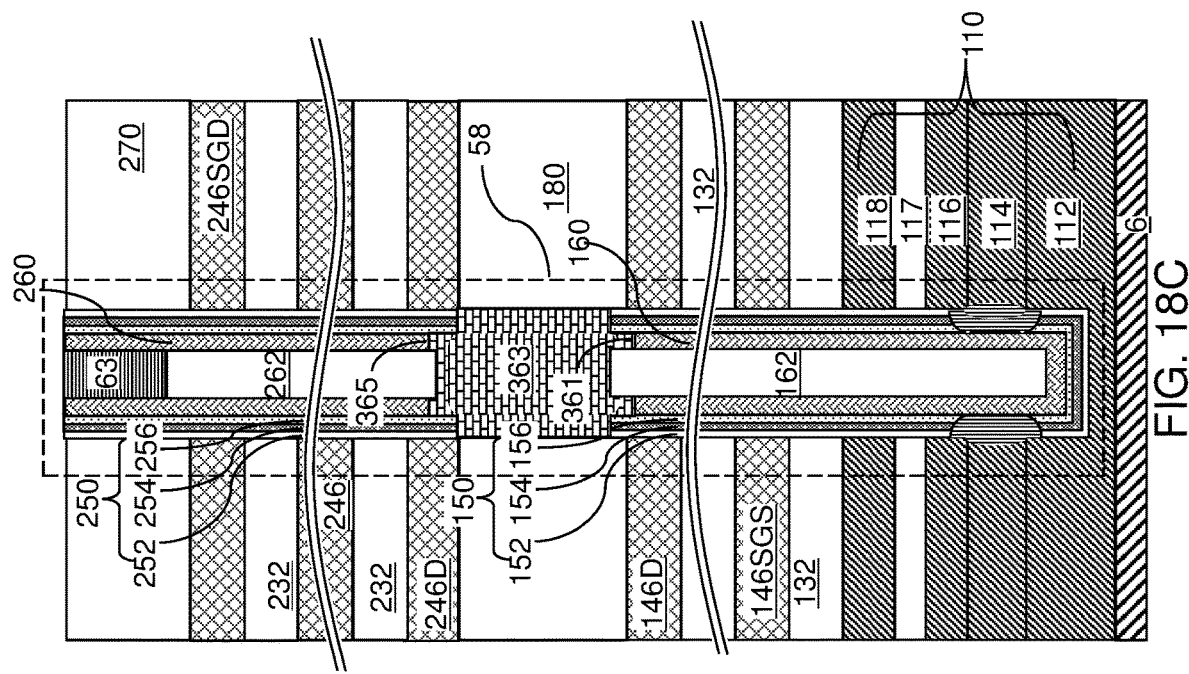

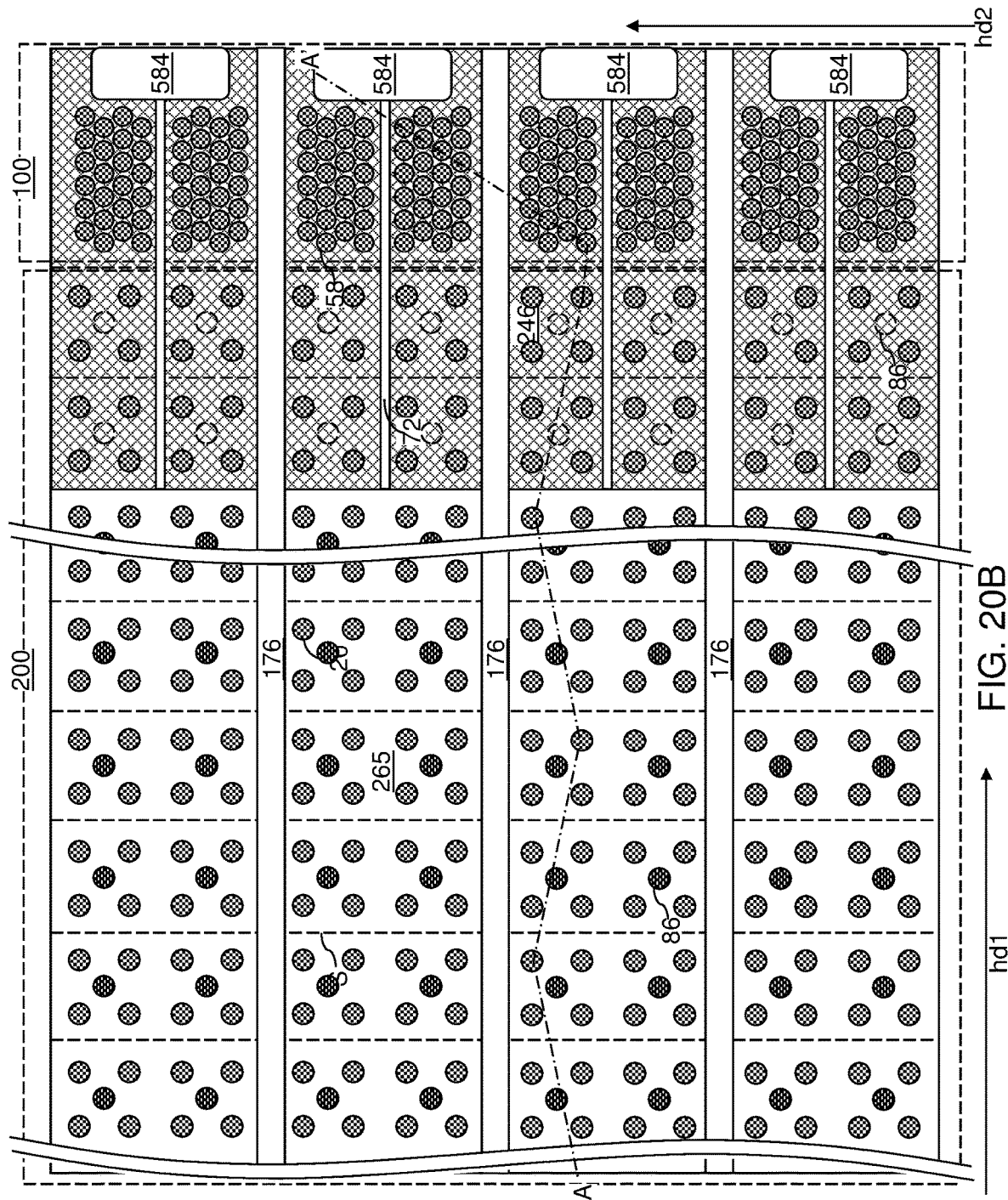

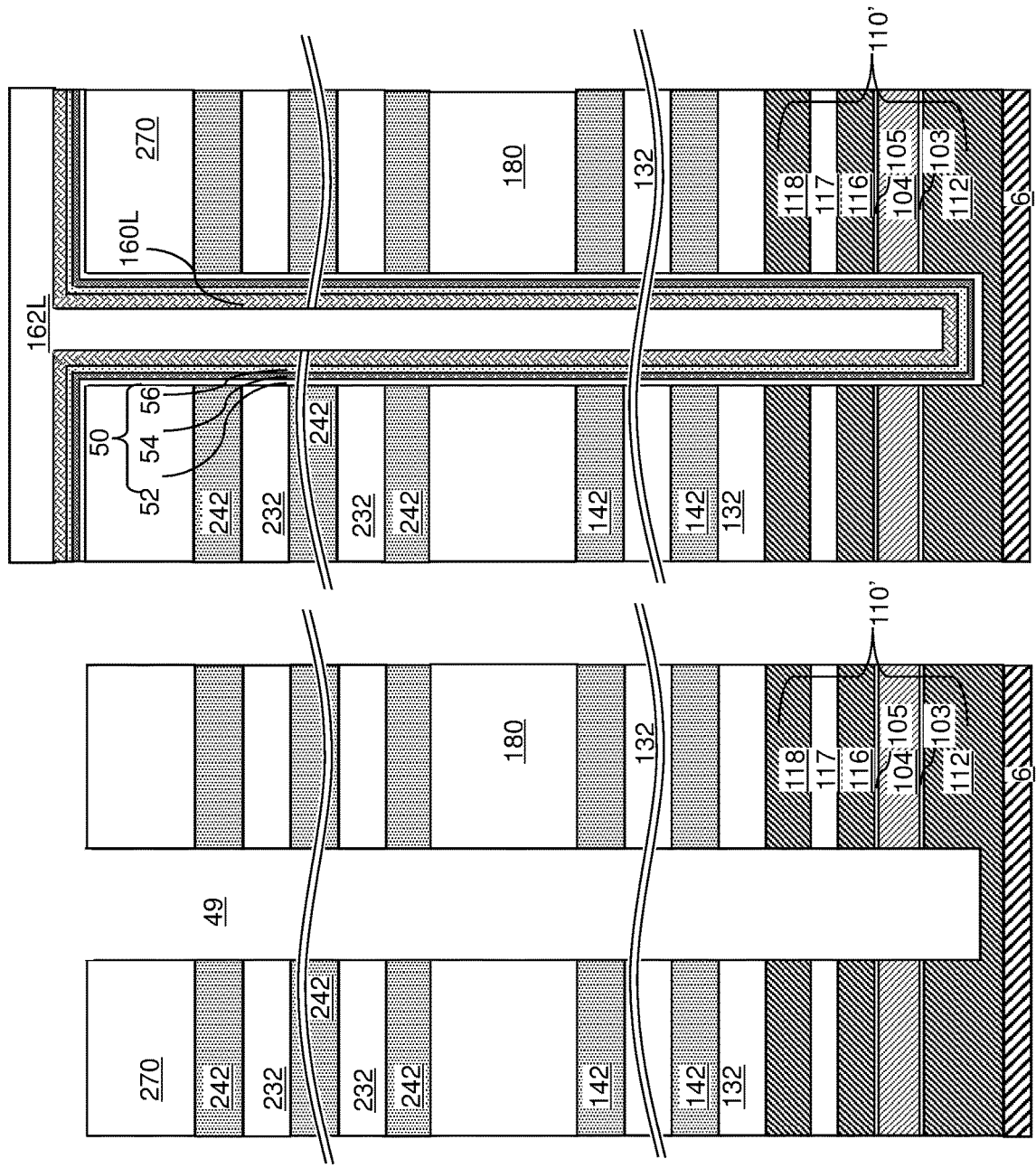

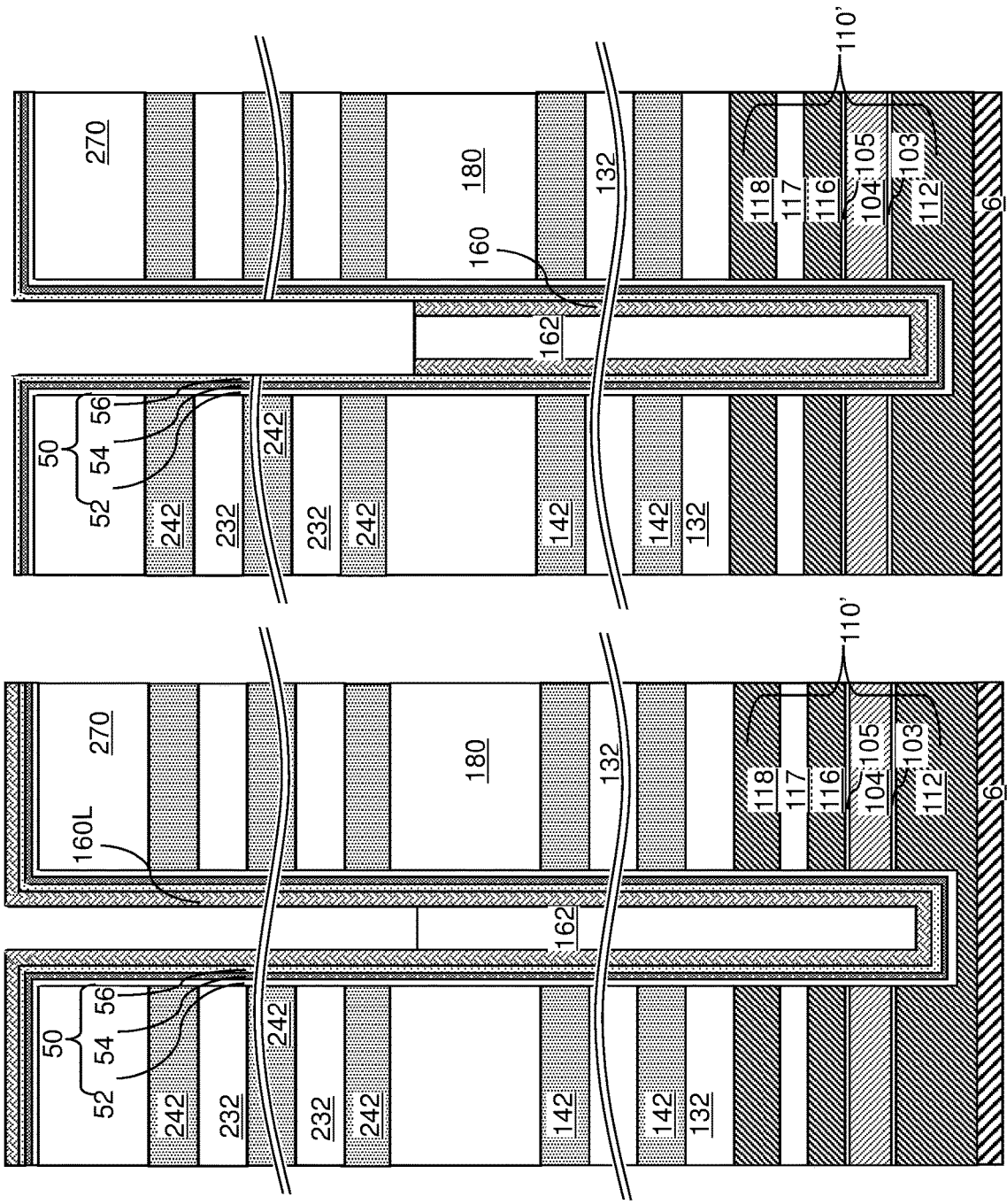

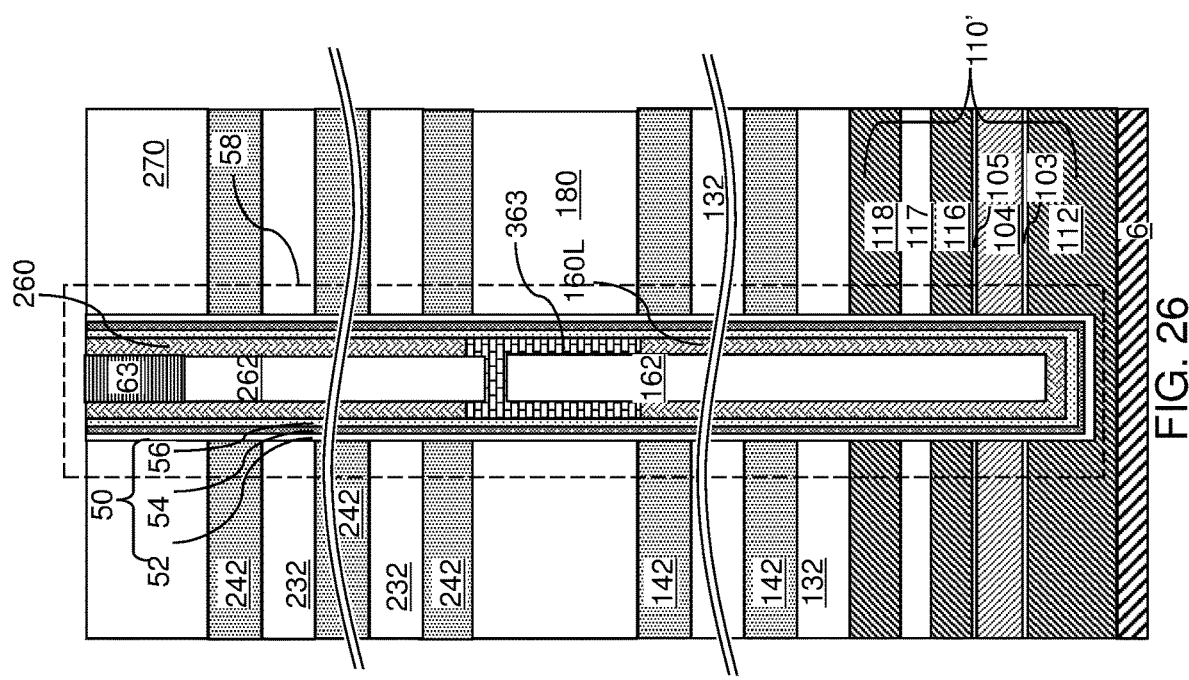

THREE DIMENSIONAL MEMORY DEVICE CONTAINING DUMMY WORD LINES AND P-N JUNCTION AT JOINT REGION AND METHOD OF MAKING THE SAME

FIELD

The present disclosure relates generally to the field of semiconductor devices, and particularly to a three-dimensional memory device including dummy word lines and p-n junction at a joint region between device tiers and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a first alternating stack of first insulating layers and first electrically conductive layers; an inter-tier dielectric layer located over the first alternating stack; a second alternating stack of second insulating layers and second electrically conductive layers located over the inter-tier dielectric layer; a memory opening vertically extending through the second alternating stack, the inter-tier dielectric layer, and the first alternating stack; and a memory opening fill structure located in the memory opening and comprising a first vertical semiconductor channel vertically extending through the first alternating stack and having a doping of a first conductivity type, a second vertical semiconductor channel vertically extending through the second alternating stack and having a doping of the first conductivity type, and an inter-tier doped region having a doping of a second conductivity type located between the first and the second vertical semiconductor channels, and providing a first p-n junction with the first vertical semiconductor channel and providing a second p-n junction with the second vertical semiconductor channel.

According to another aspect of the present disclosure, a method of forming a three-dimensional semiconductor device, which comprises: forming a first alternating stack of first insulating layers and first spacer material layers, an inter-tier dielectric layer, and a second alternating stack of second insulating layers and second spacer material layers over a semiconductor material layer, wherein the first spacer material layers and the second spacer material layers are formed as, or are subsequently replaced with, first electrically conductive layers and second electrically conductive layers, respectively; and forming a memory opening fill structure through the first alternating stack, the inter-tier dielectric layer, and the second alternating stack, wherein the memory opening fill structure comprises a first vertical semiconductor channel vertically extending through the first alternating stack and having a doping of a first conductivity type, a second vertical semiconductor channel vertically extending through the second alternating stack and having a doping of the first conductivity type, and an inter-tier doped region having a doping of a second conductivity type located between the first and the second semiconductor channel, and providing a first p-n junction with the first vertical semiconductor channel and providing a second p-n junction with the second vertical semiconductor channel.

BRIEF DESCRIPTION OF THE DRAWINGS

FIG. 4B is a horizontal cross-sectional view of the first exemplary structure of FIG. 4A. The hinged vertical plane A-A' corresponds to the plane of the vertical cross-sectional view of FIG. 4A.

FIGS. 5A-5E are sequential vertical cross-sectional views of a region of the first exemplary structure that includes a first-tier memory opening during formation of a first-tier memory opening fill structure according to the first embodiment of the present disclosure.

FIGS. 9A-9F are sequential vertical cross-sectional views of a region of the first exemplary structure that includes a second-tier memory opening during formation of a second-tier memory opening fill structure according to the first embodiment of the present disclosure.

FIG. 18C is a vertical cross-sectional view of a region of the first exemplary structure of FIG. 18A.

FIG. 20B is a horizontal cross-sectional view of the first exemplary structure along the vertical plane B-B' of FIG. 20A. The hinged vertical plane A-A' corresponds to the plane of the vertical cross-sectional view of FIG. 20A.

FIGS. 25A-25H are sequential vertical cross-sectional views of an inter-tier memory opening in the second exemplary structure during formation of a memory opening fill structure according to the second embodiment of the present disclosure.

FIG. 26 is a vertical cross-sectional view of a region of the second exemplary structure after replacement of in-process source-level material layers with source-level material layers according to the second embodiment of the present disclosure.

DETAILED DESCRIPTION

Figure 1A:
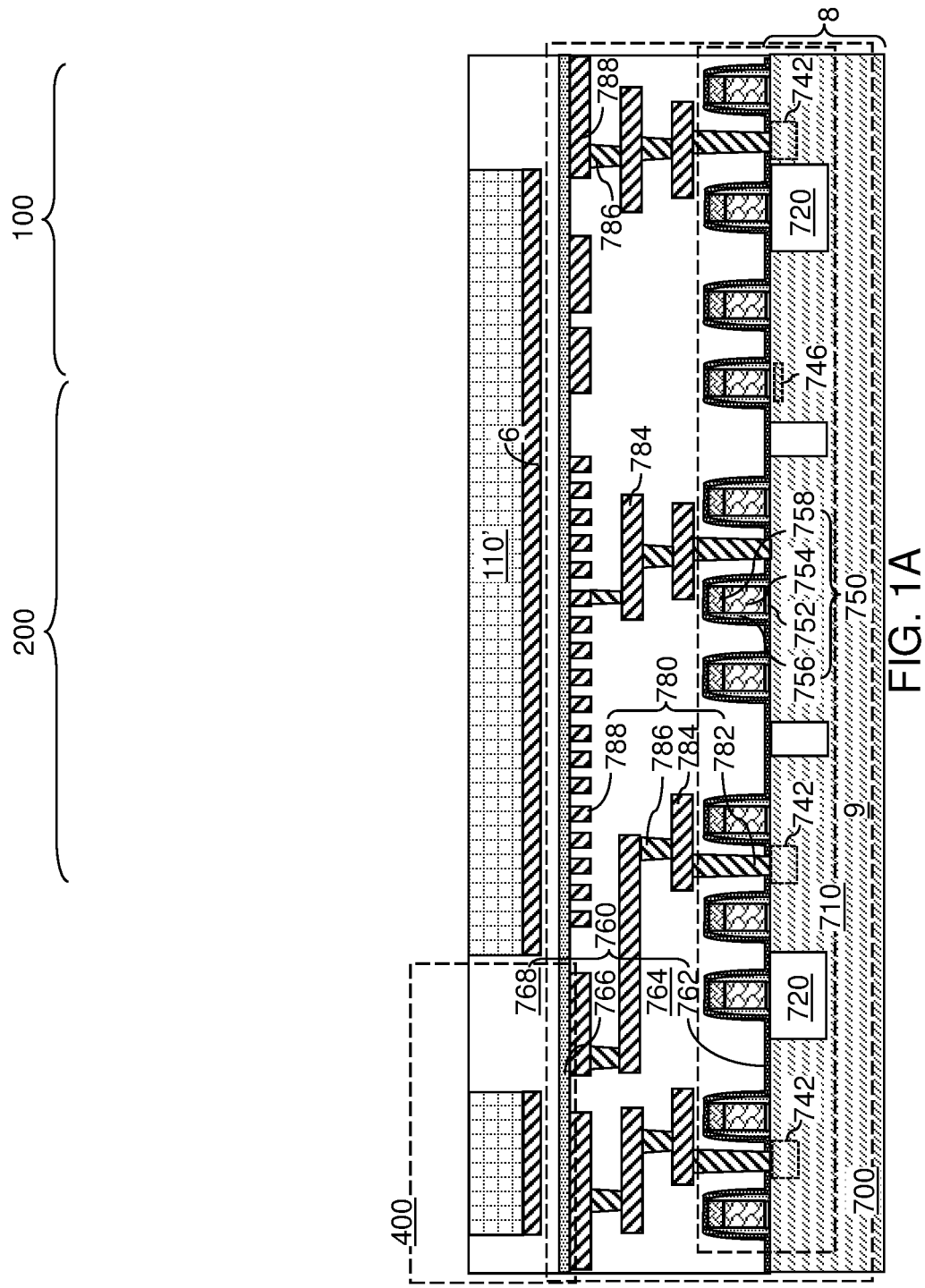
FIG. 1A is a vertical cross-sectional view of a first exemplary structure after formation of semiconductor devices, lower level dielectric layers, lower metal interconnect structures, and in-process source level material layers on a semiconductor substrate according to a first embodiment of the present disclosure.

Embodiments of the present disclosure provide a three-dimensional memory device including dummy word lines and a p-n junction in the semiconductor channel at a joint region between the lower and upper device tiers and methods of manufacturing the same the various aspects of which are described herein in detail. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
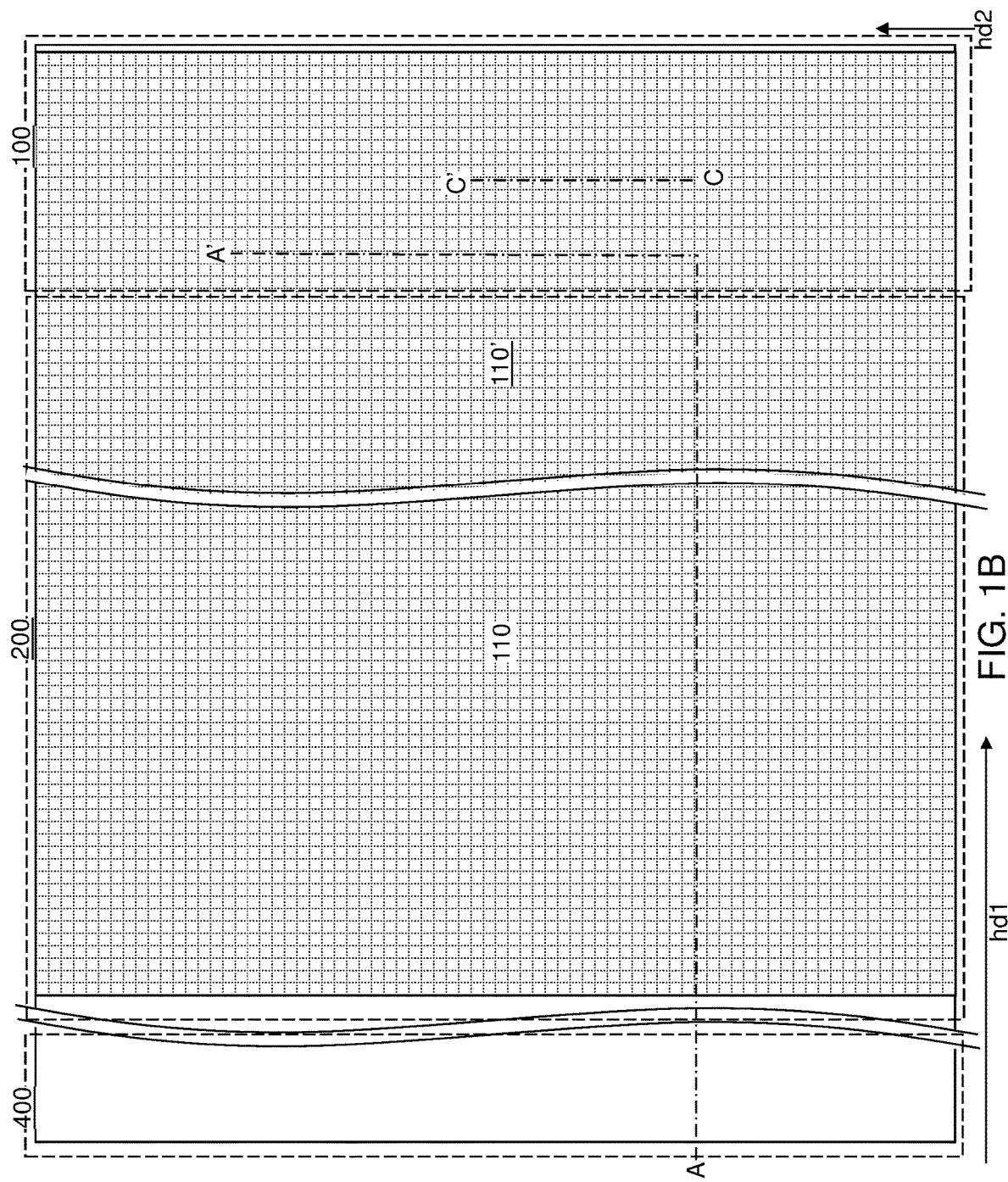
FIG. 1B is a top-down view of the first exemplary structure of FIG. 1A. The hinged vertical plane A-A' is the plane of the vertical cross-sectional view of FIG. 1A.
Figure 1C:
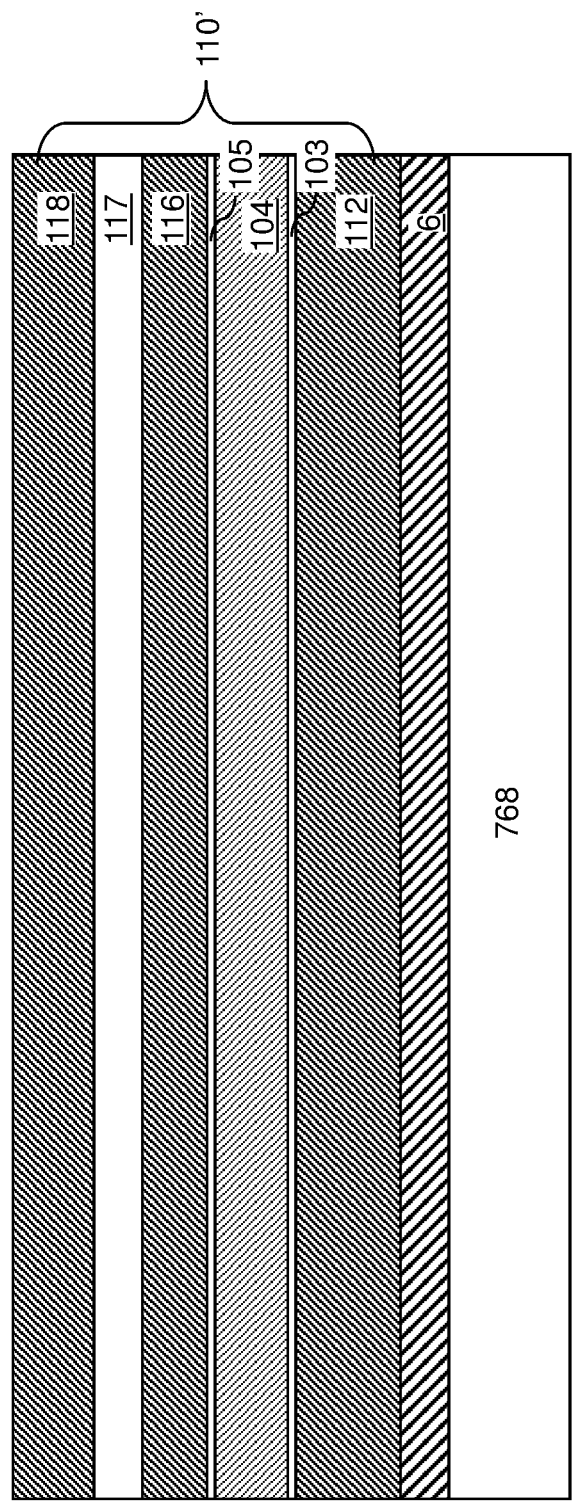
FIG. 1C is a magnified view of the in-process source level material layers along the vertical plane C-C' of FIG. 1B.

Referring to FIGS. 1A-1C, a first exemplary structure according to the first embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped poly silicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. In one alternative embodiment, the memory level assembly is formed on a different substrate and then bonded to the peripheral device region 700 located on the substrate 8. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
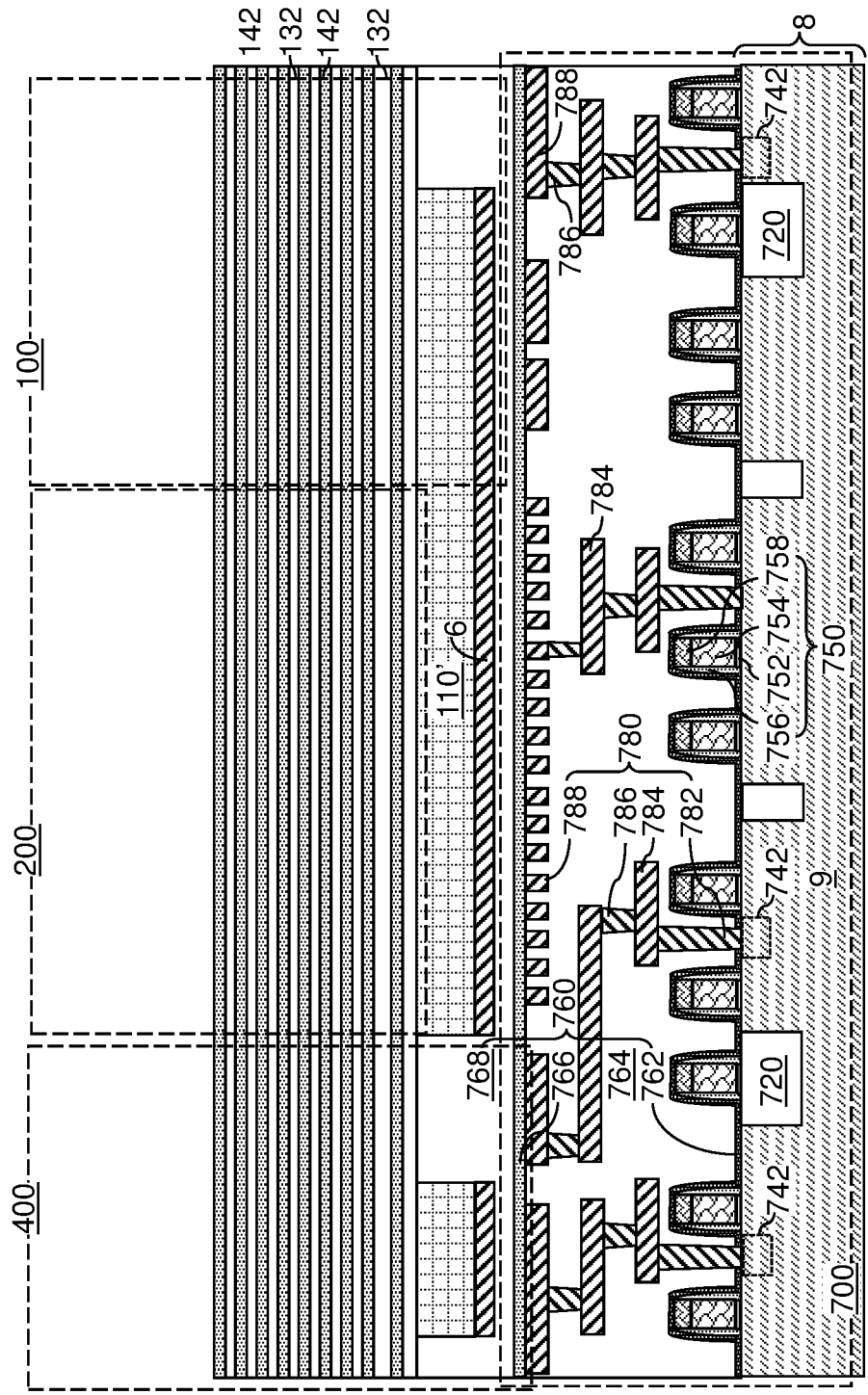
FIG. 2 is a vertical cross-sectional view of the first exemplary structure after formation of a first alternating stack of first insulting layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first alternating stack (132, 142) may have a uniform thickness that is substantially invariant within each respective first sacrificial material layer 142.

In an alternative embodiment, the peripheral device region 700 may be located on a separate substrate which is subsequently bonded to the memory array region 100 and the staircase region.

Figure 3:
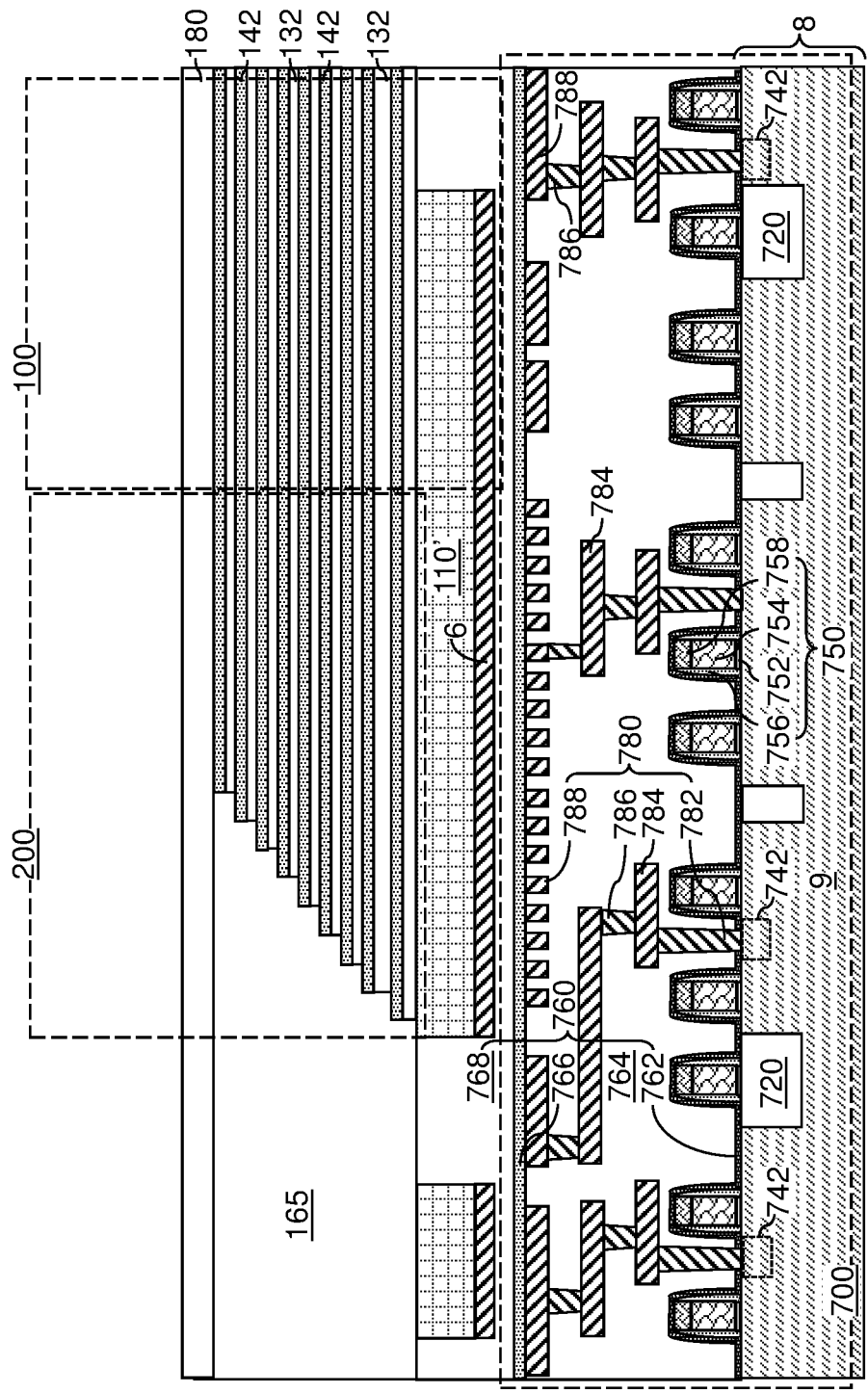
FIG. 3 is a vertical cross-sectional view of the first exemplary structure after patterning a first-tier staircase region, a first retro-stepped dielectric material portion, and an inter-tier dielectric layer according to the first embodiment of the present disclosure.

Referring to FIG. 3, the first alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the topmost first sacrificial material layer 142, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the topmost first sacrificial material layer 142. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first retro-stepped dielectric material portion 165 collectively constitute a first-tier structure, which is an in-process structure that is subsequently modified.

An inter-tier dielectric layer 180 may be optionally deposited over the first alternating stack (132, 142). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
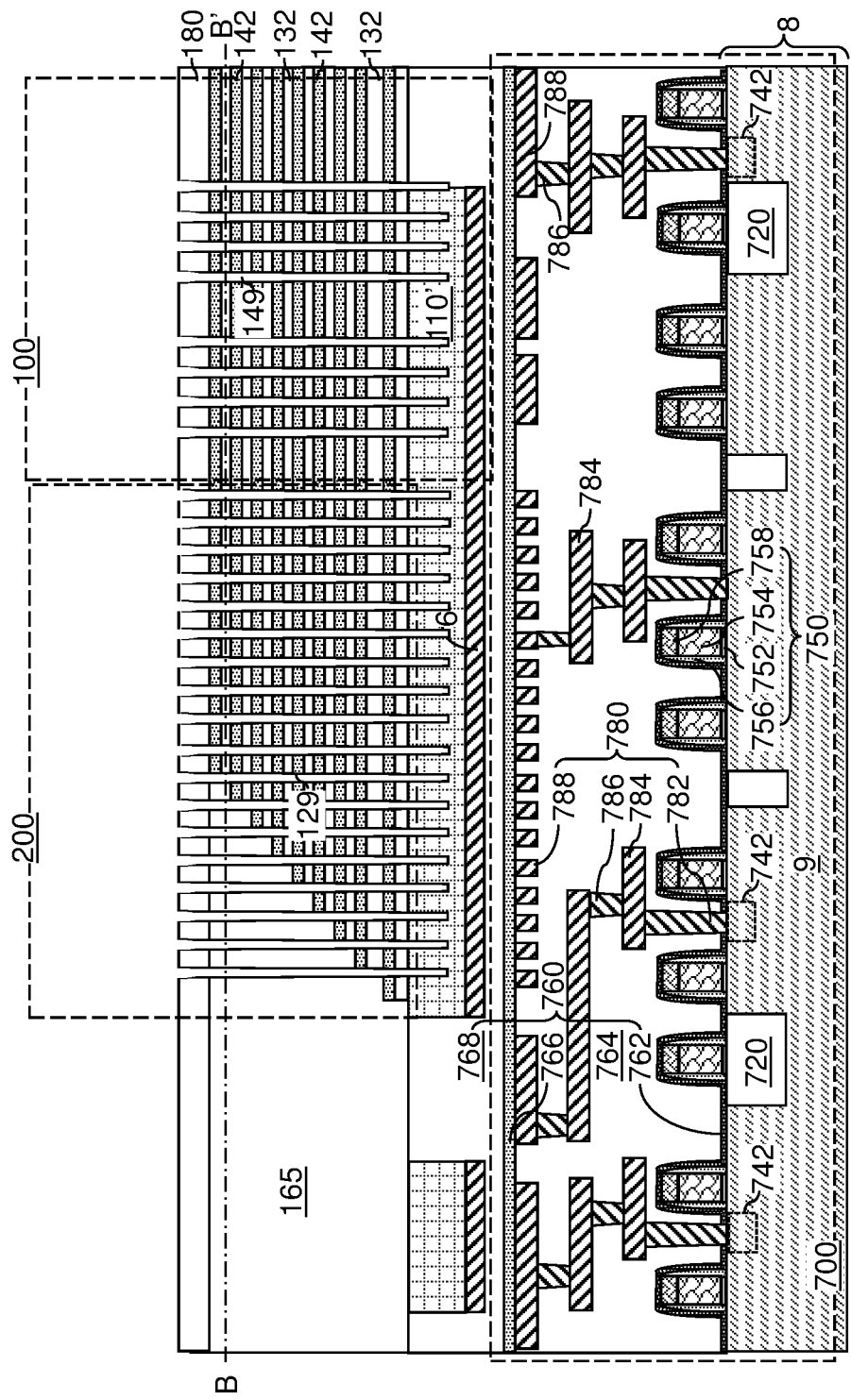
FIG. 4A is a vertical cross-sectional view of the first exemplary structure after formation of first-tier memory openings and first-tier support openings according to the first embodiment of the present disclosure.

Referring to FIGS. 4A and 4B, various first-tier openings (149, 129) may be formed through the inter-tier dielectric layer 180, the first alternating stack (132, 142), and the first retro-stepped dielectric material portion 165 and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180, the first alternating stack (132, 142), and the first retro-stepped dielectric material portion 165 and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first alternating stack (132, 142) are etched concurrently with the material of the first retro-stepped dielectric material portion 165. The chemistry of the initial etch step may alternate to optimize etching of the first and second materials in the first alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be optionally used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second alternating stack (to be subsequently formed prior to formation of the second-tier memory openings).

FIGS. 5A-5E are sequential vertical cross-sectional views of a region of the first exemplary structure that includes a first-tier memory opening 149 during formation of a first-tier memory opening fill structure according to the first embodiment of the present disclosure.

Referring to FIG. 5A, a first-tier memory opening 149 in the first exemplary structure of FIGS. 4A and 4B is illustrated. The first-tier memory opening 149 extends through the first-tier structure.

Referring to FIG. 5B, a stack of layers including a first blocking dielectric layer 152, a first memory material layer 154, a first tunneling dielectric layer 156, and a first semiconductor channel material layer 160L may be sequentially deposited in the first-tier memory openings 149. The first blocking dielectric layer 152 may include a single dielectric material layer or a stack of a plurality of dielectric material layers. In one embodiment, the first blocking dielectric layer 152 may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 152 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the first blocking dielectric layer 152 includes aluminum oxide. Alternatively or additionally, the first blocking dielectric layer 152 may include a dielectric semiconductor compound such as silicon oxide, silicon oxynitride, silicon nitride, or a combination thereof.

Subsequently, the first memory material layer 154 may be formed. In one embodiment, the first memory material layer 154 may be a continuous layer or patterned discrete portions of a charge trapping material including a dielectric charge trapping material, which may be, for example, silicon nitride. Alternatively, the first memory material layer 154 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 142. In one embodiment, the first memory material layer 154 includes a silicon nitride layer. In one embodiment, the sacrificial material layers 142 and the insulating layers 132 may have vertically coincident sidewalls, and the first memory material layer 154 may be formed as a single continuous layer. Alternatively, the sacrificial material layers 142 may be laterally recessed with respect to the sidewalls of the insulating layers 132, and a combination of a deposition process and an anisotropic etch process may be used to form the first memory material layer 154 as a plurality of memory material portions that are vertically spaced apart. Yet alternatively, the first memory material layer 154 may comprise a ferroelectric material or a resistive memory material. The thickness of the first memory material layer 154 may be in a range from 2 nm to 20 nm, although lesser and greater thicknesses may also be used.

The first tunneling dielectric layer 156 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The first tunneling dielectric layer 156 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the first tunneling dielectric layer 156 may include a stack of a first silicon oxide layer, a silicon oxynitride layer, and a second silicon oxide layer, which is commonly known as an ONO stack. In one embodiment, the first tunneling dielectric layer 156 may include a silicon oxide layer that is substantially free of carbon or a silicon oxynitride layer that is substantially free of carbon. The thickness of the first tunneling dielectric layer 156 may be in a range from 2 nm to 20 nm, although lesser and greater thicknesses may also be used. The stack of the first blocking dielectric layer 152, the first memory material layer 154, and the first tunneling dielectric layer 156 constitutes a first memory film 150 that stores memory bits.

The first semiconductor channel material layer 160L includes a doped semiconductor material having a first conductivity type (which may be p-type or n-type). For example, the first semiconductor channel material layer 160L may comprise at least one elemental semiconductor material, at least one III-V compound semiconductor material, at least one II-VI compound semiconductor material, at least one organic semiconductor material, or other semiconductor materials known in the art. In one embodiment, the first semiconductor channel material layer 160L may having a uniform doping. In one embodiment, the first conductivity type is p-type, and the first semiconductor channel material layer 160L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the first semiconductor channel material layer 160L includes, and/or consists essentially of, boron-doped amorphous silicon or boron-doped polysilicon. The first semiconductor channel material layer 160L may be formed by a conformal deposition method such as low pressure chemical vapor deposition (LPCVD). The thickness of the first semiconductor channel material layer 160L may be in a range from 2 nm to 10 nm, although lesser and greater thicknesses may also be used. A cavity is formed in the volume of each first-tier memory opening 149 that is not filled with the deposited material layers (152, 154, 156, 160L).

A first dielectric core layer may be deposited in the cavity to fill any remaining portion of the cavity within each first-tier memory opening. The first dielectric core layer includes a dielectric material such as silicon oxide or organosilicate glass. The first dielectric core layer may be deposited by a conformal deposition method such as low pressure chemical vapor deposition (LPCVD), or by a self-planarizing deposition process such as spin coating. The horizontal portion of the first dielectric core layer overlying the inter-tier dielectric layer 180 may be removed, for example, by a recess etch. The recess etch continues until top surfaces of the remaining portions of the first dielectric core layer are recessed to a height between the top surface of the inter-tier dielectric layer 180 and the bottom surface of the inter-tier dielectric layer 180. Each remaining portion of the first dielectric core layer constitutes a first dielectric core 162.

Referring to FIG. 5C, portions of the first semiconductor channel material layer 160L and the first memory film 150 that are located above the top surface of the first dielectric core 162 can be sequentially etched by performing a sequence of isotropic etch processes. The first memory film 150 is divided into a plurality of first memory films 150 that are located within a respective one of the first-tier memory openings 149. Each remaining portion of the first semiconductor channel material layer 160L constitutes a first vertical semiconductor channel 160.

Referring to FIG. 5D, a semiconductor material, such as amorphous silicon or polysilicon may be deposited in cavities overlying the first dielectric cores 162. The semiconductor material may be intrinsic, or may have a doping of the first conductivity type at an atomic dopant concentration that is on par with the atomic dopant concentration of the dopants of the first conductivity type in the first vertical semiconductor channel 160. The second conductivity type is the opposite of the first conductivity type. Portions of the deposited semiconductor material that overlie the horizontal plane including the top surface of the inter-tier dielectric layer 180 may be removed by a planarization process such as a chemical mechanical planarization (CMP) process. Each remaining portion of the deposited semiconductor material comprises an intermediate channel portion 360.

Figure 5E:
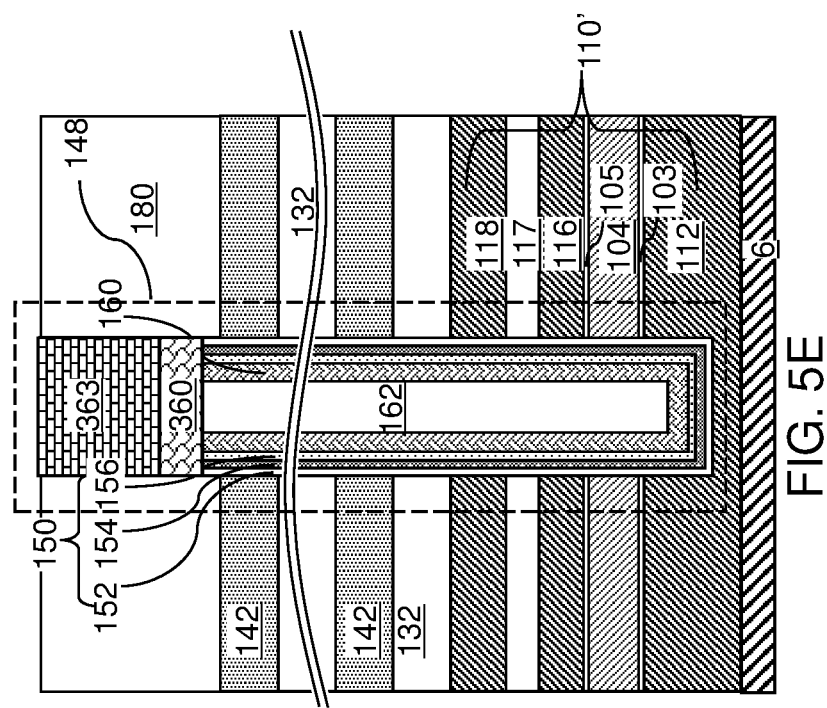
Figure 6:
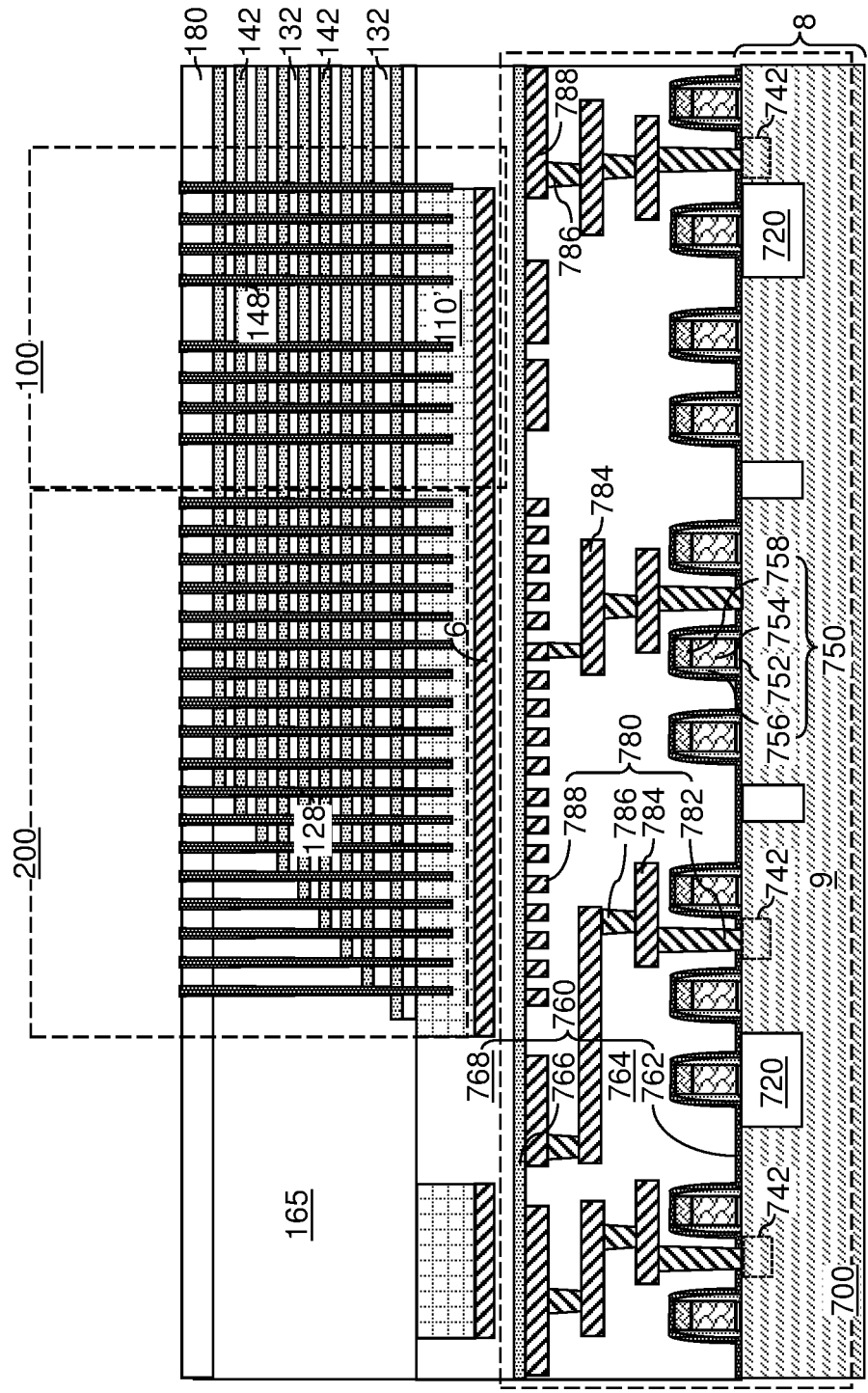
FIG. 6 is a vertical cross-sectional view of the first exemplary structure after formation of first-tier memory opening fill structures and first-tier support pillar structures according to the first embodiment of the present disclosure.

Referring to FIGS. 5E and 6, dopants of a second conductivity type can be implanted into an upper portion of each intermediate channel portion 360 by performing an ion implantation process. The second conductivity type is the opposite of the first conductivity type. For example, if the first conductivity type is p-type, the second conductivity type is n-type, and vice versa. An upper portion of each intermediate channel portion 360 is converted into an inter-tier doped region 363 having a doping of the second conductivity type. In one embodiment, a first p-n junction can be formed between a remaining portion of the intermediate channel portion 360 and the inter-tier doped region 363. The dopant concentration in the inter-tier doped region 360 may be in a range from $5.0 \times 10^{18}/cm^3$ to $2.0 \times 10^{21}/cm^3$, although lesser and greater dopant concentrations may also be used. The doped semiconductor material may be, for example, doped polysilicon. In an alternative embodiment, the intermediate channel portion 360 may comprise as-deposited semiconductor material of the second conductivity type, such as amorphous silicon or polysilicon that is in-situ doped with arsenic or phosphorus during deposition. In this case, the ion implantation step may be omitted.

Each first vertical semiconductor channel 160 is a current path through which electrical current may flow when a vertical NAND device including the first vertical semiconductor channel 160 is turned on. A first tunneling dielectric layer 156 is surrounded by a first memory material layer 154, and laterally surrounds a first vertical semiconductor channel 160. Each adjoining set of a first blocking dielectric layer 152, a first memory material layer 154, and a first tunneling dielectric layer 156 collectively constitute a first memory film 150, which may store electrical charges with a macroscopic retention time. In some embodiments, a first blocking dielectric layer 152 may not be present in the first memory film 150 at this step, and a first blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a first memory film 150 and a first vertical semiconductor channel 160 within a first-tier memory opening 149 constitutes a first memory stack structure (150, 160). In one embodiment, the first memory stack structure (150, 160) is a combination of a first vertical semiconductor channel 160, a first tunneling dielectric layer 156, a plurality of first memory elements comprising portions of the first memory material layer 154, and an optional first blocking dielectric layer 152.

Generally, the first memory film 150 comprises a vertical stack of first memory elements at levels of first spacer material layers, which may be formed as the first sacrificial material layers 142 and subsequently replaced with first electrically conductive layers, or may be formed as first electrically conductive layers. Each combination of a memory stack structure (150, 160), a first dielectric core 162, an intermediate channel portion 360, and an inter-tier doped region 363 within a first-tier memory opening 149 constitutes a first-tier memory opening fill structure 148. Each combination of a memory stack structure (150, 160), a first dielectric core 162, an intermediate channel portion 360, and an inter-tier doped region 363 within a first-tier support opening 129 constitutes a first-tier support opening fill structure 128.

Figure 7:
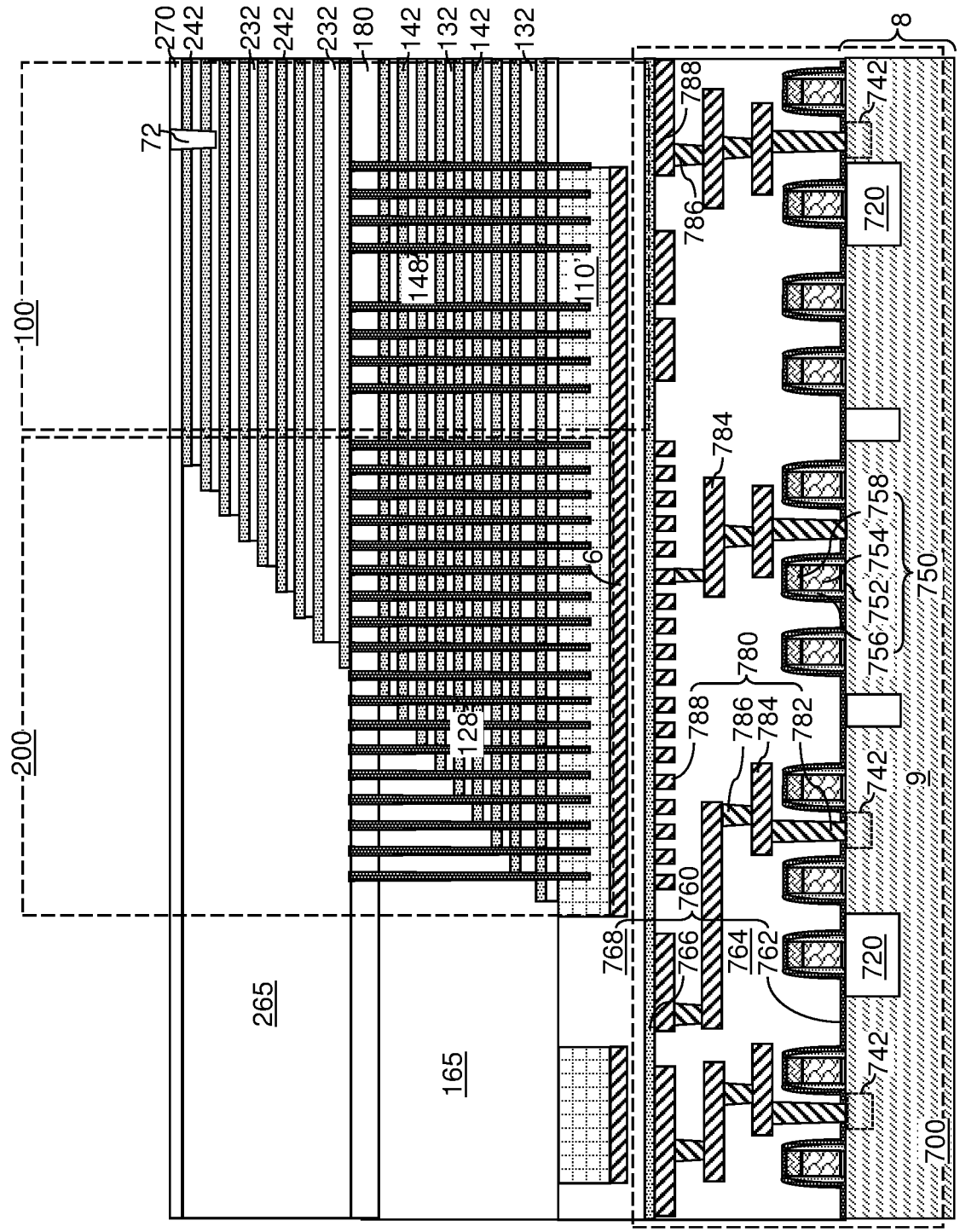
FIG. 7 is a vertical cross-sectional view of the first exemplary structure after formation of a second alternating stack of second insulating layers and second spacer material layers, second stepped surfaces, and a second retro-stepped dielectric material portion according to the first embodiment of the present disclosure.

Referring to FIG. 7, a second-tier structure may be formed over the first-tier structure (132, 142, 165, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

An insulating cap layer 270 may be subsequently formed over the second alternating stack (232, 242). The insulating cap layer 270 includes a dielectric material that is different from the material of the second sacrificial material layers 242. In one embodiment, the insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the insulating cap layer 270, and the optional drain-select-level isolation structures 72 collectively constitute a second-tier structure (232, 242, 265, 270, 72).

Figure 8A:
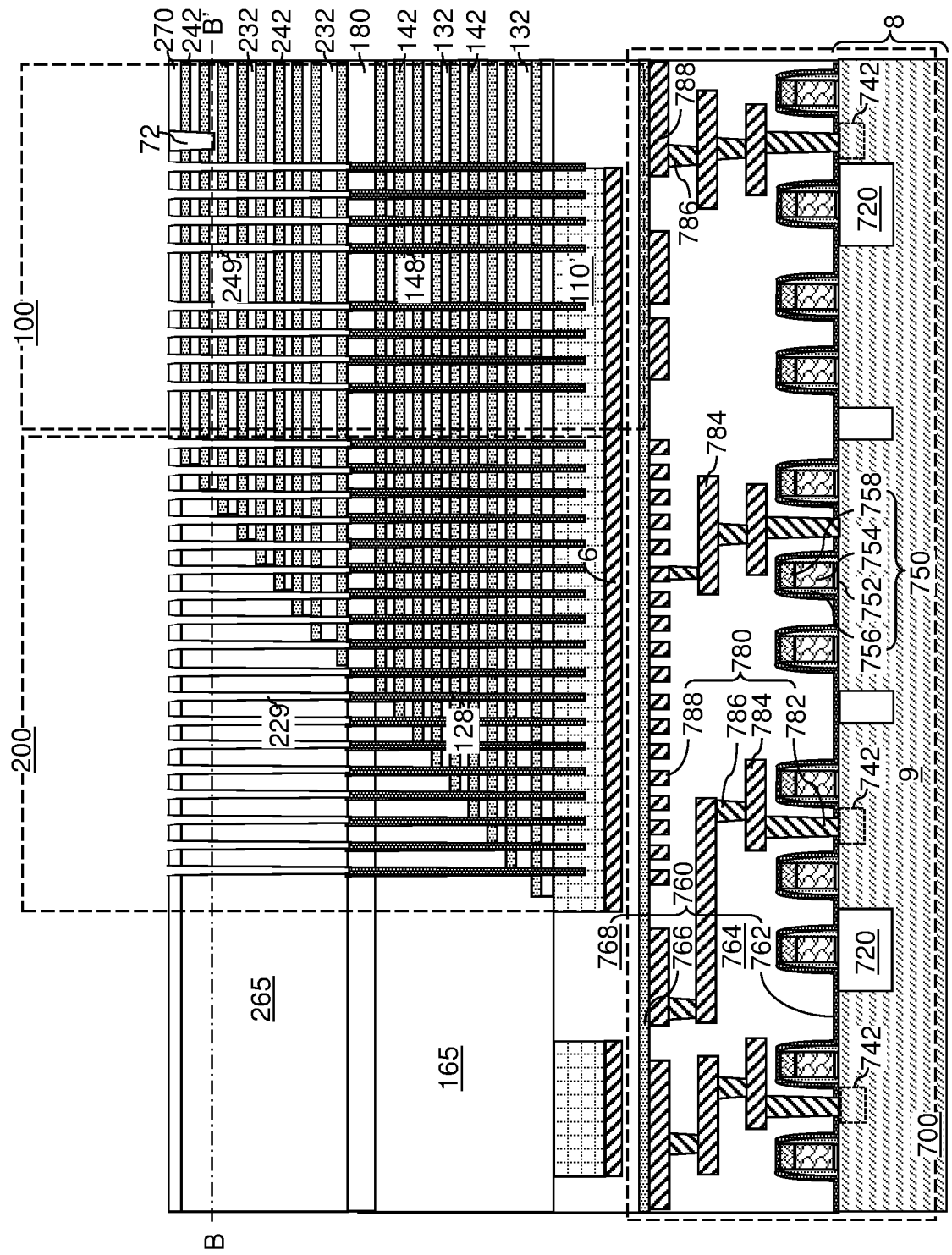
FIG. 8A is a vertical cross-sectional view of the first exemplary structure after formation of second-tier memory openings and second-tier support openings according to the first embodiment of the present disclosure.
Figure 8B:
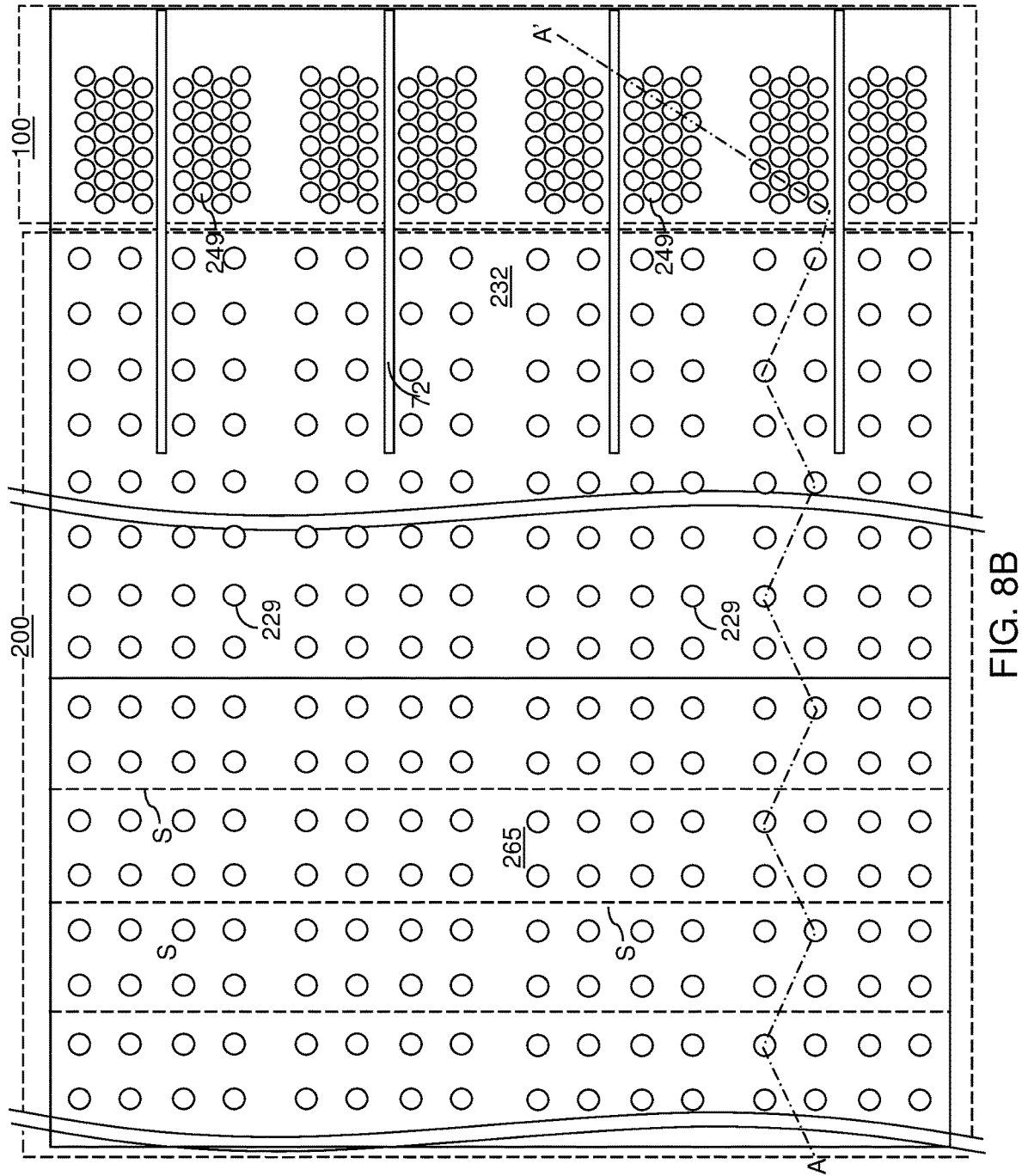
FIG. 8B is a horizontal cross-sectional view of the first exemplary structure along the horizontal plane B-B' of FIG. 8A. The hinged vertical plane A-A' corresponds to the plane of the vertical cross-sectional view of FIG. 8A.

Referring to FIGS. 8A and 8B, various second-tier openings (249, 229) may be formed through the second-tier structure (232, 242, 265, 270, 72). A photoresist layer (not shown) may be applied over the insulating cap layer 270, and may be lithographically patterned to form various openings therethrough. The pattern of the openings may be the same as the pattern of the various first-tier openings (149, 129), which is the same as the first-tier opening fill structures (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying first-tier opening fill structure (148, 128). The photoresist layer may be subsequently removed, for example, by ashing.

FIGS. 9A-9F are sequential vertical cross-sectional views of a region of the first exemplary structure that includes a second-tier memory opening during formation of a second-tier memory opening fill structure according to the first embodiment of the present disclosure.

Referring to FIG. 9A, a region including a second-tier memory opening 249 and a first-tier memory opening fill structure 148 in the first exemplary structure of FIGS. 8A and 8B is illustrated. The second-tier memory opening 249 extends through the second-tier structure.

Referring to FIG. 9B, a stack of layers including a second blocking dielectric layer 252, a second memory material layer 254, and a second tunneling dielectric layer 256 may be sequentially deposited in the second-tier memory openings 249. The second blocking dielectric layer 252 may include any material that may be employed for the first blocking dielectric layer 152, and may have a thickness in a range from 1 nm to 20 nm, although lesser and greater thicknesses may also be used. The second memory material layer 254 may include any material that may be employed for the first memory material layer 154, and may have a thickness in a range from 2 nm to 20 nm, although lesser and greater thicknesses may also be used. The second tunneling dielectric layer 256 may include any material that may be employed for the first tunneling dielectric layer 156, and may have a thickness in a range from 2 nm to 20 nm, although lesser and greater thicknesses may also be used. The stack of the second blocking dielectric layer 252, the second memory material layer 254, and the second tunneling dielectric layer 256 constitutes a second memory film 250 that stores memory bits.

Figure 9C:
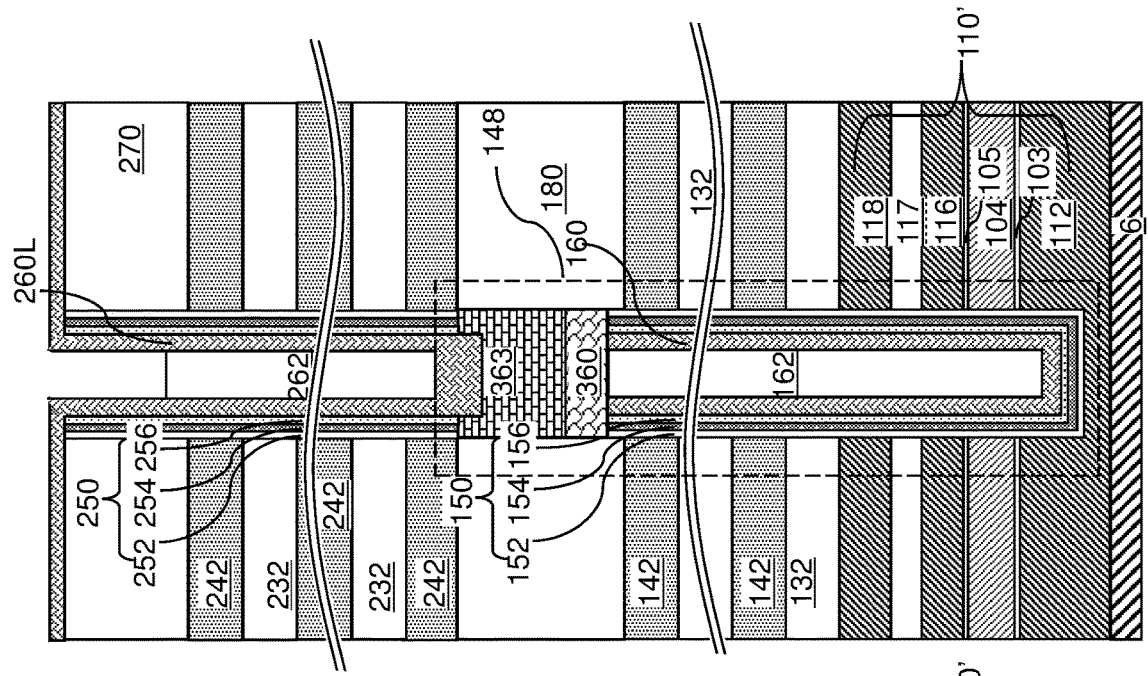

Referring to FIG. 9C, an anisotropic etch process can be performed to remove horizontally-extending portions of the second memory film 250. The second memory film 250 is divided into a plurality of second memory films 250 located within a respective one of the second-tier memory openings 249 or within a respective one of the second-tier support openings 229. Optionally, a sacrificial cover layer (not shown) may be conformally deposited prior to the anisotropic etch process, and may be removed after the anisotropic etch process selective to the remaining portions of the second tunneling dielectric layer 256 to protect the remaining portions of the second tunneling dielectric layer 256. A top surface of an inter-tier doped region 363 is physically exposed underneath each of the second-tier memory opening 249 and the second-tier support opening 229.

Figure 9D:
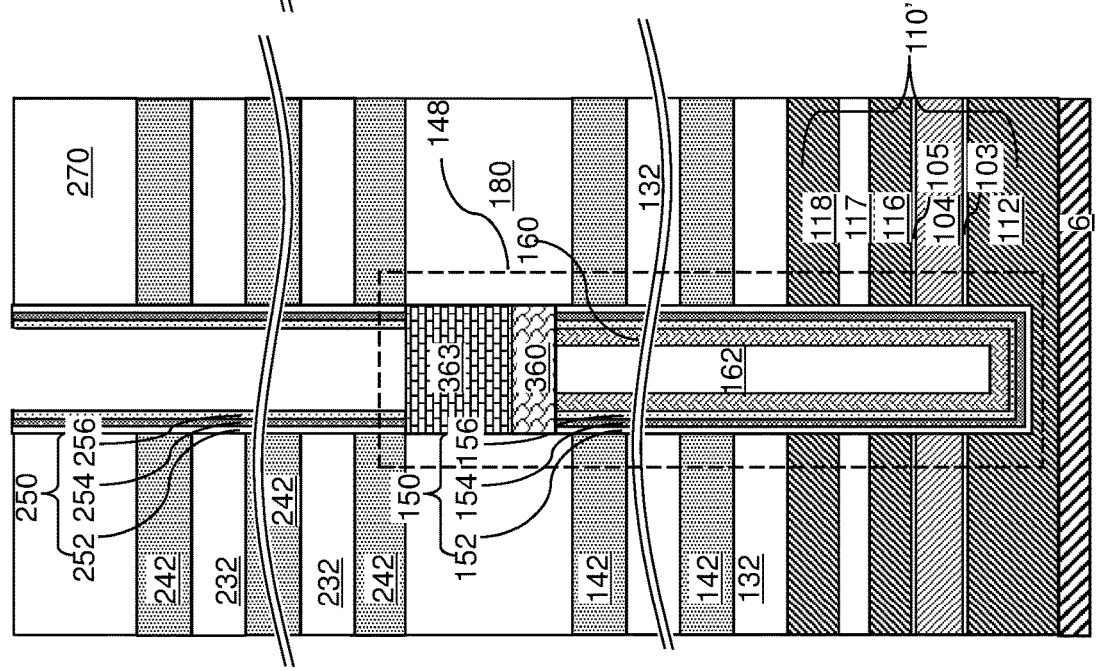

Referring to FIG. 9D, a second semiconductor channel material layer 260L can be conformally deposited. The second semiconductor channel material layer 260L includes a doped semiconductor material having the first conductivity type. For example, any semiconductor material that may be employed for the first semiconductor channel material layer 160L may be employed for the second semiconductor channel material layer 260L. The atomic concentration of dopants of the first conductivity type in the second semiconductor channel material layer 260L may be in a range from $1.0 \times 10^{12}/cm^3$ to $1.0 \times 10^{18}/cm^3$, such as from $1.0 \times 10^{14}/cm^3$ to $1.0 \times 10^{17}/cm^3$, although lesser and greater atomic concentrations may also be employed.

A second dielectric core layer may be deposited in the cavity to fill any remaining portion of the cavity within each second-tier memory opening. The second dielectric core layer includes a dielectric material such as silicon oxide or organosilicate glass. The second dielectric core layer may be deposited by a conformal deposition method such as low pressure chemical vapor deposition (LPCVD), or by a self-planarizing deposition process such as spin coating. The horizontal portion of the second dielectric core layer overlying the insulating cap layer 270 may be removed, for example, by a recess etch. The recess etch continues until top surfaces of the remaining portions of the second dielectric core layer are recessed to a height between the top surface of the insulating cap layer 270 and the bottom surface of the insulating cap layer 270. Each remaining portion of the second dielectric core layer constitutes a second dielectric core 262.

Figure 9F:
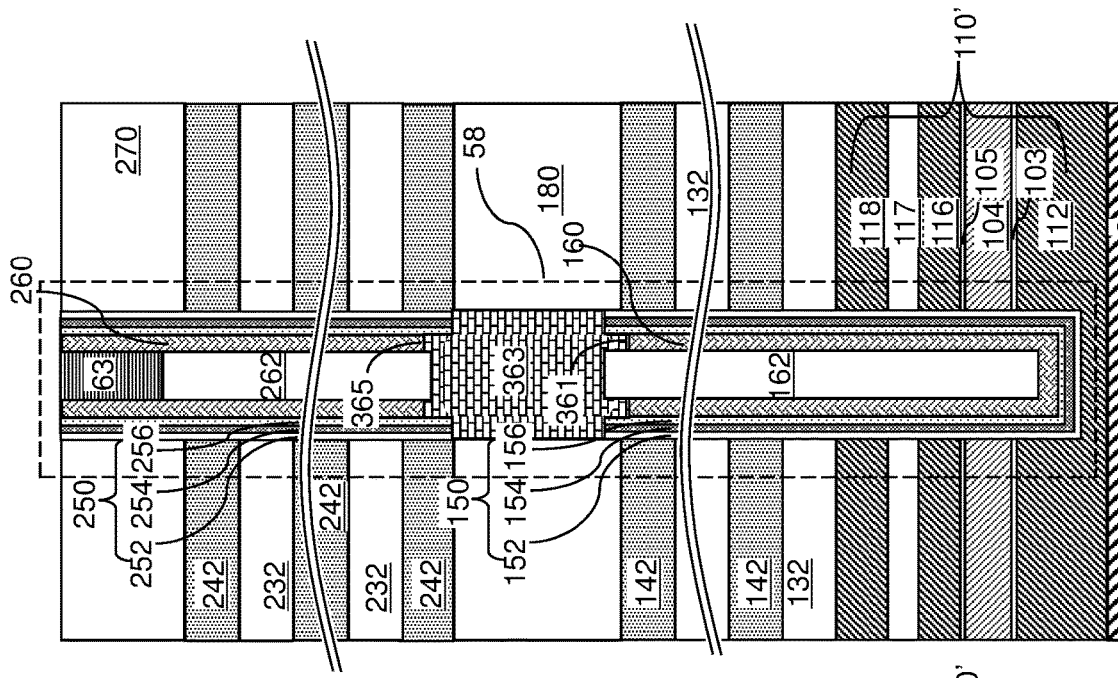
Figure 9E:
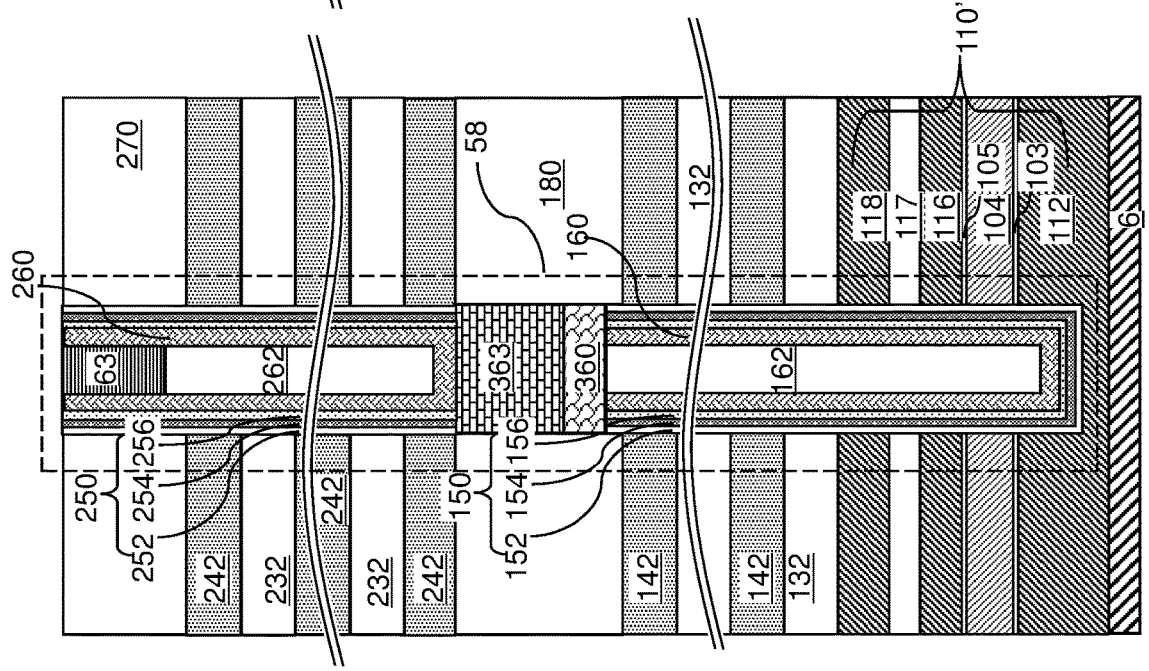

Referring to FIG. 9E, a doped semiconductor material having a doping of the second conductivity type may be deposited in cavities overlying the second dielectric cores 262. Portions of the deposited doped semiconductor material that overlie the horizontal plane including the top surface of the insulating cap layer 270 may be removed by a planarization process such as a chemical mechanical planarization (CMP) process. Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each second vertical semiconductor channel 260 is a current path through which electrical current may flow when a vertical NAND device including the second vertical semiconductor channel 260 is turned on. A second tunneling dielectric layer 256 is surrounded by a second memory material layer 254, and laterally surrounds a second vertical semiconductor channel 260. Each adjoining set of a second blocking dielectric layer 252, a second memory material layer 254, and a second tunneling dielectric layer 256 collectively constitute a second memory film 250, which may store electrical charges with a macroscopic retention time. In some embodiments, a second blocking dielectric layer 252 may not be present in the second memory film 250 at this step, and a second blocking dielectric layer may be subsequently formed after formation of backside recesses.

Each combination of a second memory film 250 and a second vertical semiconductor channel 260 (which is a second vertical semiconductor channel) within a second-tier memory opening 249 constitutes a second memory stack structure (250, 260). In one embodiment, the second memory stack structure (250, 260) is a combination of a second vertical semiconductor channel 260, a second tunneling dielectric layer 256, a plurality of second memory elements comprising portions of the second memory material layer 254, and an optional second blocking dielectric layer 252. Generally, the second memory film 250 comprises a vertical stack of second memory elements at levels of second spacer material layers, which may be formed as the second sacrificial material layers 242 and subsequently replaced with second electrically conductive layers, or may be formed as second electrically conductive layers.

Each combination of a second memory stack structure (250, 260), a second dielectric core 262, a drain region 63 within a second-tier memory opening 249 constitutes a second-tier memory opening fill structure (250, 260, 262, 63). Each contiguous combination of a first-tier memory opening fill structure 148 and a second-tier memory opening fill structure (250, 260, 262, 63) constitutes a memory opening fill structure 58. Each contiguous combination of a first-tier support opening fill structure 128 and a second-tier support opening fill structure (250, 260, 262, 63) constitutes a support pillar structure.

Figure 10:
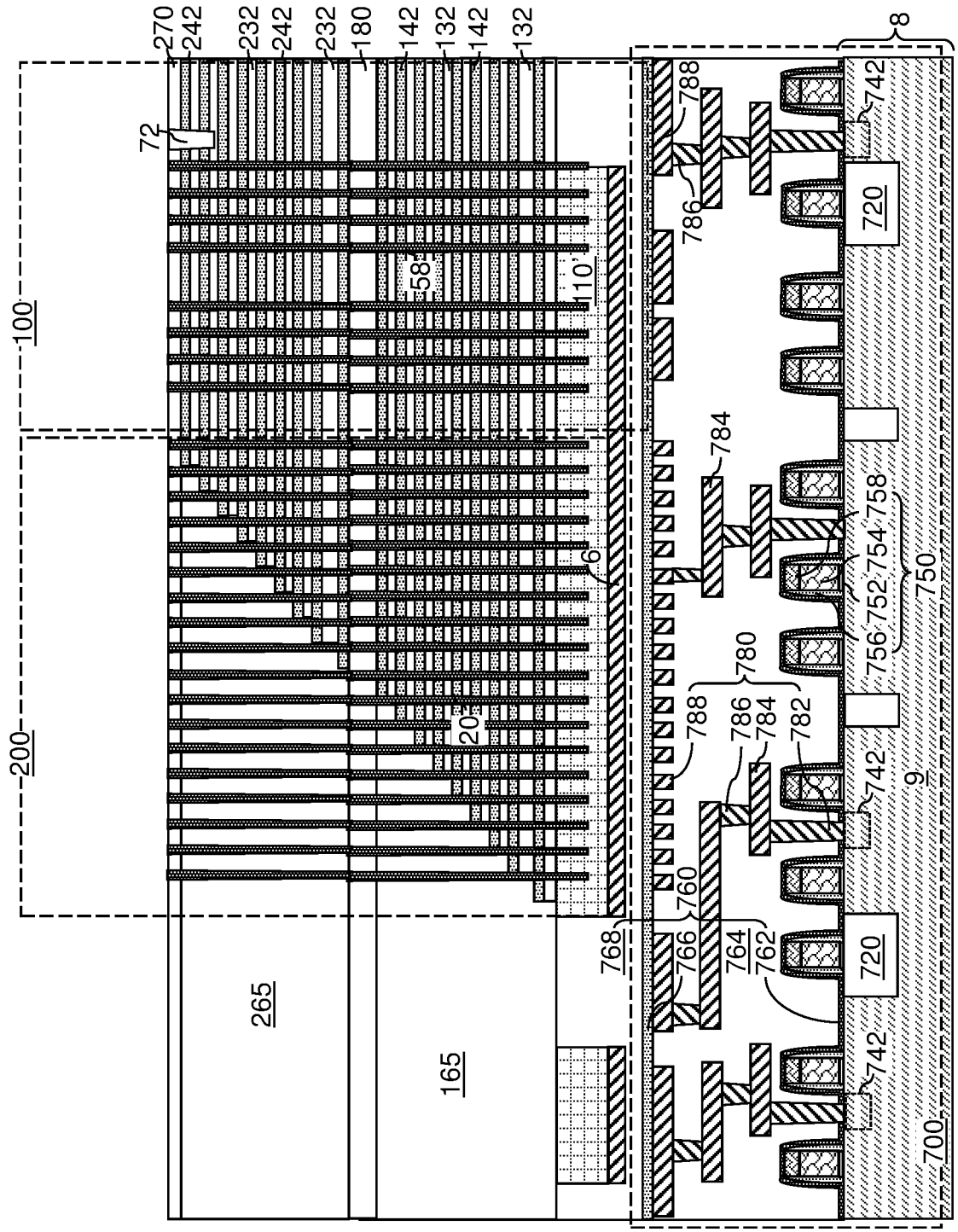
FIG. 10 is a vertical cross-sectional view of the first exemplary structure after formation of inter-tier memory openings and inter-tier support openings according to the first embodiment of the present disclosure.

Referring to FIGS. 9F and 10, an anneal process may be performed to crystallize any amorphous material in the first vertical semiconductor channel 160, the intermediate channel portion 360 and the second semiconductor channel 260 in each of the memory opening fill structures 58 and the support pillar structures. The dopants of the second conductivity type in the inter-tier doped region 363 can diffuse into the upper portion of the first vertical semiconductor channel 160 and into the lower portions of the intermediate channel portion 360 and the second vertical semiconductor channel 260 in each of the memory opening fill structures 58 and in each of the support pillar structures. In one embodiment, the entirety of each intermediate channel portion 360 may be incorporated into an inter-tier doped region 363. Further, the first p-n junction between each inter-tier doped region 363 and an underlying semiconductor material portion (i.e., the underling) first vertical semiconductor channel 160 may shift below the horizontal plane including the top surface of the first dielectric core 162 in each of the memory opening fill structures 58 and the support pillar structures. In addition, a second p-n junction between each inter-tier doped region 363 and an overlying second vertical semiconductor channel 260 may shift above the horizontal plane including the bottom surface of the second dielectric core 262 in each of the memory opening fill structures 58 and the support pillar structures.

Generally, a first alternating stack (132, 142) of first insulating layers 132 and first spacer material layers (such as first sacrificial material layers 142), an inter-tier dielectric layer 180, and a second alternating stack (232, 242) of second insulating layers 232 and second spacer material layers (such as first sacrificial material layers 242) can be sequentially formed over a semiconductor material layer (such as a lower source-level semiconductor layer 112 or an upper source-level semiconductor layer 116, or a substrate semiconductor layer 9). The first spacer material layers (such as first sacrificial material layers 142) and the second spacer material layers (such as first sacrificial material layers 242) are formed as, or are subsequently replaced with, first electrically conductive layers (146, 146D, 146SGS) and second electrically conductive layer (246, 246D, 246SGD), respectively.

Memory opening fill structures 58 can be formed through the first alternating stack (132, 142), the inter-tier dielectric layer 180, and the second alternating stack (232, 242). Each of the memory opening fill structures 58 comprises a first vertical semiconductor channel 160 vertically extending through the first alternating stack (132, 142) and having a doping of a first conductivity type, a second vertical semiconductor channel 260 vertically extending through the second alternating stack (232, 242) and having a doping of the first conductivity type, and an inter-tier doped region 363 having a doping of a second conductivity type and providing a first p-n junction with the first vertical semiconductor channel 160 and providing a second p-n junction with the second vertical semiconductor channel 260.

In one embodiment, the first p-n junction is located at an interface between the inter-tier doped region 363 and an annular top surface of the first vertical semiconductor channel 160, and the second p-n junction is located at an interface between the inter-tier doped region 363 and an annular bottom surface of the second vertical semiconductor channel 260 within each of the memory opening fill structures 58.

In one embodiment, each memory opening fill structure 58 comprises a first dielectric core 162 contacting an inner sidewall of the first vertical semiconductor channel 160 and a bottom surface of the inter-tier doped region 363, and a second dielectric core 262 contacting an inner sidewall of the second vertical semiconductor channel 260 and a top surface of the inter-tier doped region 363. The first and the second dielectric cores do not contact each other and the inter-tier doped region 363 is located between the first and the second dielectric cores in the vertical direction in each memory opening fill structure 58. In one embodiment, an interface between the inter-tier doped region 363 and the second vertical semiconductor channel 260 is located above a horizontal plane including an interface between a bottom surface of the second dielectric core 262 and the inter-tier doped region 363, and an interface between the inter-tier doped region 363 and the first vertical semiconductor channel 160 is located below a horizontal plane including an interface between a top surface of the first dielectric core 162 and the inter-tier doped region 363. In one embodiment, the memory films (150, 250) are not present at the level of at least the middle part of the inter-tier doped region 363. Thus, at least the middle part of the inter-tier doped region 363 is not surrounded by the memory film (150 or 250) and a cylindrical sidewall of the inter-tier doped region 363 contacts a cylindrical surface segment of the inter-tier dielectric layer 180.

In one embodiment, a first vertical stack of memory elements (such as portions of a first memory material layer 154) comprises portions of a first memory film 150 vertically extending through the first alternating stack (132, 142) and located below a horizontal plane including a top surface of the inter-tier dielectric layer 180, and a second vertical stack of memory elements (such as portions of a first memory material layer 154) comprises portions a second memory film 250 vertically extending through the second alternating stack (232, 242) and located above a horizontal plane including a bottom surface of the inter-tier dielectric layer 180.

In one embodiment, an annular top surface of the first memory film 150 contacts a bottom surface of the inter-tier doped region 363, and an annular bottom surface of the second memory film 250 contacts a top surface of the inter-tier doped region 363. In one embodiment, the inter-tier doped region 363 contacts a cylindrical surface segment of an upper end of an inner sidewall of the first memory film 150, and the inter-tier doped region 363 contacts a cylindrical surface segment of a lower end of an inner sidewall of the second memory film 250.

Figure 11A:
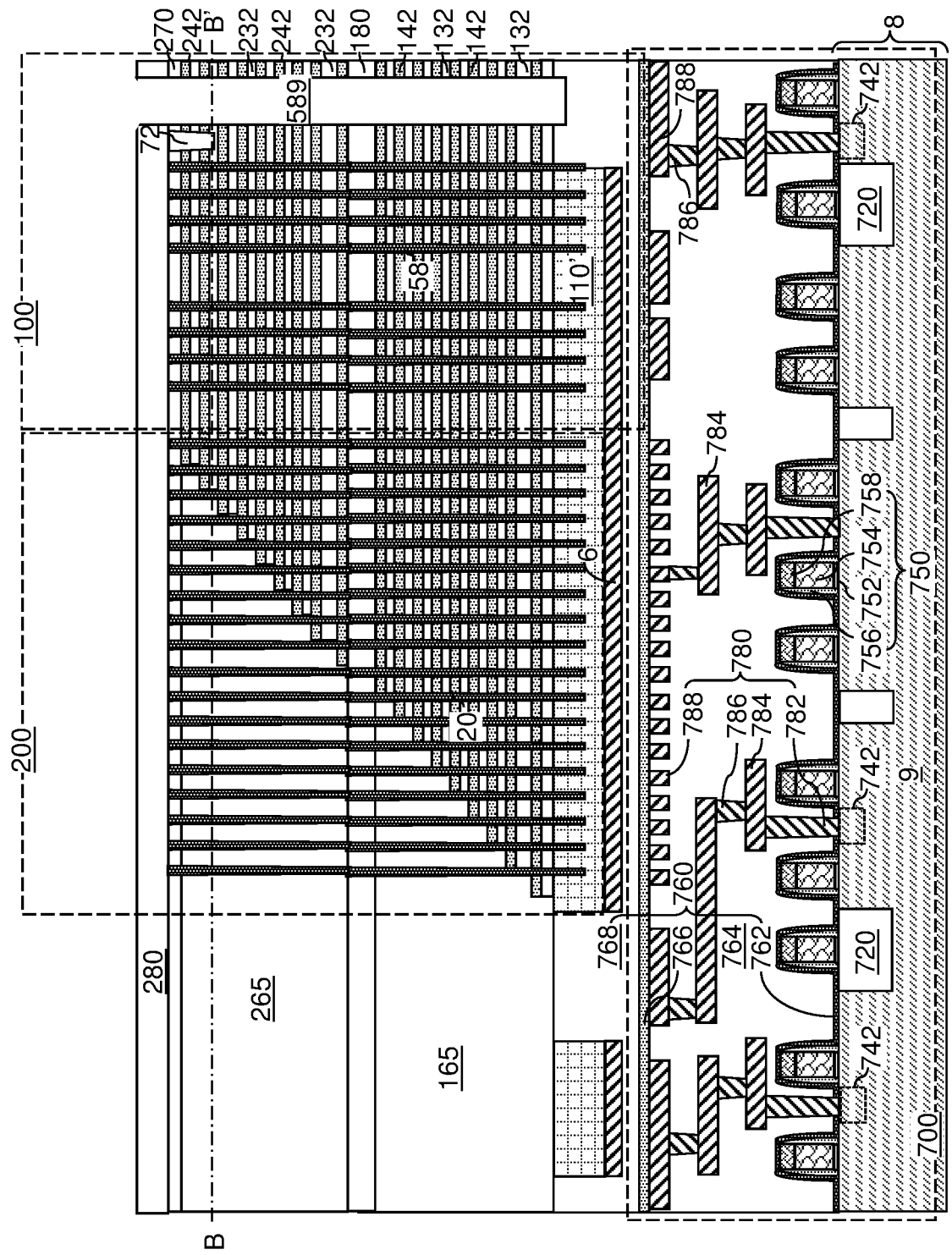
FIG. 11A is a vertical cross-sectional view of the first exemplary structure after formation of interconnection region cavities according to the first embodiment of the present disclosure.
Figure 11B:
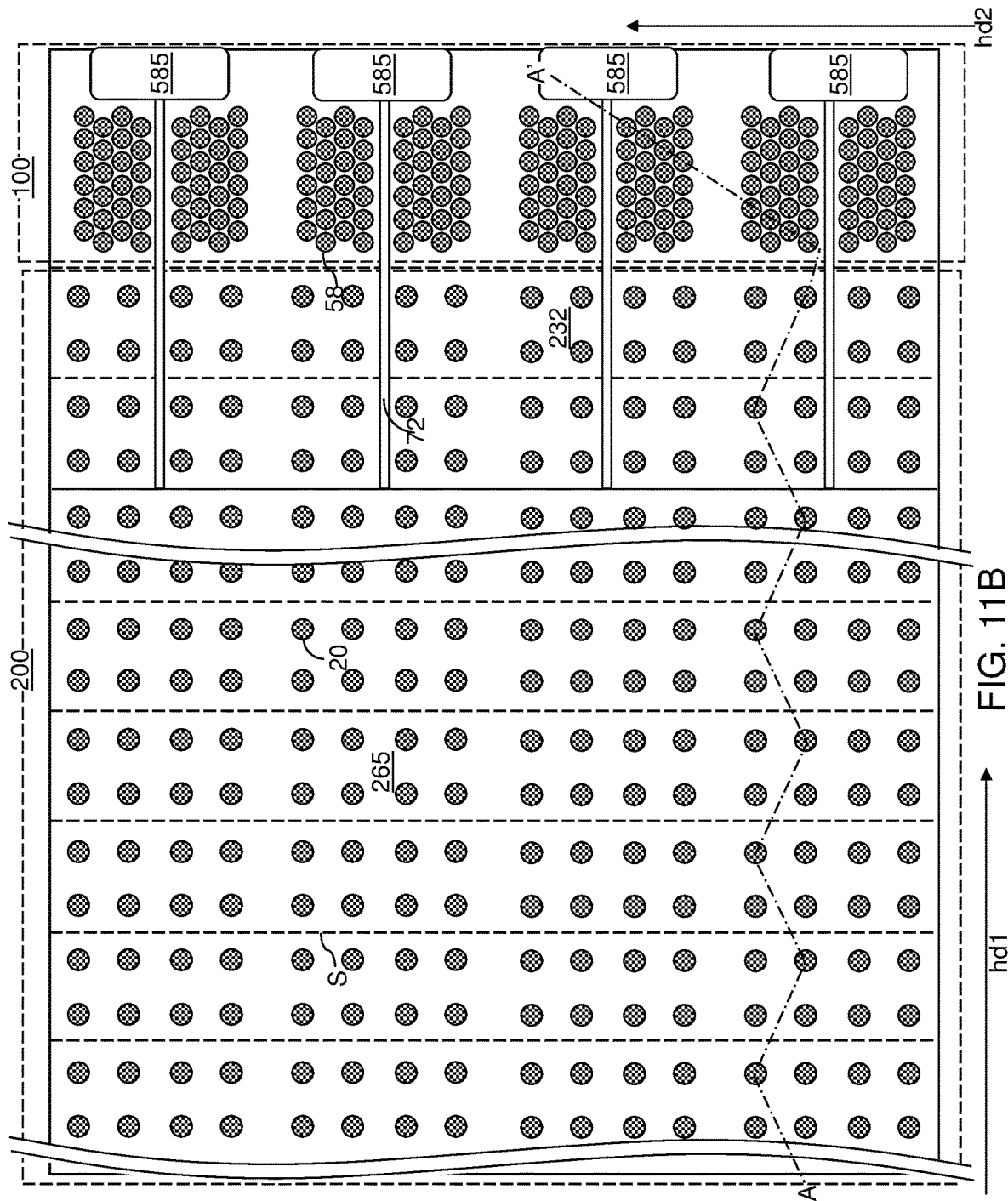
FIG. 11B is a horizontal cross-sectional view of the first exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 589. The photoresist layer may be removed, for example, by ashing.

Figure 12:
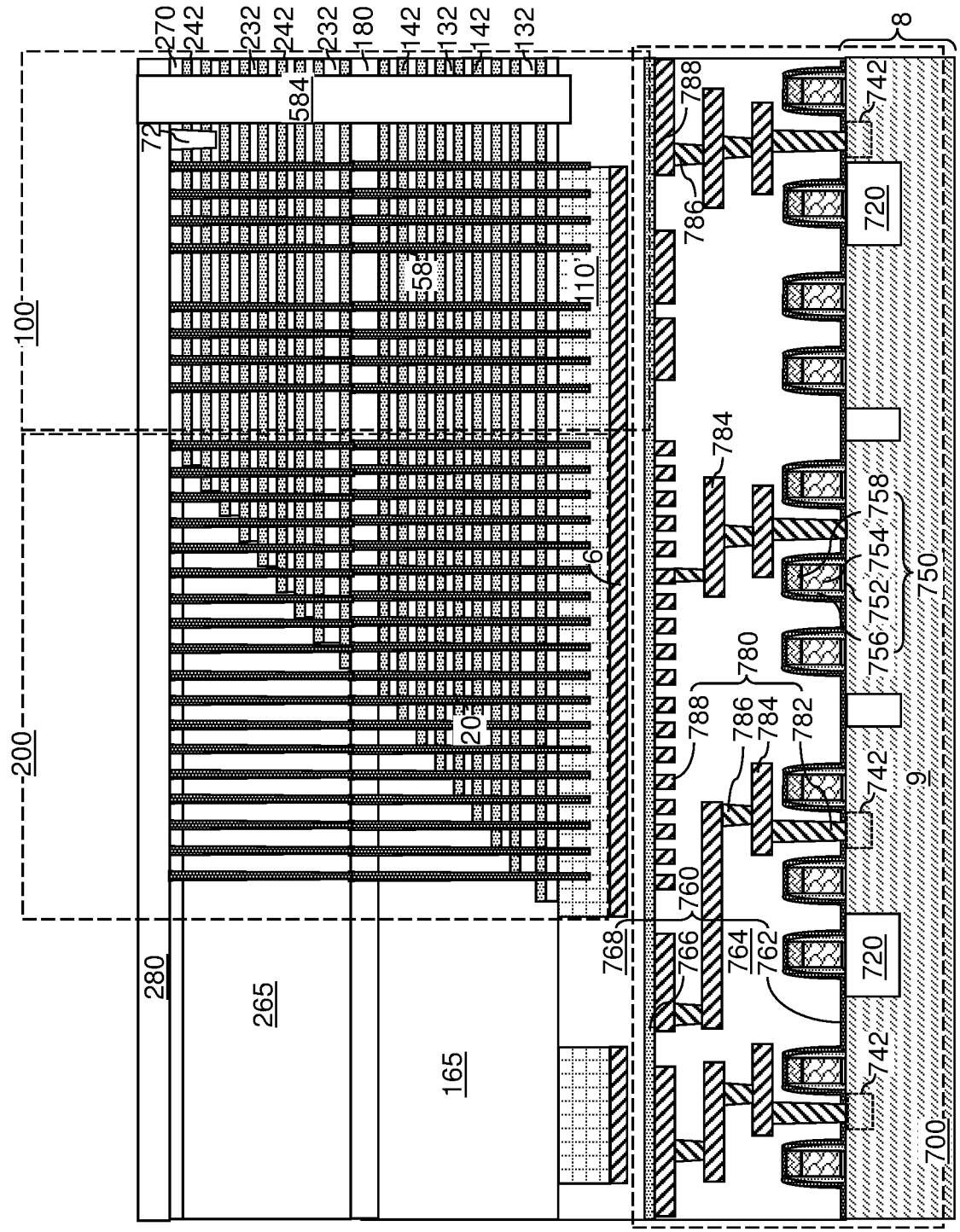
FIG. 12 is a vertical cross-sectional view of the first exemplary structure after formation of dielectric pillar structures according to the first embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
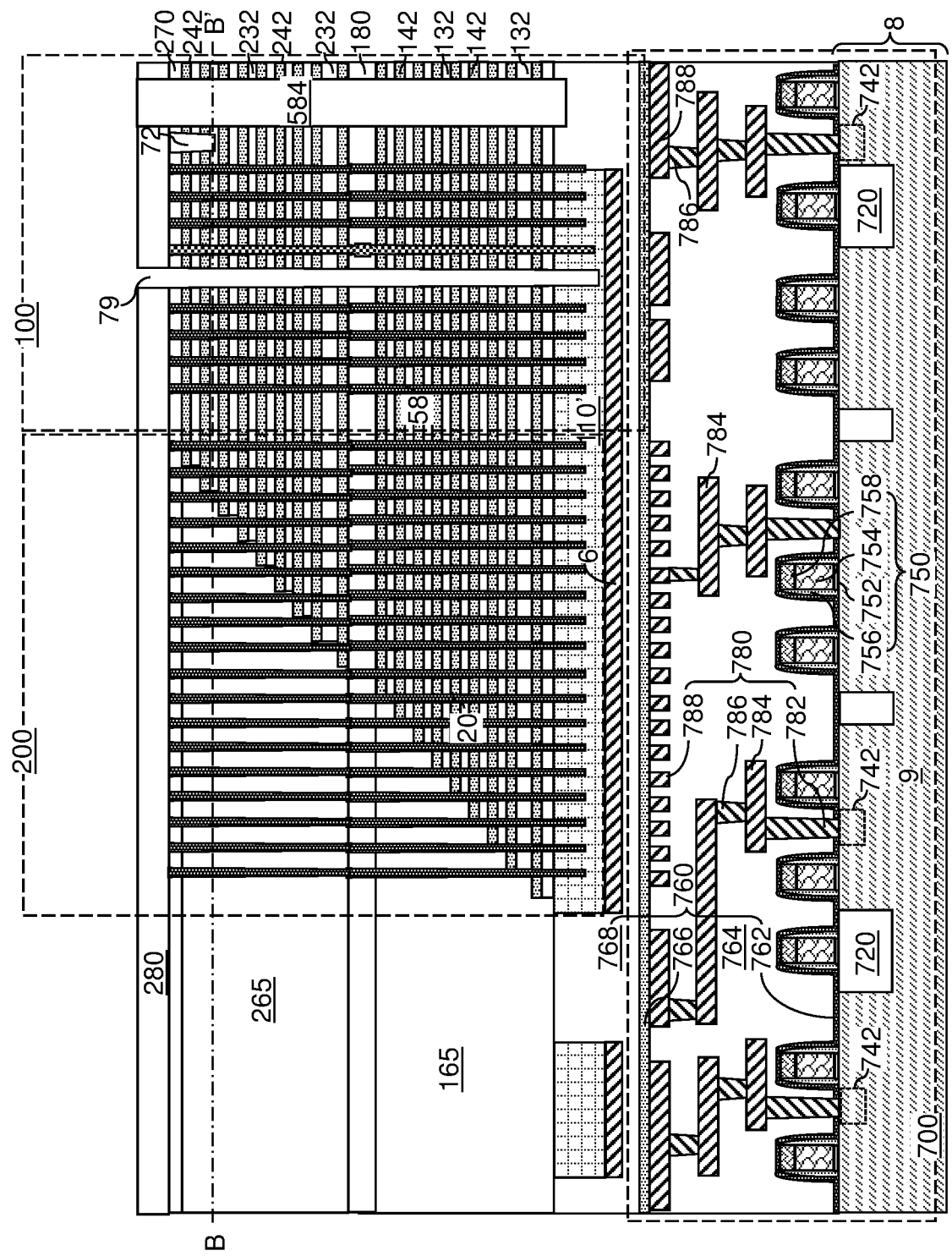
FIG. 13A is a vertical cross-sectional view of the first exemplary structure after formation of a first contact-level dielectric layer and backside trenches according to the first embodiment of the present disclosure.
Figure 13B:
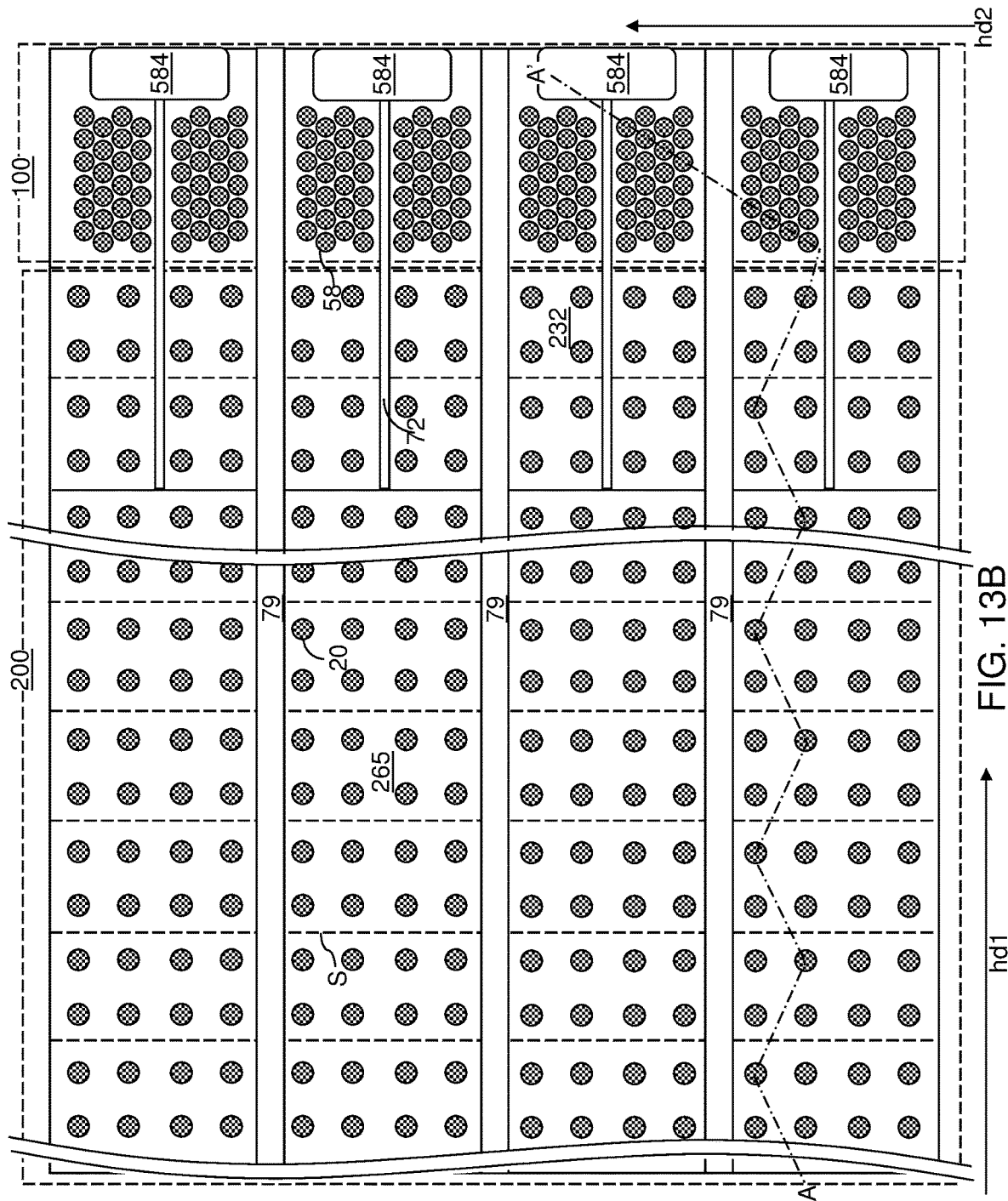
FIG. 13B is a horizontal cross-sectional view of the first exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures {(150, 160), (250, 260)}. The clusters of the memory stack structures {(150, 160), (250, 260)} may be laterally spaced apart along the second horizontal direction hd2 by the backside trenches 79.

Figure 14:
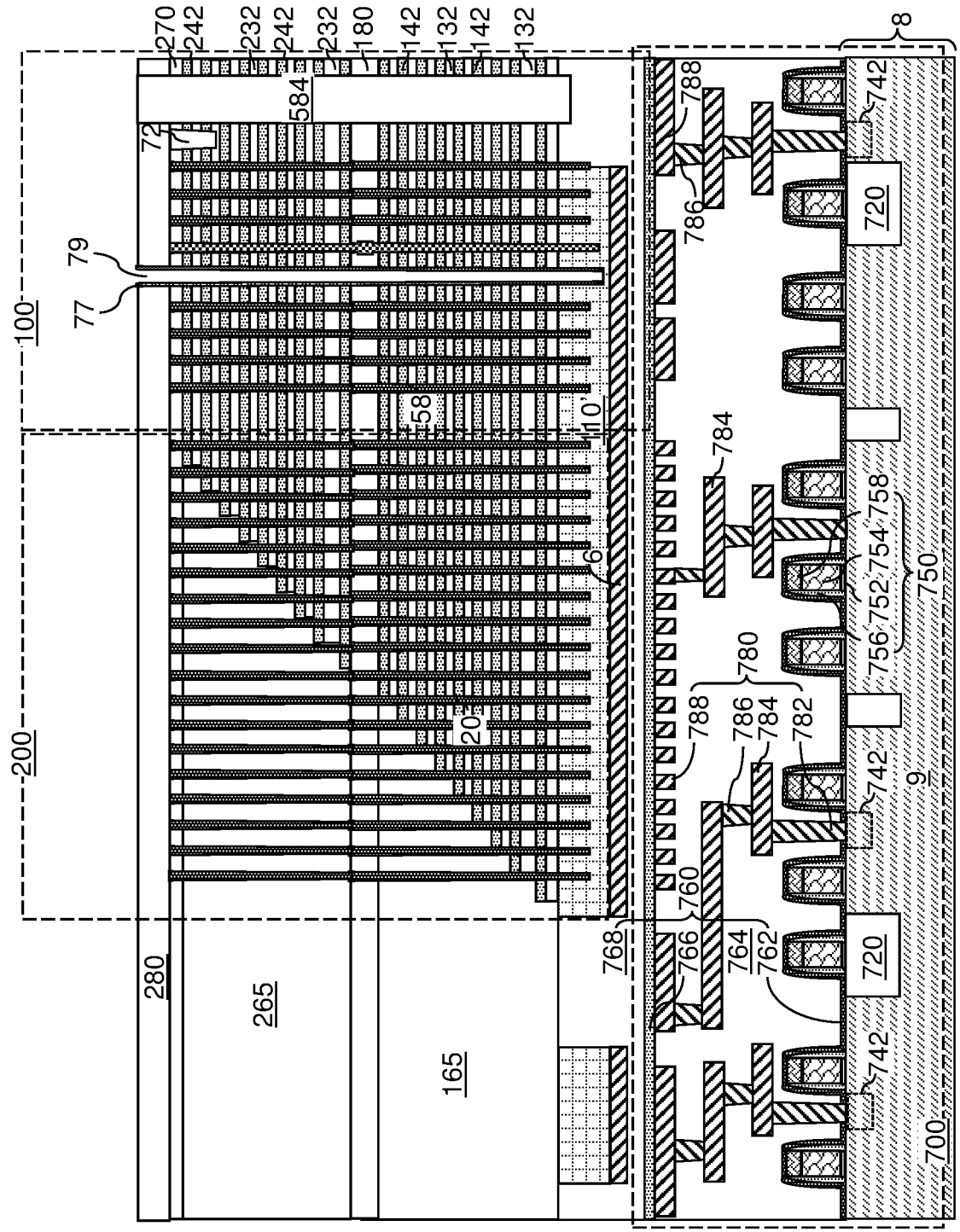
FIG. 14 is a vertical cross-sectional view of the first exemplary structure after formation of backside trench spacers according to the first embodiment of the present disclosure.
Figure 15A:
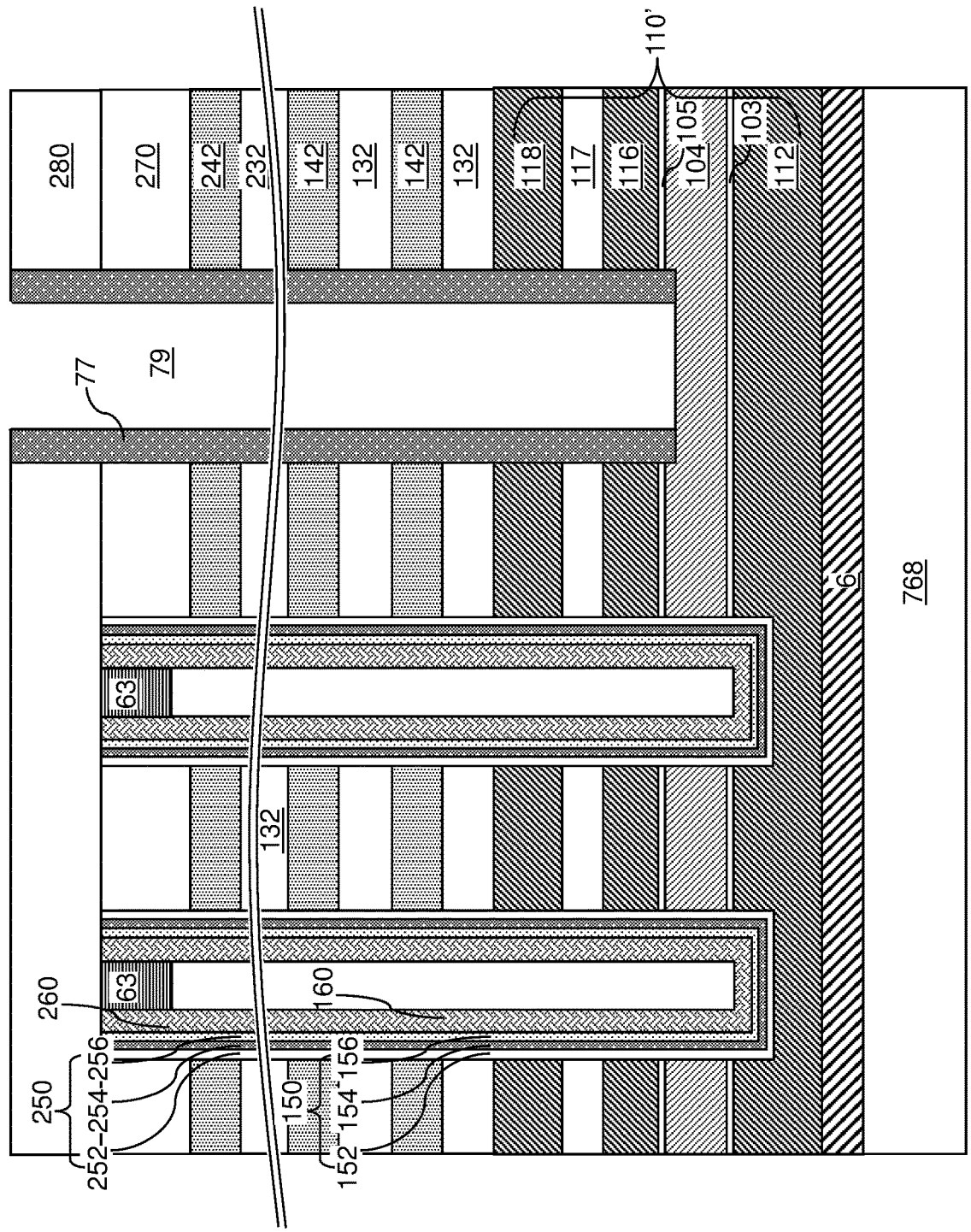
FIGS. 15A-15E illustrate sequential vertical cross-sectional views of memory opening fill structures and a backside trench during formation of source-level material layers according to the first embodiment of the present disclosure.

Referring to FIGS. 14 and 15A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 15B:
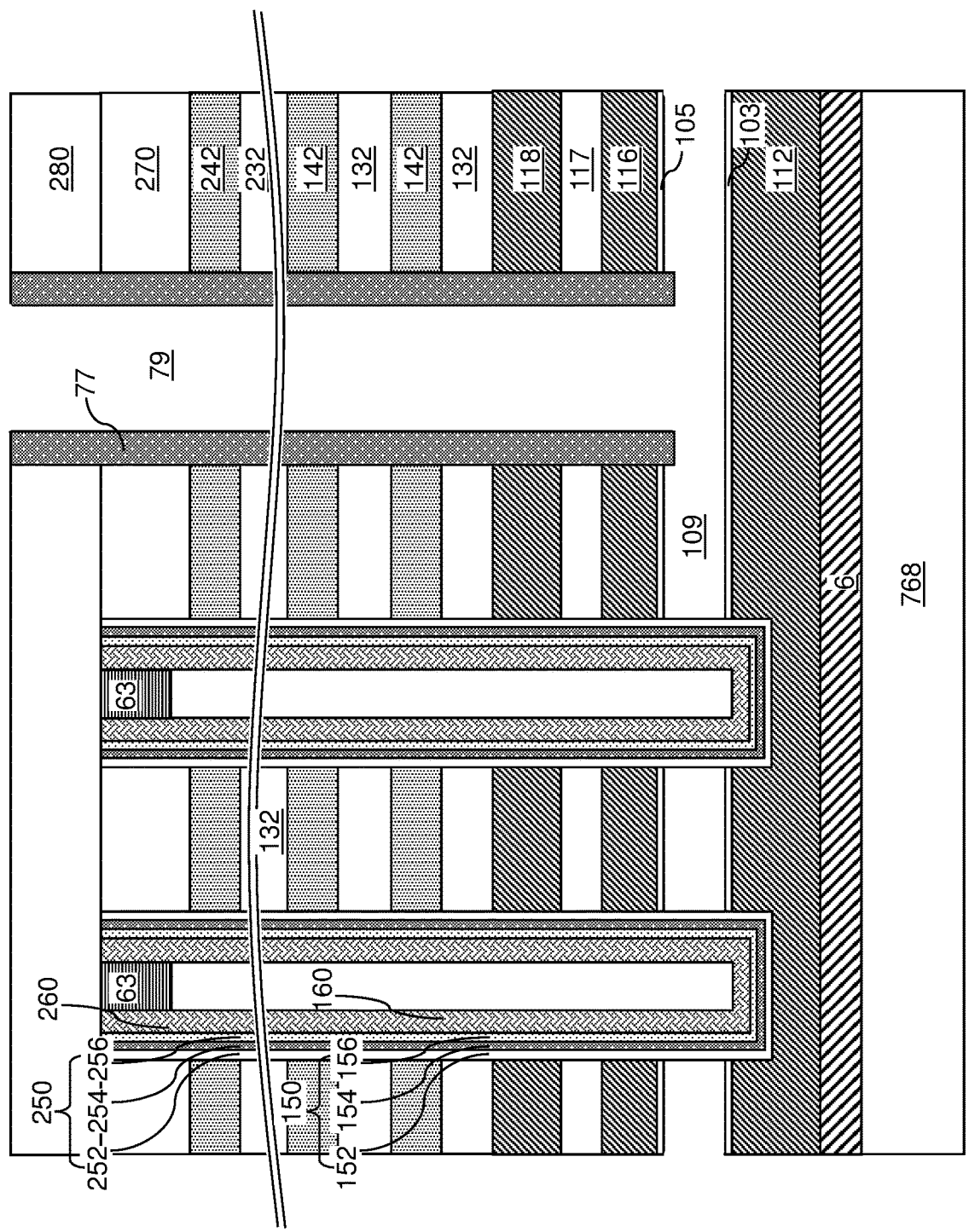

Referring to FIG. 15B, an etchant that etches the material of the source-level sacrificial layer 104 selective to the materials of the first alternating stack (132, 142), the second alternating stack (232, 242), the first and insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 15C:
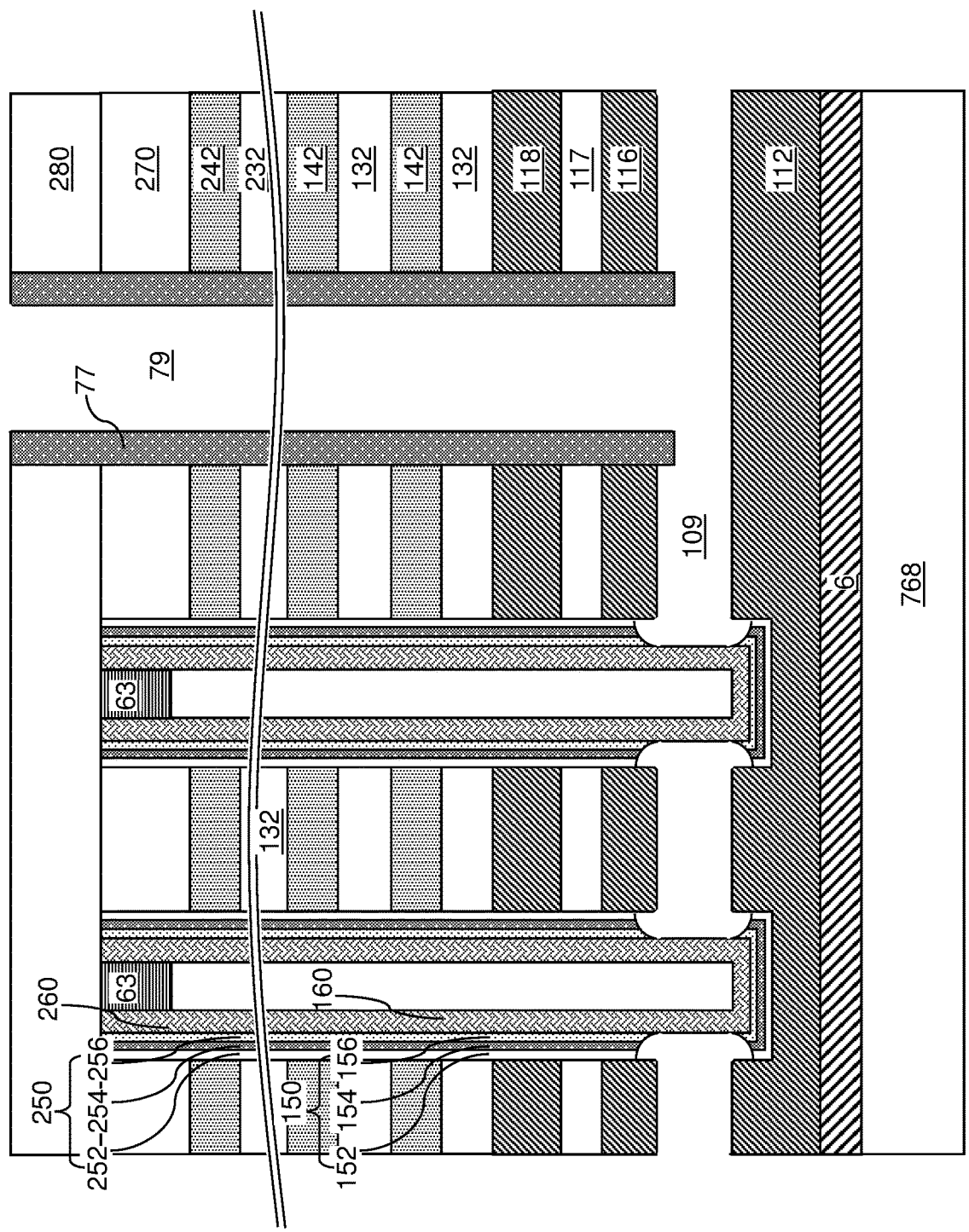

Referring to FIG. 15C, a sequence of isotropic etchants, such as wet etchants, may be applied to the physically exposed portions of the memory films (150, 250) to sequentially etch the various component layers of the memory films (150, 250) from outside to inside, and to physically expose cylindrical surfaces of the vertical semiconductor channels 60 at the level of the source cavity 109. The upper and lower sacrificial liners (105, 103) may be collaterally etched during removal of the portions of the memory films (150, 250) located at the level of the source cavity 109. The source cavity 109 may be expanded in volume by removal of the portions of the memory films (150, 250) at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films (150, 250) selective to at least one source-level semiconductor layer (such as the lower source-level semiconductor layer 112 and the upper source-level semiconductor layer 116) and the vertical semiconductor channels 60.

Figure 15D:
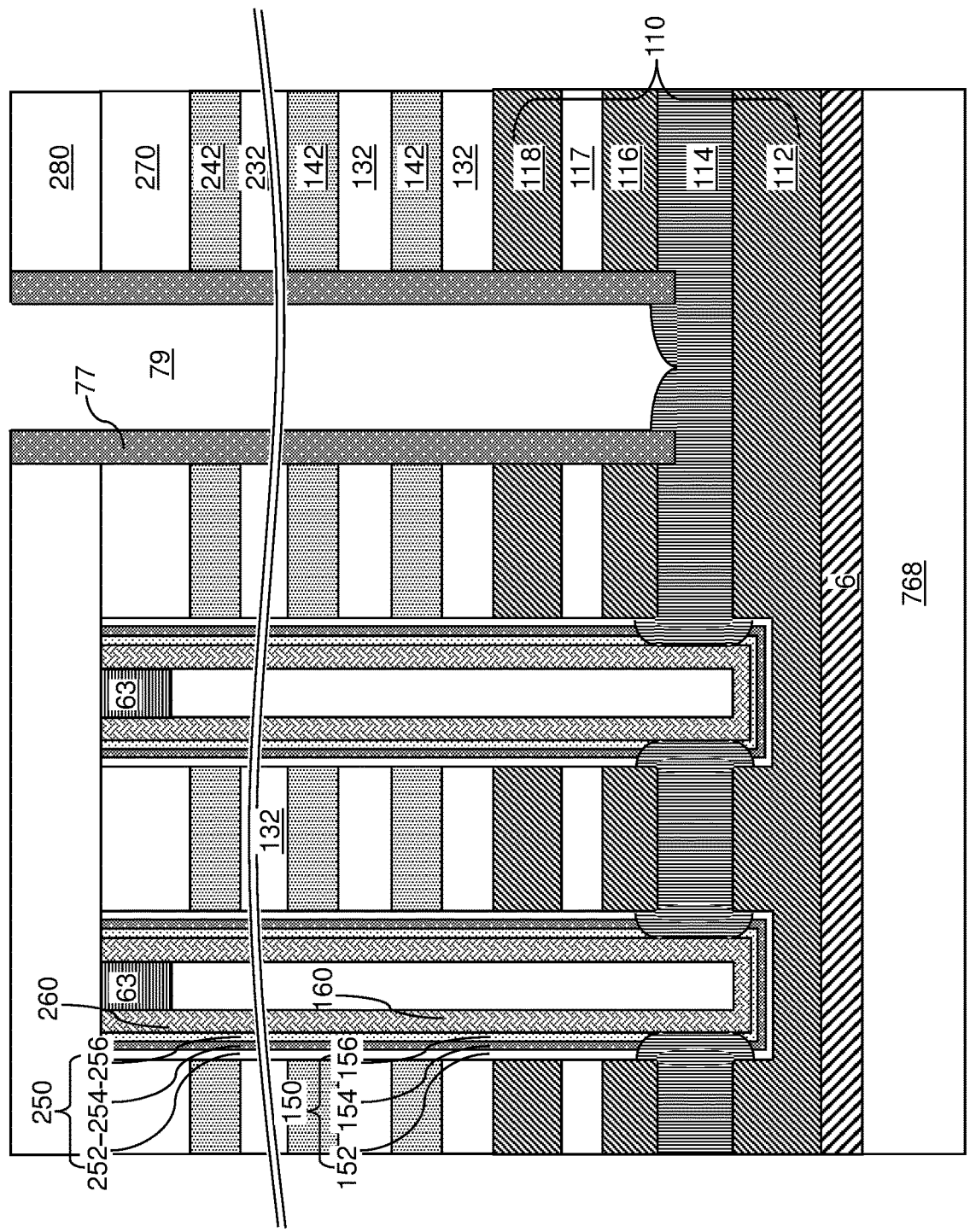

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 15E:
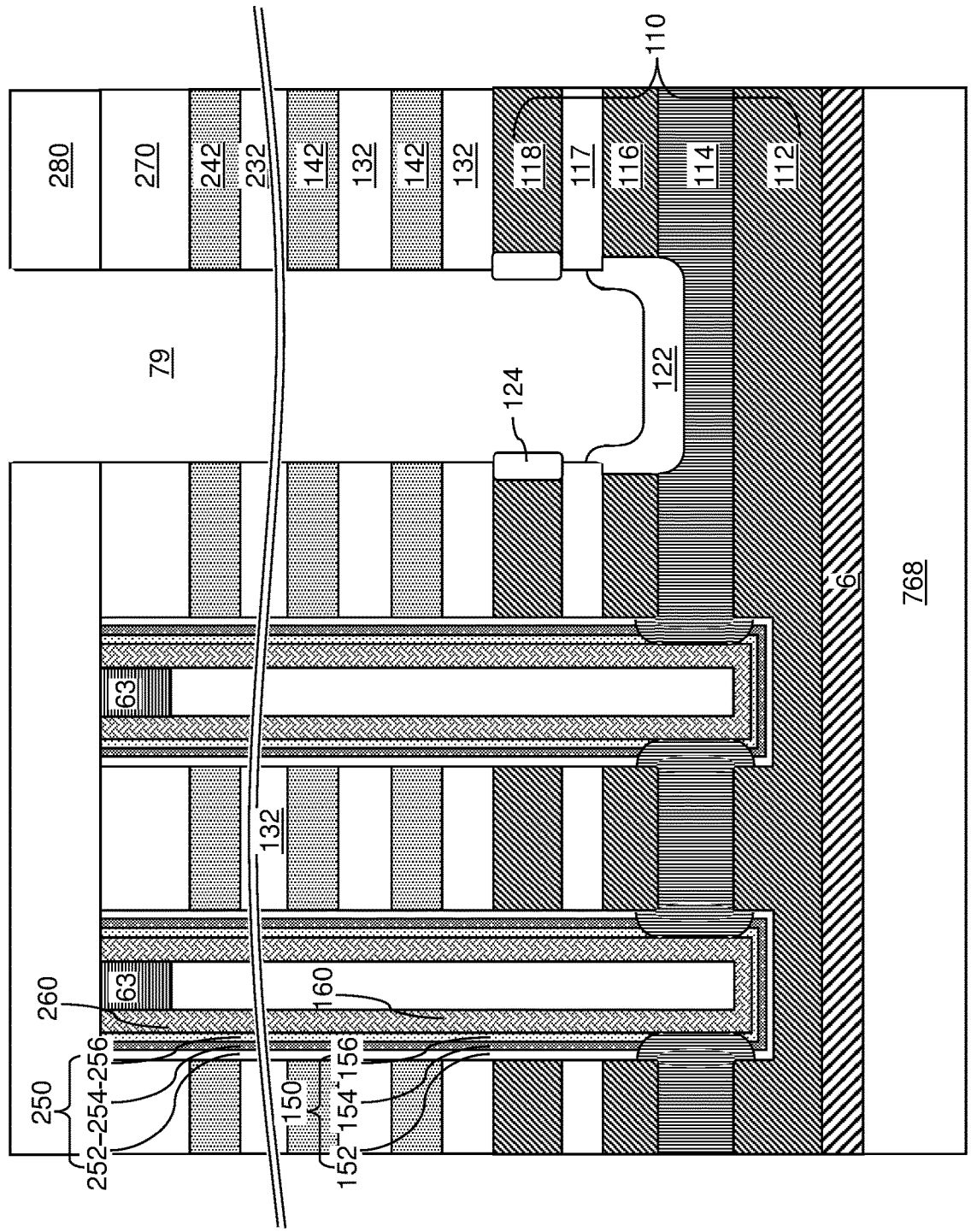
Figure 16:
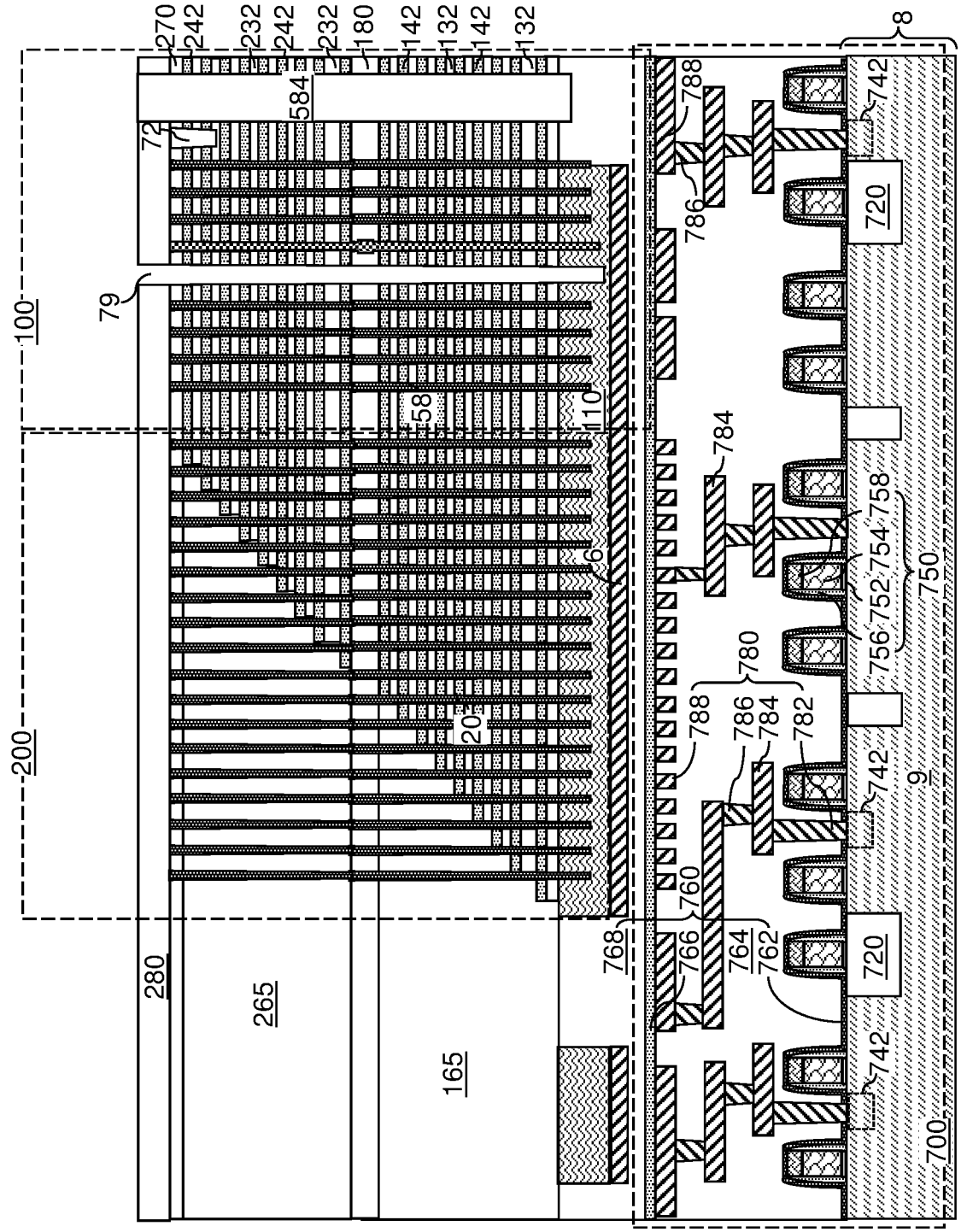
FIG. 16 is a vertical cross-sectional view of the first exemplary structure after formation of source-level material layers according to the first embodiment of the present disclosure.

Referring to FIGS. 15E and 16, the backside trench spacers 77 may be removed selective to the insulating layers (132, 232), the first and insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 17:
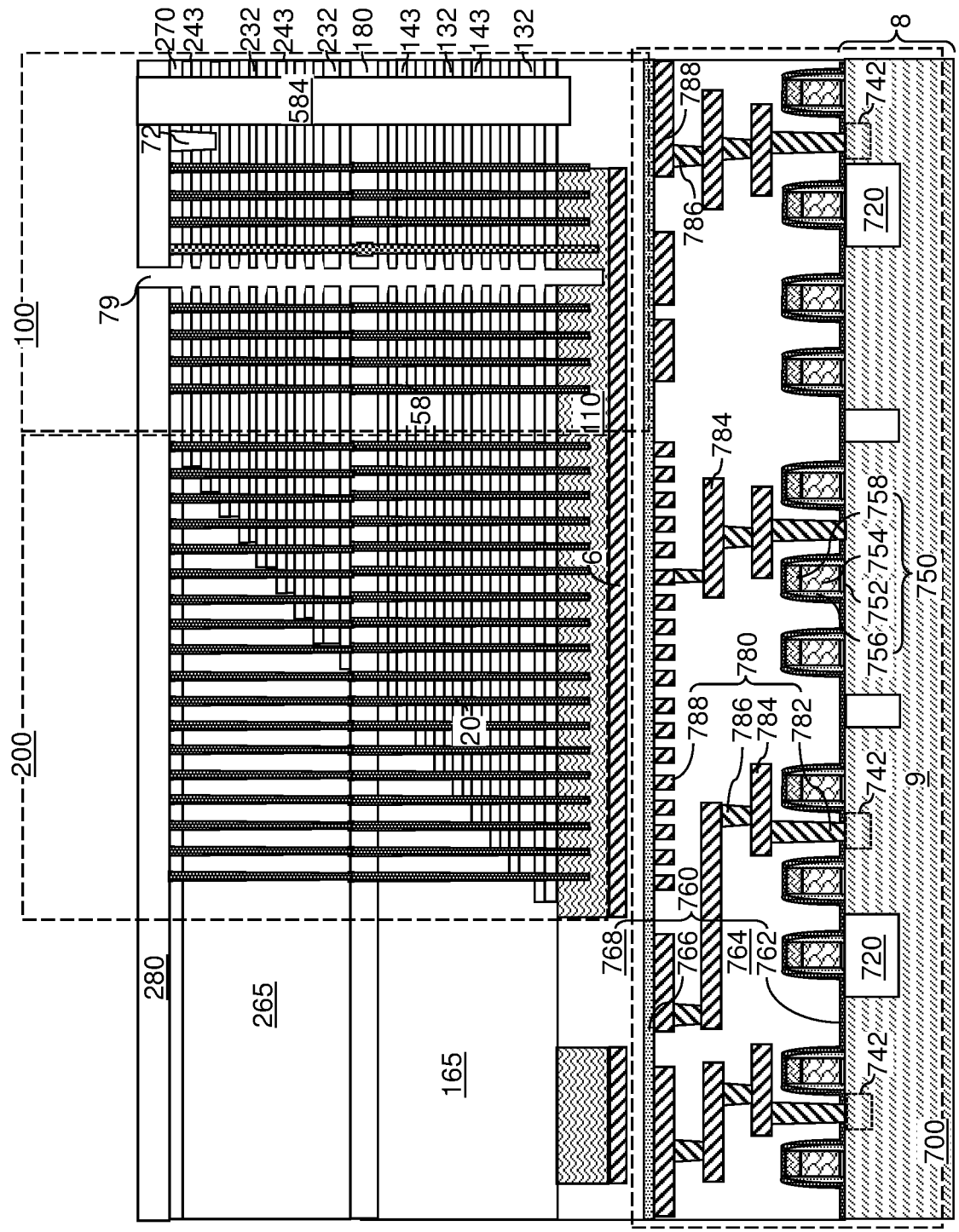
FIG. 17 is a vertical cross-sectional view of the first exemplary structure after formation of backside recesses according to the first embodiment of the present disclosure.

Referring to FIG. 17, the sacrificial material layers (142, 242) are removed selective to the insulating layers (132, 232), the first and insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and insulating cap layers (170, 270), the retro-stepped dielectric material portions (165, 265), and the material of the outermost layer of the memory films (150, 250) may be introduced into the backside trenches 79, for example, using an isotropic etch process. For example, the sacrificial material layers (142, 242) may include silicon nitride, the materials of the insulating layers (132, 232), the first and insulating cap layers (170, 270), the retro-stepped dielectric material portions (165, 265), and the outermost layer of the memory films (150, 250) may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 18A:
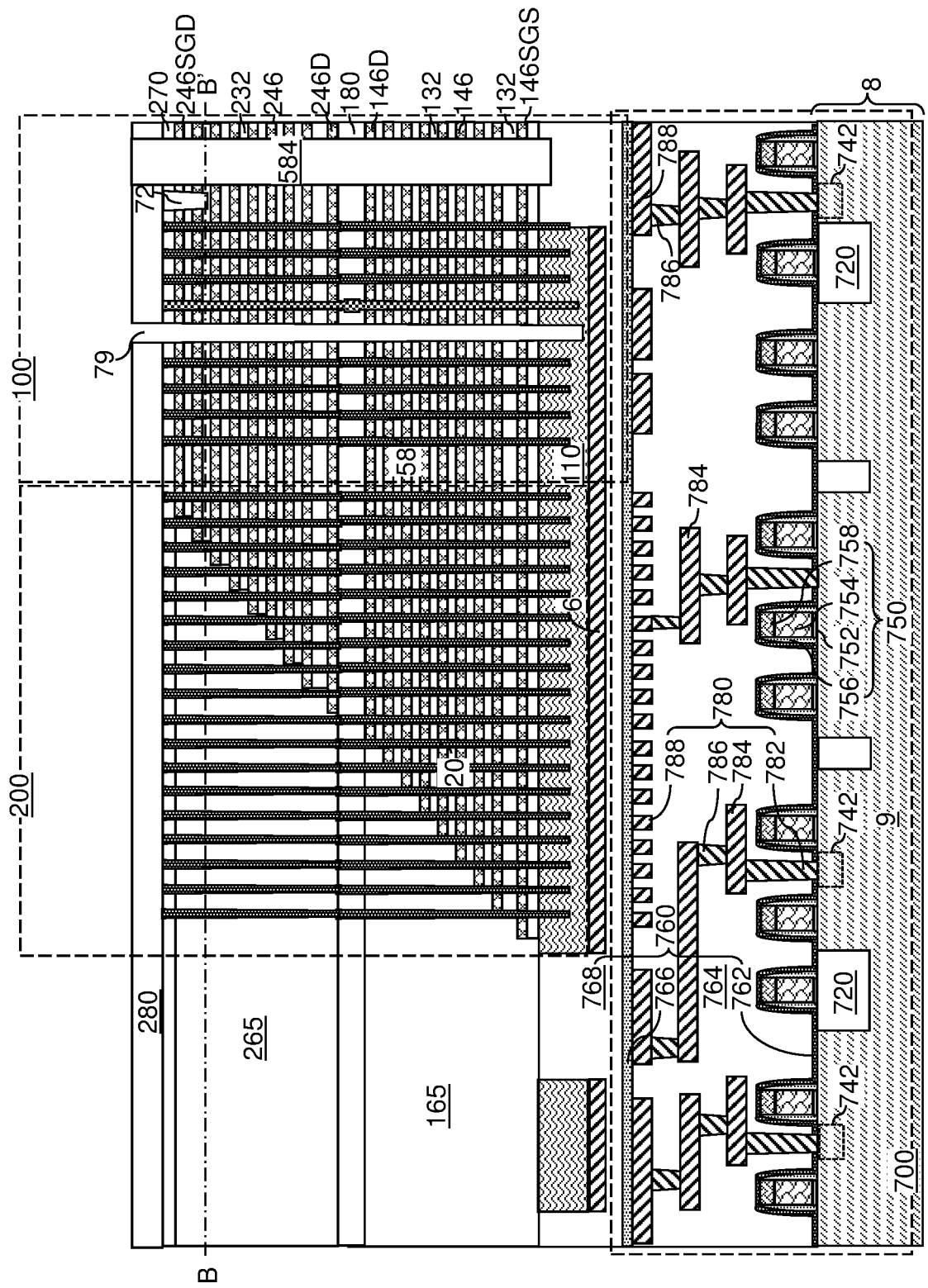
FIG. 18A is a vertical cross-sectional view of the first exemplary structure after formation of electrically conductive layers according to the first embodiment of the present disclosure.
Figure 18B:
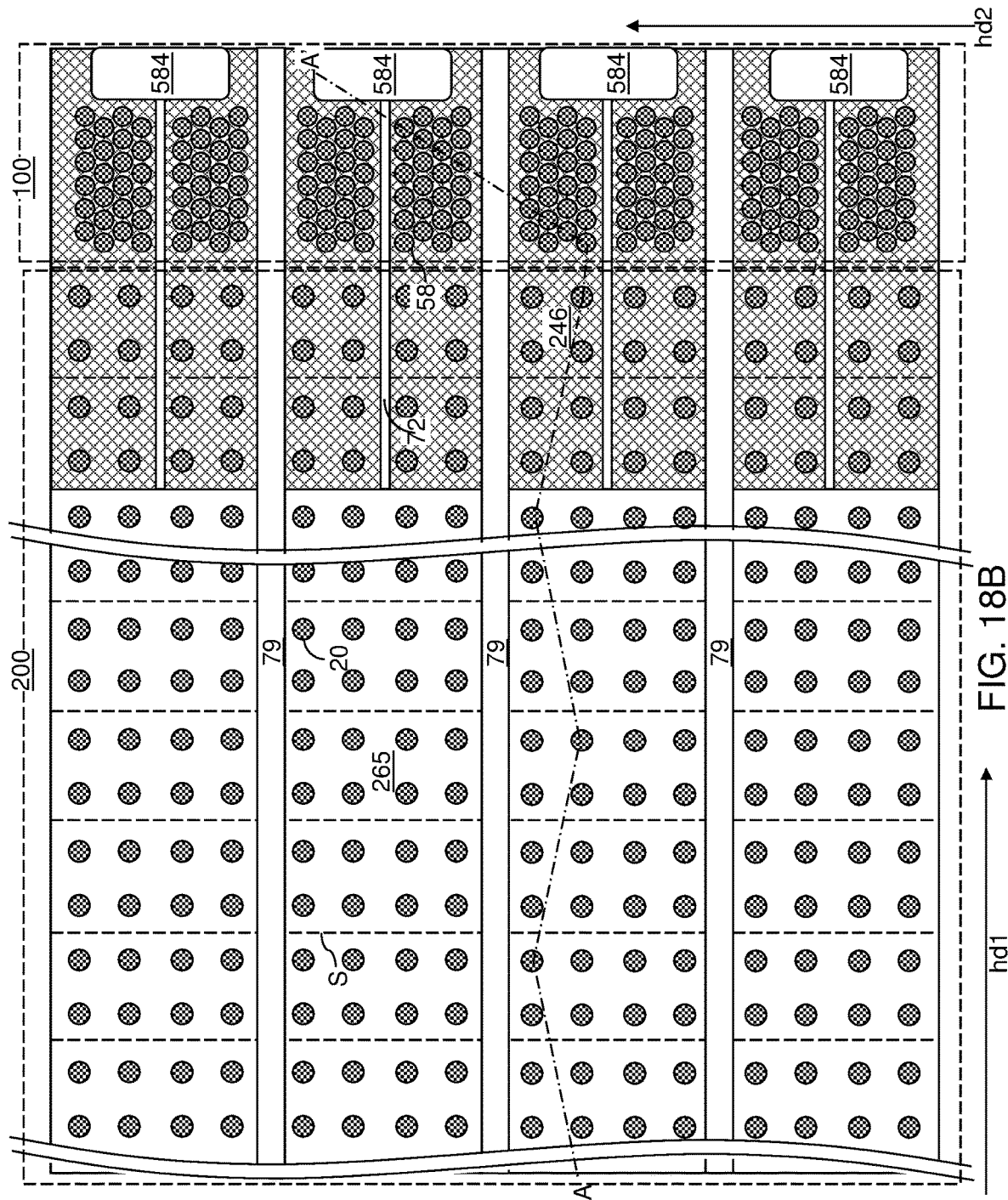
FIG. 18B is a horizontal cross-sectional view of the first exemplary structure along the horizontal plane B-B' of FIG. 18A. The hinged vertical plane A-A' corresponds to the plane of the vertical cross-sectional view of FIG. 18A.

Referring to FIGS. 18A-18C, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting first exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers (146, 146D, 146SGS) may be formed in the plurality of first backside recesses 143, a plurality of second electrically conductive layer (246, 246D, 246SGD) may be formed in the plurality of second backside recesses 243, and a continuous metallic material layer (not shown) may be formed on the sidewalls of each backside trench 79 and over the first contact-level dielectric layer 280. Each of the first electrically conductive layers (146, 146D, 146SGS) and the second electrically conductive layer (246, 246D, 246SGD) may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

At least one topmost first electrically conductive layer (146, 146D, 146SGS) comprises a first dummy word line 146D and at least one bottommost electrically conductive layer comprises a second dummy word line 246D. In one embodiment, there may be one, two, three or four of each dummy word line 146D and/or 246D. The dummy word lines (146D, 246D) are located above and below the inter-tier dielectric layer 180 and the inter-tier doped region 363. The dummy word lines (146D, 246D) are turned on during the erase operation to enhance gate induced drain leakage (GIDL) erase of the vertical NAND string. Thus, in one embodiment, the dummy word lines (146D, 246D) are not used to write data to the memory cells (e.g., to portions of the memory material layers (154, 254) located adjacent to the dummy word lines (146D, 246D).

In some embodiments, drain-select-level isolation structures 72 may be provided at topmost levels of the second electrically conductive layer (246, 246D, 246SGD). The drain-select-level isolation structures 72 may cut through parts of some but not all of the memory opening fill structures 58, which results in unequal channel size at the drain select levels in different memory opening fill structures 58. This difference results in a different erase depth between the different memory opening fill structures, which negatively impacts the GIDL erase performance and reliability of the device.

A subset of the second electrically conductive layer (246, 246D, 246SGD) located at the levels of the drain-select-level isolation structures 72 constitute drain select gate electrodes 246SGD. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure {(150, 160), (250, 260)}. One or more bottommost first electrically conductive layers (146, 146D, 146SGS) function as source select gate electrodes 146SGS. Thus, from bottom to top, the electrically conductive layers comprise at least one source select gate electrode 146SGS, first word lines 146, at least one first dummy word line 146D, at least one second dummy word line 246D, second word lines 246, and at least one drain select gate electrode 246SGD.

In one embodiment, during a GIDL erase step, a source supply voltage Vss is applied to the word lines (146, 246), an erase voltage Vera is applied to the channels (160, 260) from the source or drain sides, the erase voltage Vera is applied to the first dummy word line(s) 146D, and a voltage Vera-d lower than the erase voltage Vera is applied to the second dummy word lines(s) 246D. During the inhibit/boosting step, a pass voltage Vpass is applied to the word lines (146, 246) and a positive voltage is applied to the dummy word lines (146D, 246D). If there are more than one of each of the dummy word lines, then a lower positive voltage (e.g., 2V) is applied to the inner dummy word lines (146D, 246D) located adjacent to the inter-tier dielectric layer 180, and a higher positive voltage (e.g. 4V) is applied to the outer dummy word lines (146D, 246D) located farther away from the inter-tier dielectric layer 180.

Thus, by forming the p-n junctions at the joint (i.e., inter-tier) region using the doped region 363, and adding dummy word lines (146D, 246D) adjacent to the p-n junctions, GIDL current may be generated in the channels (160, 260) at the joint region. The joint GIDL current is used to improve the erase speed and boosting leakage current control of the memory device. Furthermore, for devices with different channel size memory opening fill structures 58, the joint GIDL current decreases the negative effect of the different erase depths described above.

Each of the memory stack structures {(150, 160), (250, 260)} comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures {(150, 160), (250, 260)} vertically extending through the at least one alternating stack (132, 146, 232, 246).

In one embodiment, the memory opening fill structure 58 comprises a first vertical stack of memory elements (such as portions of a first memory material layer 154) located at levels of the first electrically conductive layers and adjacent to the first vertical semiconductor channel 160, and a second vertical stack of memory elements (such as portions of a first memory material layer 154) located at levels of the second electrically conductive layers and adjacent to the second vertical semiconductor channel 260.

In one embodiment, the first vertical stack of memory elements (such as portions of a first memory material layer 154) and the second vertical stack of memory elements (such as portions of a first memory material layer 154) comprise portions of at least one memory film {50 or (150, 250)} located at the levels of the first electrically conductive layers and the second electrically conductive layers.

Figure 19A:
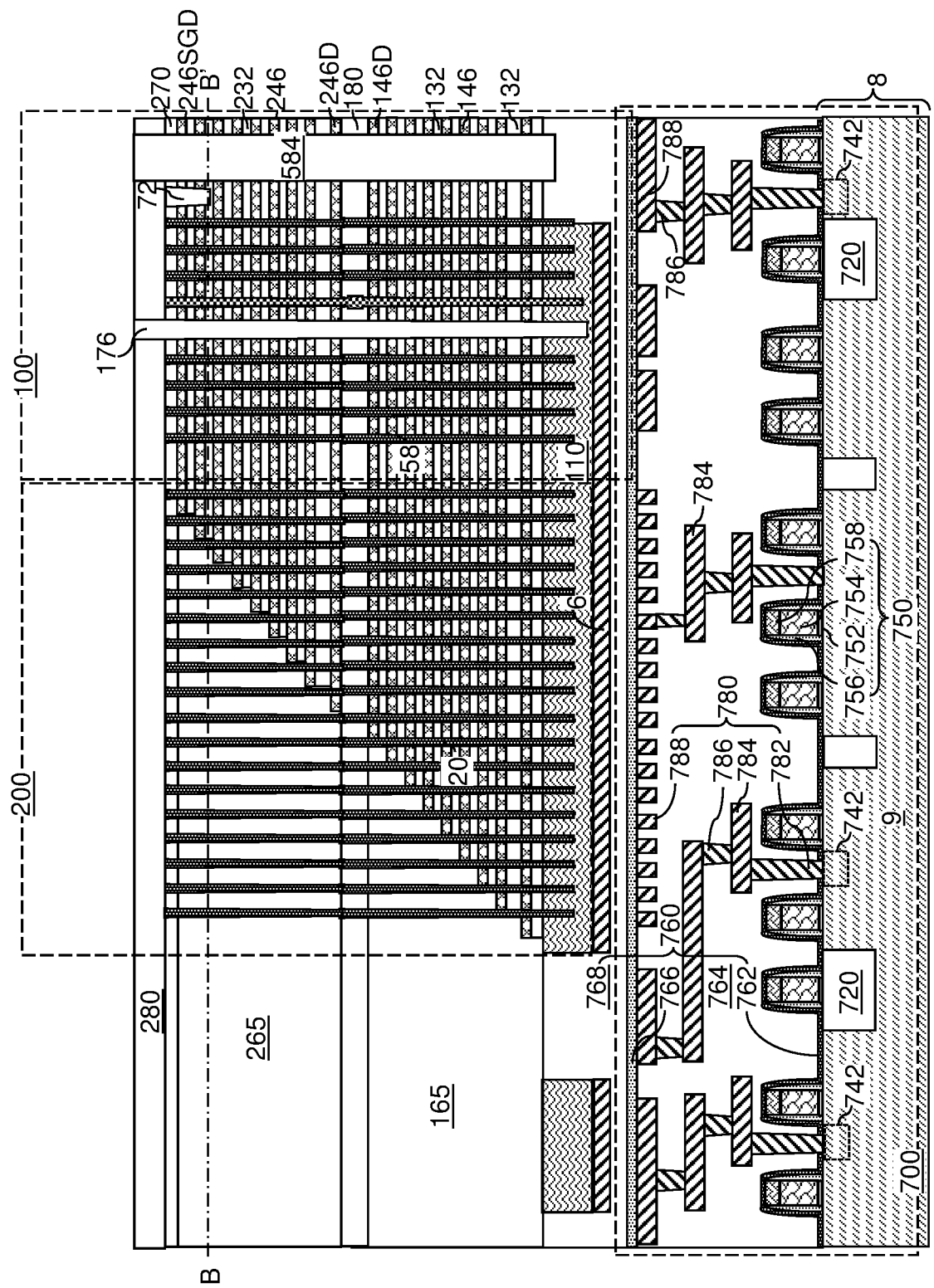
FIG. 19A is a vertical cross-sectional view of the first exemplary structure after formation of backside trench fill structures in the backside trenches according to the first embodiment of the present disclosure.
Figure 19B:
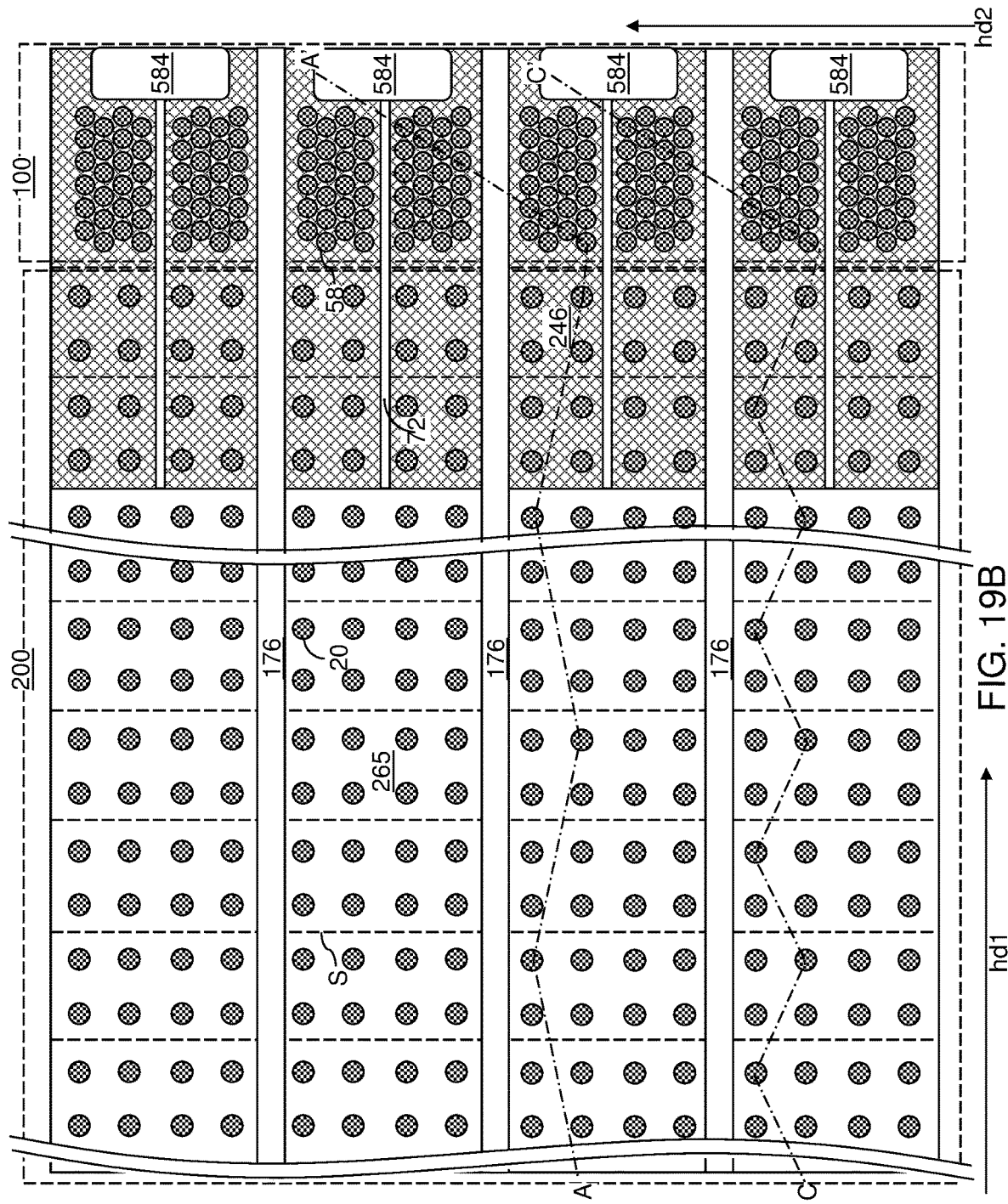
FIG. 19B is a horizontal cross-sectional view of the first exemplary structure along the horizontal plane B-B' of FIG. 19A. The hinged vertical plane A-A' corresponds to the plane of the vertical cross-sectional view of FIG. 19A.
Figure 19C:
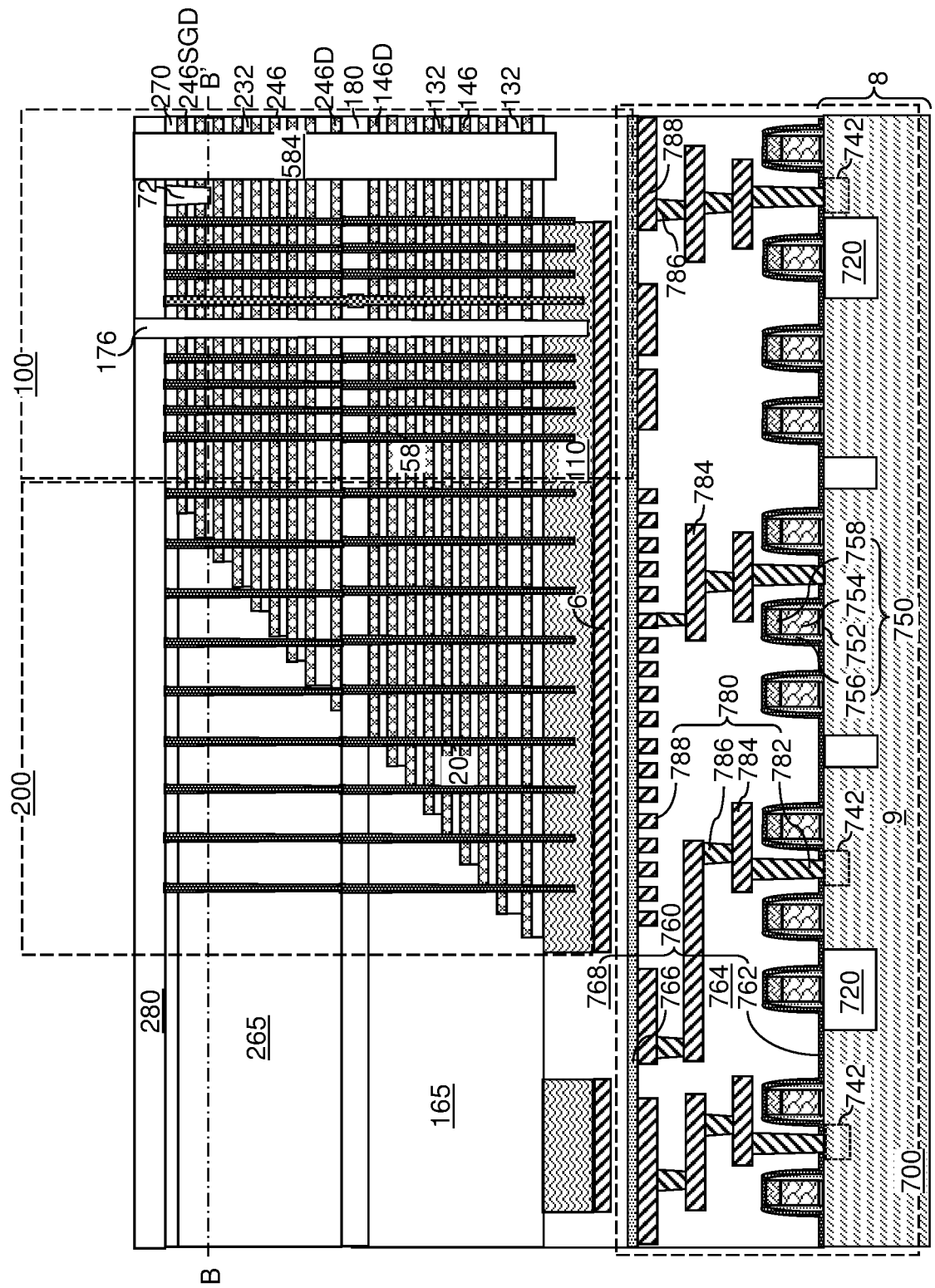
FIG. 19C is a vertical cross-sectional view of the first exemplary structure along the vertical plane C-C' of FIG. 19B.

Referring to FIGS. 19A-19C, a dielectric material layer may be conformally deposited in the backside trenches 79 and over the first contact-level dielectric layer 280 by a conformal deposition process. The dielectric material layer may include, for example, silicon oxide.

Figure 20A:
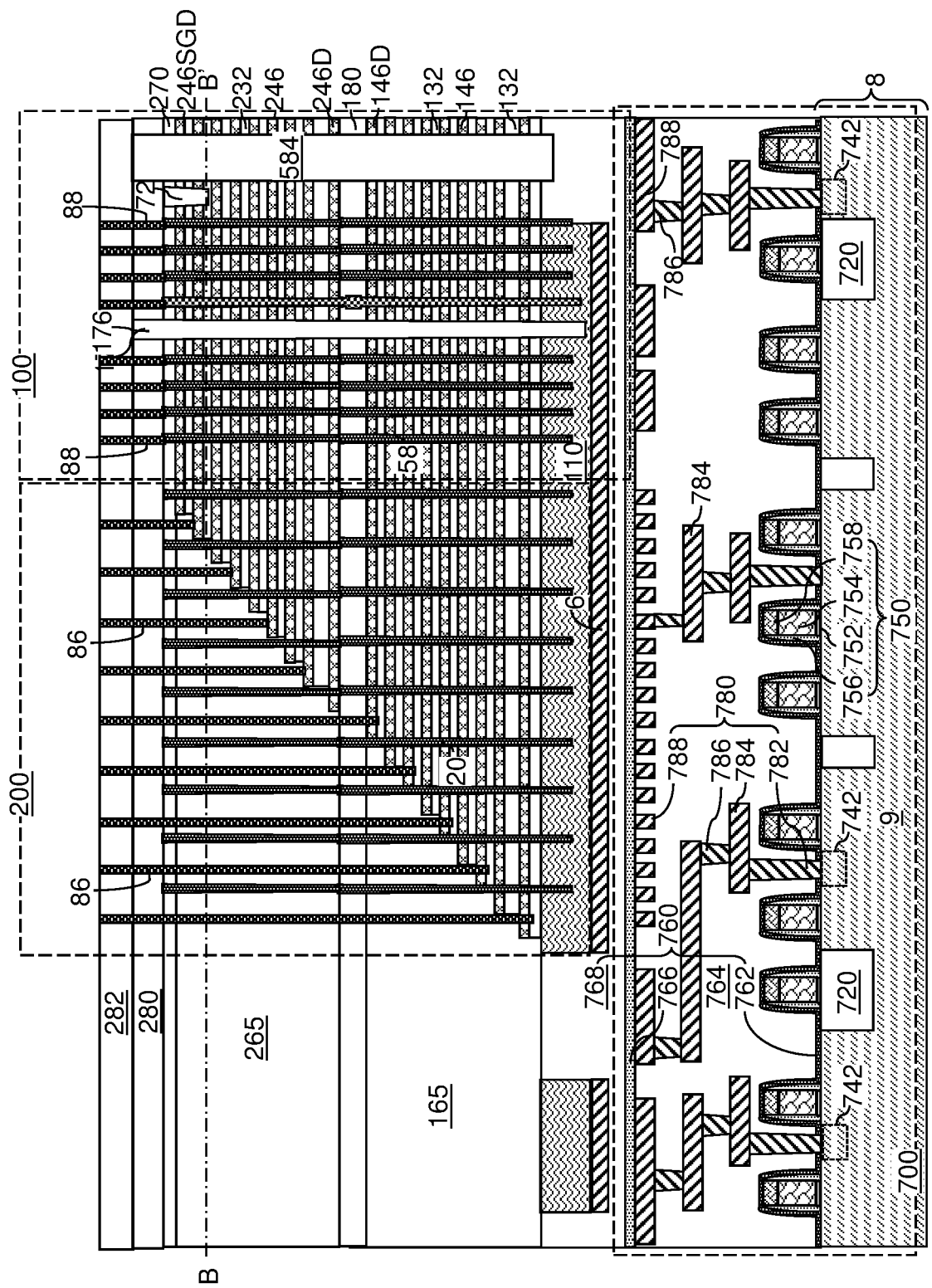
FIG. 20A is a vertical cross-sectional view of the first exemplary structure after formation of a second contact-level dielectric layer and various contact via structures according to the first embodiment of the present disclosure.

Referring to FIGS. 20A and 20B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layer (246, 246D, 246SGD) that function as drain select level gate electrodes. Further, the staircase-region contact via structures 86 may include word line contact via structures that contact electrically conductive layers (146, 246) that underlie the drain select level gate electrodes and function as word lines for the memory stack structures {(150, 160), (250, 260)}.

Figure 21:
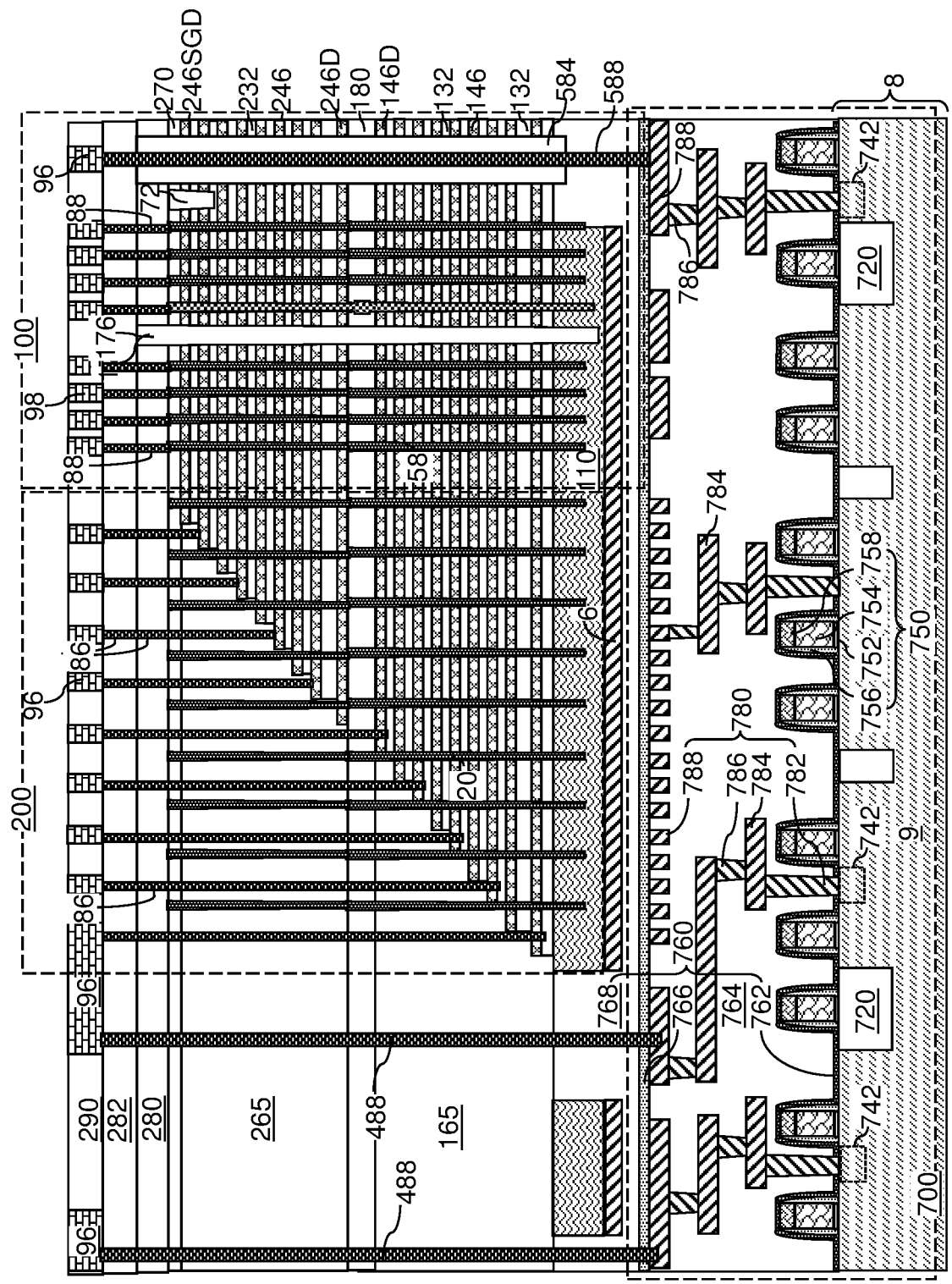
FIG. 21 is a vertical cross-sectional view of the first exemplary structure after formation of through-memory-level via structures and upper metal line structures according to the first embodiment of the present disclosure.

Referring to FIG. 21, peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in the peripheral device region 400. Through-memory-region via cavities may be formed through the interconnection region dielectric fill material portions 584 and the at least one second dielectric layer 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Figure 22:
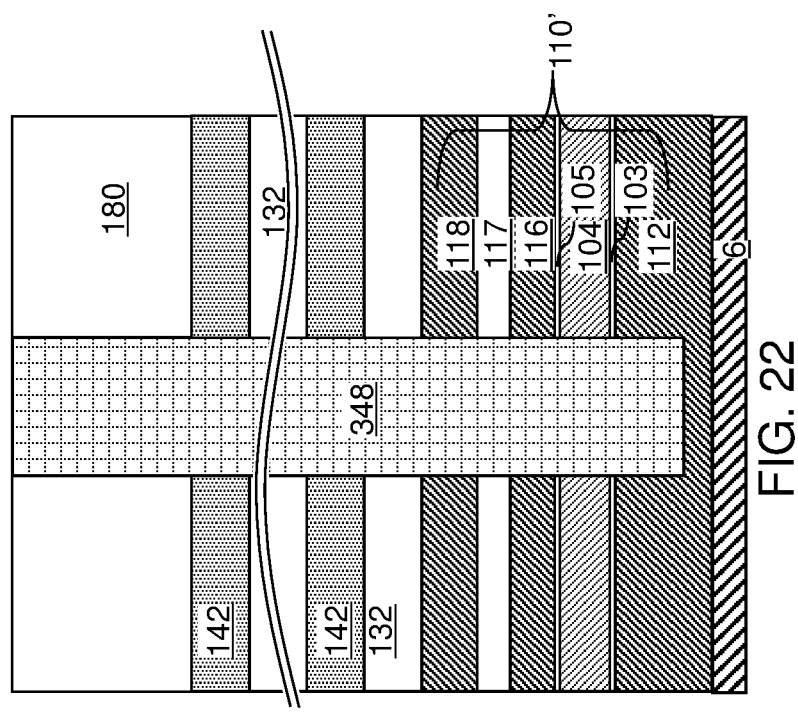
FIG. 22 is a vertical cross-sectional view of a first-tier memory opening after formation of a sacrificial memory opening fill structure in a second exemplary structure according to a second embodiment of the present disclosure.

Referring to FIG. 22, a region of a second exemplary structure according to a second embodiment of the present disclosure is illustrated. The second exemplary structure can be derived from the first exemplary structure illustrated in FIGS. 4A, 4B, and 5A by filling each of the first-tier openings with a respective sacrificial fill material portion. For example, a sacrificial fill material that can be subsequently removed selective to the materials of the first alternating stack (132, 142), the inter-tier dielectric layer 180, and the in-process source-level material layers 110'. For example, the sacrificial fill material may comprise amorphous silicon, a silicon-germanium alloy, amorphous carbon, diamond-like carbon (DLC), organosilicate glass, or a polymer material. Each first-tier memory opening 149 is filled with a sacrificial memory opening fill structure 348. Each first-tier support opening 129 is filled with a sacrificial support opening fill structure.

Figure 23:
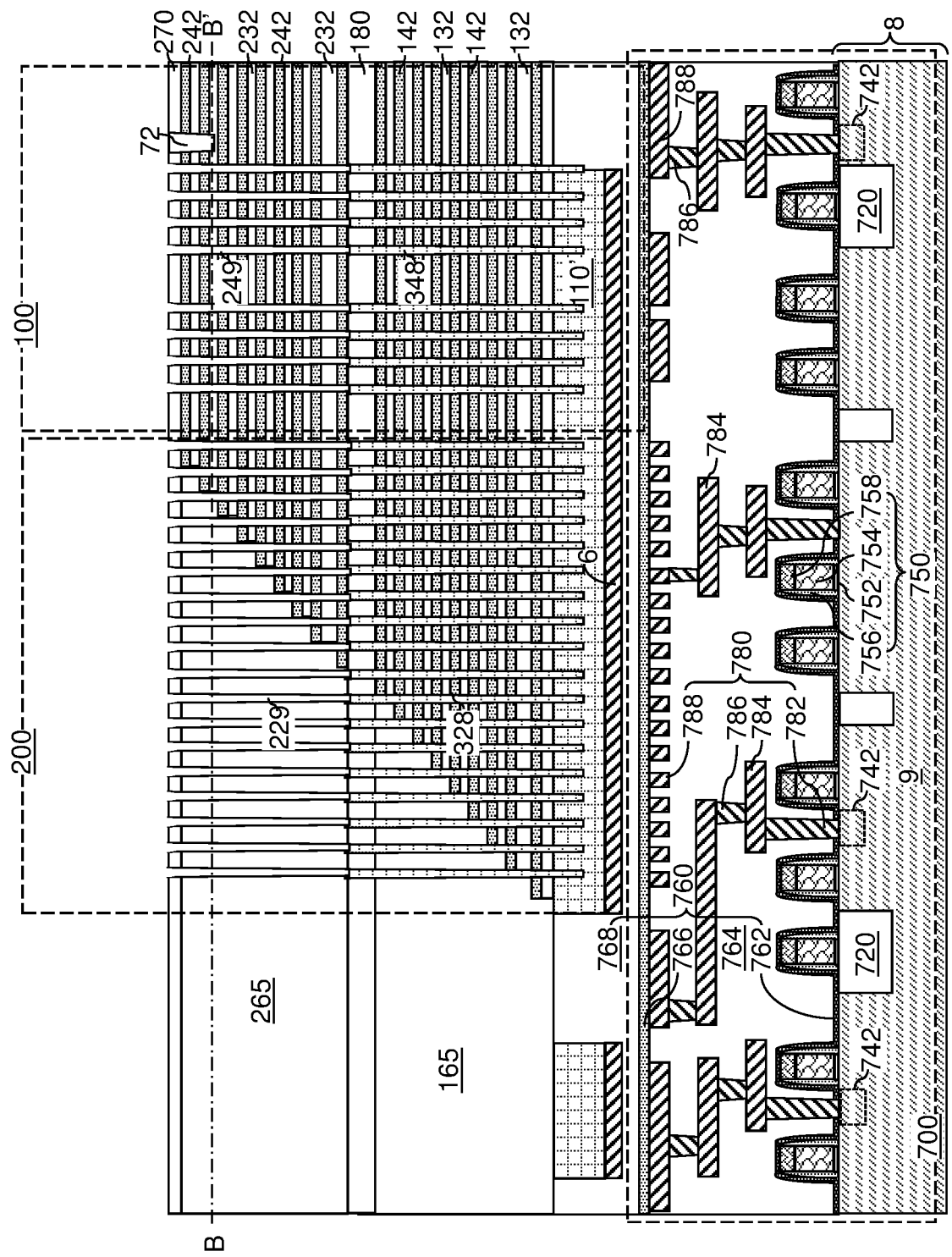
FIG. 23 is a vertical cross-sectional view of the second exemplary structure after formation of a second alternating stack of second insulating layers and second spacer material layers, second stepped surfaces, a second retro-stepped dielectric material portion, second-tier memory openings, and second-tier support openings according to the second embodiment of the present disclosure.

Referring to FIG. 23, the processing steps of FIGS. 7 and 8A and 8B can be performed to form a second-tier structure and to form various second-tier openings. The pattern of the second-tier openings in the second exemplary structure can be the same as the pattern of the second-tier openings in the first exemplary structure. The sacrificial memory opening fill structure 348 are located within the first-tier memory openings 149, and the sacrificial support opening fill structures 328 are located within the first-tier support openings.

Figure 24:
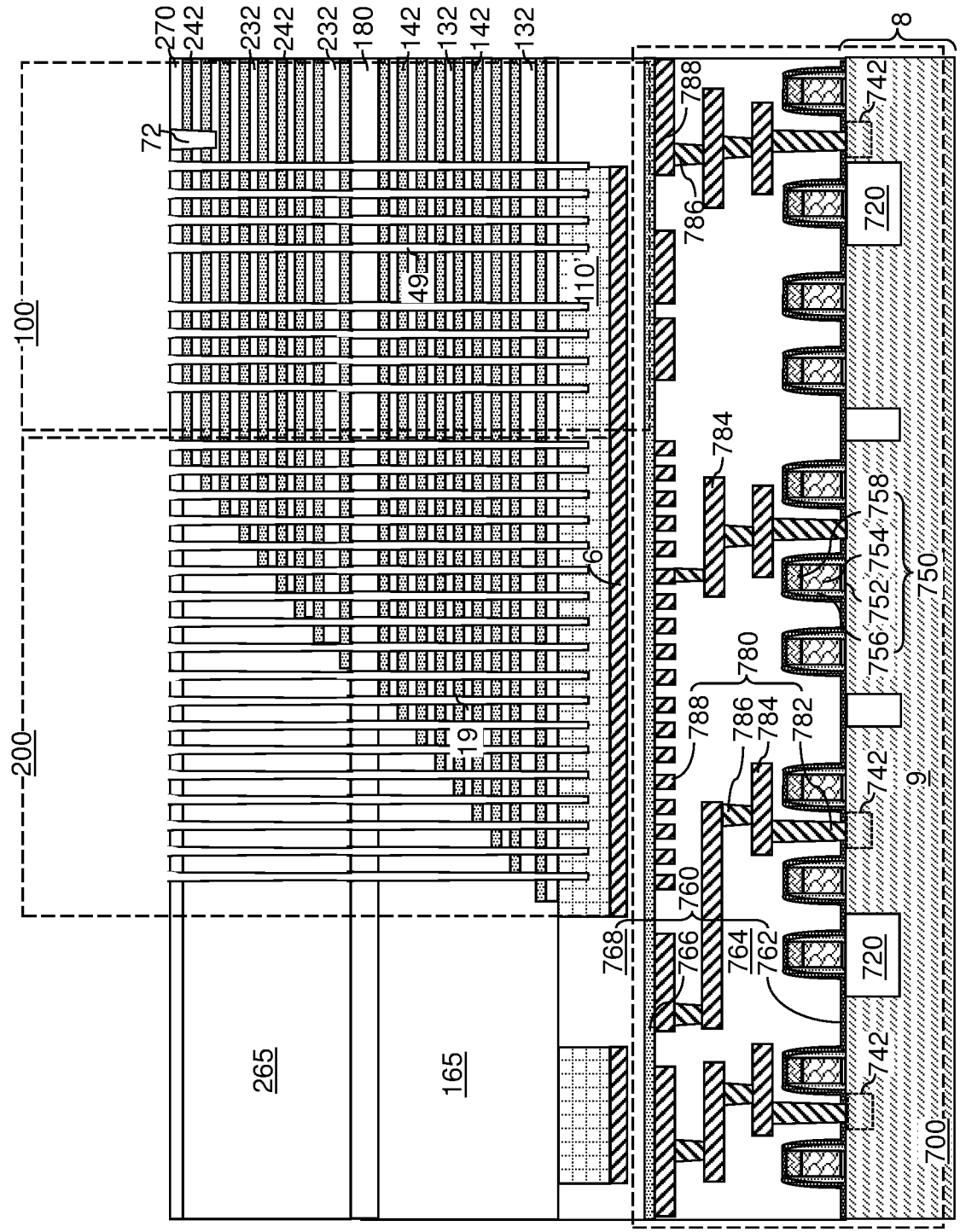
FIG. 24 is a vertical cross-sectional view of the second exemplary structure after formation of inter-tier memory openings and inter-tier support openings according to the second embodiment of the present disclosure.

Referring to FIG. 24, the sacrificial memory opening fill structure 348 and the sacrificial support opening fill structures 328 can be removed selective to the first alternating stack (132, 142), the inter-tier dielectric layer 180, and the in-process source-level material layers 110' by performing a selective etch process. Memory openings 49 are formed in contiguous combinations of volumes of the second-tier memory openings 249 and the first-tier memory openings 148. Support openings 19 are formed in contiguous combinations of volumes of the second-tier support openings 229 and the first-tier support openings.

FIGS. 25A-25H are sequential vertical cross-sectional views of an inter-tier memory opening in the second exemplary structure during formation of a memory opening fill structure according to the second embodiment of the present disclosure.

Referring to FIG. 25A, a region including a memory opening 49 in the second exemplary structure of FIG. 24 is illustrated. The memory opening 49 extends through the first-tier structure, the inter-tier dielectric layer 180, and the second-tier structure.

Referring to FIG. 25B, a stack of layers including a blocking dielectric layer 52, a memory material layer 54, and a tunneling dielectric layer 56 may be sequentially deposited in the memory openings 49. The blocking dielectric layer 52 may include any material that may be employed for the first blocking dielectric layer 152 in the first exemplary structure. The memory material layer 54 may include any material that may be employed for the first memory material layer 154 in the first exemplary structure. The tunneling dielectric layer 56 may include any material that may be employed for the first tunneling dielectric layer 156 in the first exemplary structure. The stack of the blocking dielectric layer 52, the memory material layer 54, and the tunneling dielectric layer 56 constitutes a memory film 50 that stores memory bits.

A first semiconductor channel material layer 160L can be conformally deposited. The first semiconductor channel material layer 160L includes a doped semiconductor material having the first conductivity type. For example, any semiconductor material that may be employed for the first semiconductor channel material layer 160L in the first exemplary structure may be employed for the first semiconductor channel material layer 160L in the second exemplary structure. The atomic concentration of dopants of the first conductivity type in the first semiconductor channel material layer 160L may be in a range from $1.0 \times 10^{12}/cm^3$ to $1.0 \times 10^{18}/cm^3$, such as from $1.0 \times 10^{14}/cm^3$ to $1.0 \times 10^{17}/cm^3$, although lesser and greater atomic concentrations may also be employed. The thickness of the first semiconductor channel material layer 160L may be in a range from 2 nm to 10 nm, although lesser and greater thicknesses may also be used.

A first dielectric core layer 162L may be deposited in cavities located within the memory openings 49. The first dielectric core layer 162L includes a dielectric material such as silicon oxide or organosilicate glass. The first dielectric core layer 162L may be deposited by a conformal deposition method such as low pressure chemical vapor deposition (LPCVD), or by a self-planarizing deposition process such as spin coating.

Referring to FIG. 25C, the horizontal portion of the first dielectric core layer 160L overlying the insulating cap layer 270 may be removed, for example, by a recess etch. The recess etch continues until top surfaces of the remaining portions of the first dielectric core layer 162L are recessed to a height between the top surface of the inter-tier dielectric layer 180 and the bottom surface of the inter-tier dielectric layer 180. Each remaining portion of the dielectric core layer constitutes a first dielectric core 162.

Referring to FIG. 25D, portions of the first semiconductor channel material layer 160L that are located above the top surface of the first dielectric core 162 can be etched in each memory opening 49 by performing a recess etch process. The etch process may be an isotropic etch process which etches the material of the first semiconductor channel material layer 160L selective to the material of the tunneling dielectric layer 56. Each remaining portion of the first semiconductor channel material layer 160L constitutes a first vertical semiconductor channel 160.

Figure 25F:
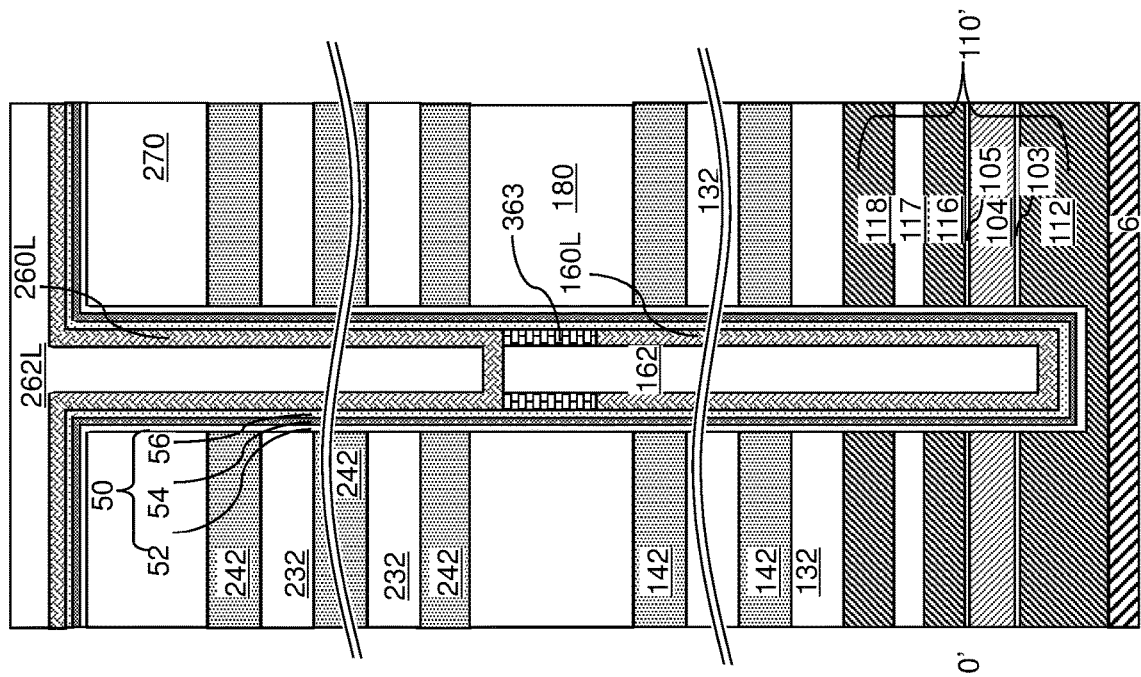
Figure 25E:
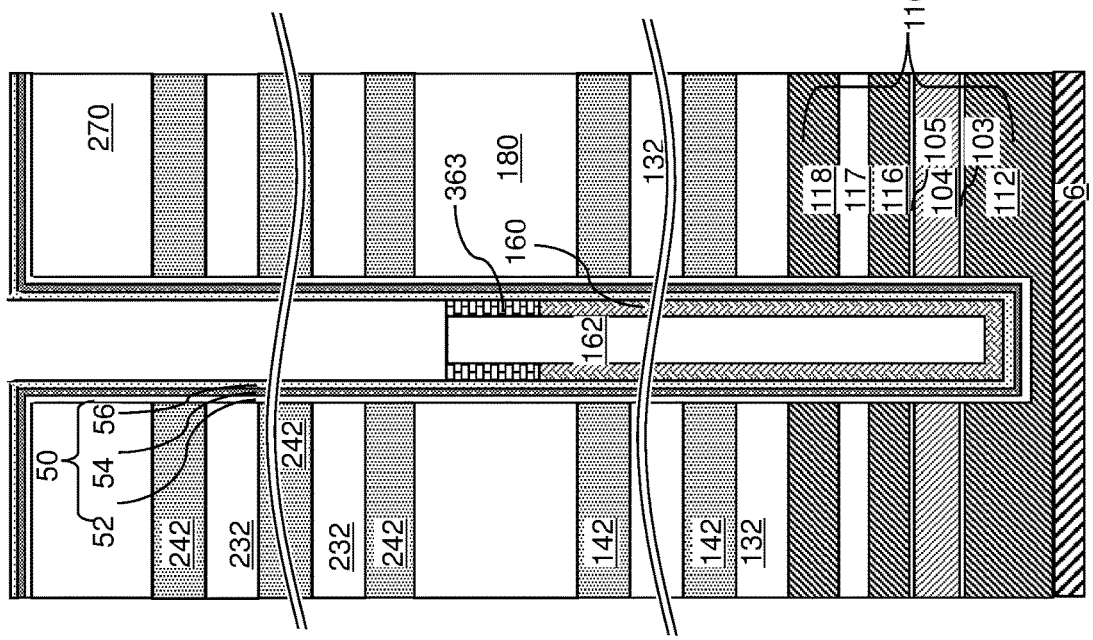

Referring to FIG. 25E, dopants of a second conductivity type can be implanted into an upper portion of each first vertical semiconductor channel 160 by performing an ion implantation process. The second conductivity type is the opposite of the first conductivity type. For example, if the first conductivity type is p-type, the second conductivity type is n-type, and vice versa. An upper portion of each first vertical semiconductor channel 160 is converted into an inter-tier doped region 363 having a doping of the second conductivity type. In one embodiment, a first p-n junction can be formed between a remaining portion of the first vertical semiconductor channel 160 and the inter-tier doped region 363 in each memory opening 49. The dopant concentration in the inter-tier doped region 360 may be in a range from $5.0 \times 10^{18}/cm^3$ to $2.0 \times 10^{21}/cm^3$, although lesser and greater dopant concentrations may also be used. The doped semiconductor material may be, for example, doped amorphous silicon or polysilicon.

Referring to FIG. 25F, a second semiconductor channel material layer 260L can be conformally deposited. The second semiconductor channel material layer 260L includes a doped semiconductor material having the first conductivity type. For example, any semiconductor material that may be employed for the first semiconductor channel material layer 160L may be employed for the second semiconductor channel material layer 260L. The atomic concentration of dopants of the first conductivity type in the second semiconductor channel material layer 260L may be in a range from $1.0 \times 10^{12}/cm^3$ to $1.0 \times 10^{18}/cm^3$, such as from $1.0 \times 10^{14}/cm^3$ to $1.0 \times 10^{17}/cm^3$, although lesser and greater atomic concentrations may also be employed. The thickness of the second semiconductor channel material layer 260L may be in a range from 2 nm to 10 nm, although lesser and greater thicknesses may also be used. A second p-n junction can be formed at an interface between the inter-tier doped region 363 and the second vertical semiconductor channel material layer 260L.

A second dielectric core layer 262L may be deposited in cavities located within the memory openings 49. The second dielectric core layer 162L includes a dielectric material such as silicon oxide or organosilicate glass. The second dielectric core layer 162L may be deposited by a conformal deposition method such as low pressure chemical vapor deposition (LPCVD), or by a self-planarizing deposition process such as spin coating.

Figures 25G, 25H:
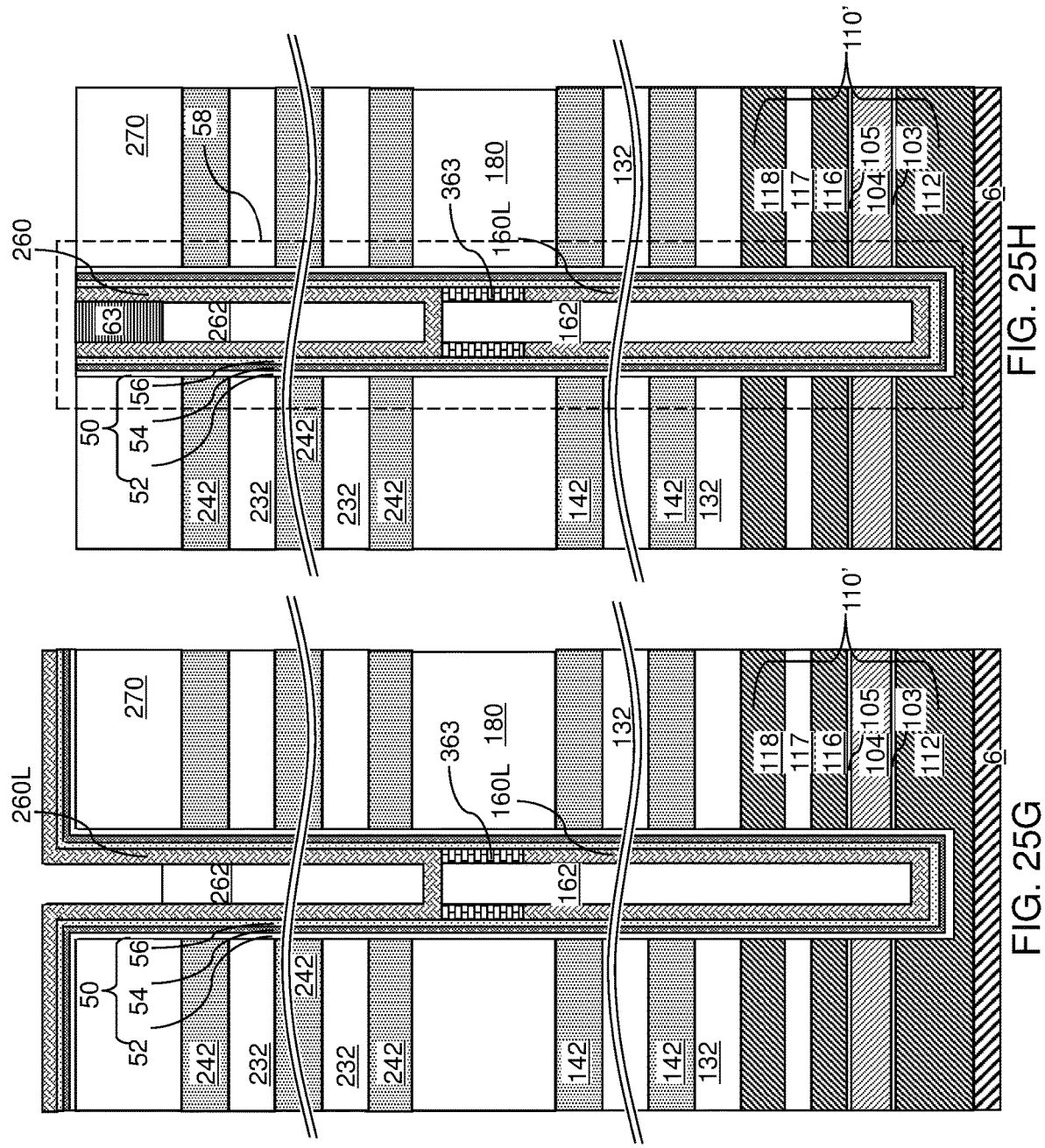

Referring to FIG. 25G, the horizontal portion of the second dielectric core layer 262L overlying the insulating cap layer 270 may be removed, for example, by a recess etch. The recess etch continues until top surfaces of the remaining portions of the second dielectric core layer 262L are recessed to a height between the top surface of the insulating cap layer 270 and the bottom surface of the insulating cap layer 270. Each remaining portion of the second dielectric core layer 262L constitutes a second dielectric core 262.

Referring to FIG. 25H, a doped semiconductor material having a doping of the conductivity type may be deposited in cavities overlying the second dielectric cores 62. Portions of the deposited doped semiconductor material that overlie the horizontal plane including the top surface of the insulating cap layer 270 may be removed by a planarization process such as a chemical mechanical planarization (CMP) process. Each remaining portion of the doped semiconductor material of the conductivity type constitutes a drain region 63. The dopant concentration in the drain regions 63 may be in a range from $5.0 \times 10^{18}/cm^3$ to $0.0 \times 10^{21}/cm^3$, although lesser and greater dopant concentrations may also be used. The doped semiconductor material may be, for example, doped polysilicon.

Each combination of a memory film 50, a first vertical semiconductor channel 160, and a second vertical semiconductor channel 260 within a memory opening 49 constitutes a memory stack structure (50, 160, 260). In one embodiment, the memory stack structure (50, 160, 260) is a combination of a first vertical semiconductor channel 160, a second vertical semiconductor channel 260, a tunneling dielectric layer 56, a plurality of memory elements comprising portions of the memory material layer 54, and an optional blocking dielectric layer 52. Generally, the memory film 50 comprises a vertical stack of memory elements at levels of spacer material layers, which may be formed as the sacrificial material layers 42 and subsequently replaced with electrically conductive layers, or may be formed as electrically conductive layers.

Each combination of a memory stack structure (50, 160, 260), a first dielectric core 162, a second dielectric core 262, an inter-tier doped region 363, and a drain region 63 within a memory opening 49 constitutes a memory opening fill structure 58. Each combination of a memory stack structure (50, 160, 260), a first dielectric core 162, a second dielectric core 262, an inter-tier doped region 363, and a drain region 63 within a support opening constitutes a support pillar structure.

Referring to FIG. 26, an anneal process may be performed to crystallize any amorphous material in the first vertical semiconductor channel 160 and the second semiconductor channel 260 in each of the memory opening fill structures 58 and the support pillar structures. The dopants of the conductivity type in the inter-tier doped region 363 can diffuse into the upper portion of the first vertical semiconductor channel 160 and into the lower portion of the second vertical semiconductor channel 260 in each of the memory opening fill structures 58 and in each of the support pillar structures. The first p-n junction between each inter-tier doped region 363 and an underlying first vertical semiconductor channel 160 may shift below the horizontal plane including the top surface of the first dielectric core 162 in each of the memory opening fill structures 58 and the support pillar structures. In addition, a p-n junction between each inter-tier doped region 363 and an overlying second vertical semiconductor channel 260 may shift above the horizontal plane including the bottom surface of the second dielectric core 262 in each of the memory opening fill structures 58 and the support pillar structures.

Figure 27:
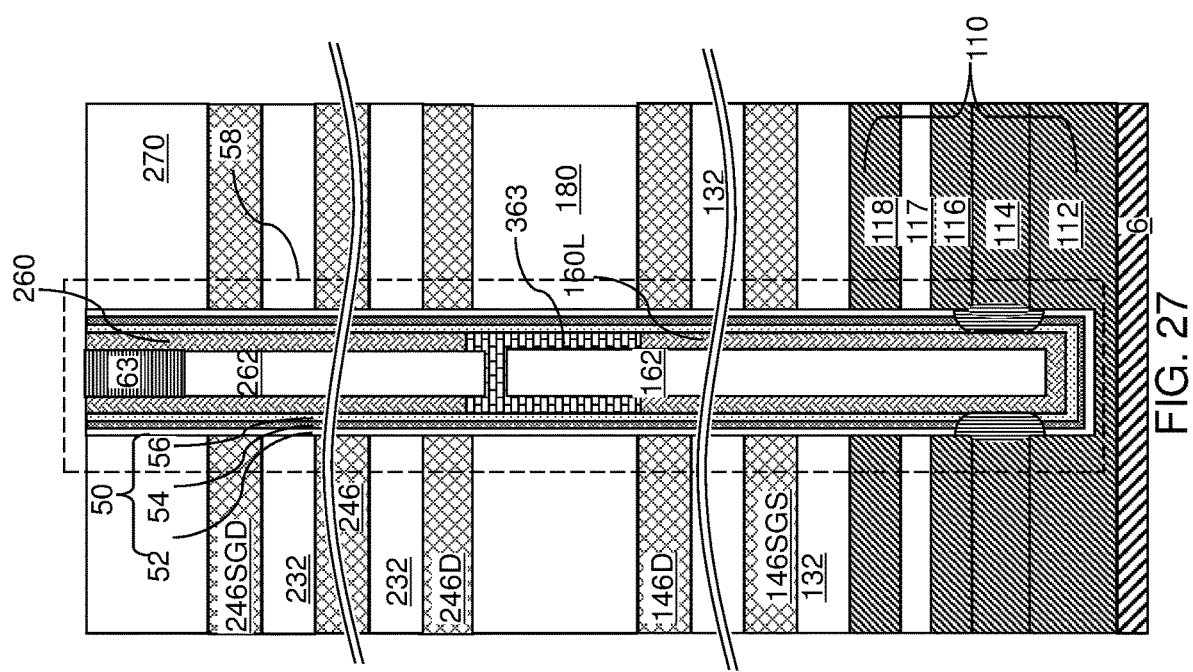
FIG. 27 is a vertical cross-sectional view of a region of the second exemplary structure after replacement of the sacrificial material layers with electrically conductive layers according to the second embodiment of the present disclosure.

Referring to FIG. 27, the processing steps of FIGS. 11A-21 can be subsequently performed to replace the sacrificial material layers (142, 242) with electrically conductive layers (146, 246), and to form various contact via structures and metal interconnect structures. FIG. 27 illustrates a region of the second exemplary structure after replacement of the sacrificial material layers (142, 242) with the electrically conductive layers (146, 246).

Generally, a first alternating stack (132, 142) of first insulating layers 132 and first spacer material layers (such as first sacrificial material layers 142), an inter-tier dielectric layer 180, and a second alternating stack (232, 42) of insulating layers 32 and second spacer material layers (such as first sacrificial material layers 42) can be sequentially formed over a semiconductor material layer (such as a lower source-level semiconductor layer 112 or an upper source-level semiconductor layer 116, or a substrate semiconductor layer 9). The first spacer material layers (such as first sacrificial material layers 142) and the second spacer material layers (such as first sacrificial material layers 42) are formed as, or are subsequently replaced with, first electrically conductive layers and second electrically conductive layer (246, 246D, 246SGD), respectively. Memory openings 49 vertically extending through the first alternating stack (132, 142), the inter-tier dielectric layer 180, and the second alternating stack (232, 242) can be formed. A first vertical semiconductor channel 160 can be formed in each memory opening 49 by depositing a first vertical semiconductor channel material layer 160L and removing portions of the first vertical semiconductor channel material layer 160L located above a horizontal plane including a top surface of the inter-tier dielectric layer 180. An upper end portion of the first vertical semiconductor channel 160 can be converted into an inter-tier doped region 363 by implanting dopants of the second conductivity type into the upper end portion of the first vertical semiconductor channel 160 within each memory opening. A second vertical semiconductor channel 260 can be formed on a top surface of the inter-tier doped region 363 in an upper portion of the memory opening 49. A drain region 63 having a doping of the second conductivity type can be formed at an upper end of the second vertical semiconductor channel 260.

While two alternating stacks {(132, 146, 146D), (232, 246, 246D)} with an inter-tier dielectric layer 180 and an inter-tier doped region 363 located between them are illustrated and described above, it should be noted that in another embodiment, the three-dimensional memory device may contain three or more alternating stacks having a respective inter-tier dielectric layer 180 and inter-tier doped region 363 located between each pair of adjacent alternating stacks. Thus, the three-dimensional memory device may contain two or more inter-tier dielectric layers 180 and inter-tier doped regions 363. Each of the inter-tier doped regions 363 facilitates GIDL generation at the respective joint (i.e., inter-tier) region.

According to various aspects of the present disclosure, a three-dimensional memory device is illustrated, which comprises: a first alternating stack (132, 146, 146D) of first insulating layers 132 and first electrically conductive layers (146, 146D) located over a semiconductor material layer; an inter-tier dielectric layer 180 located over the first alternating stack (132, 146, 146D); a second alternating stack (232, 246, 246D) of second insulating layers 232 and second electrically conductive layers (246, 246D) located over the inter-tier dielectric layer 180; a memory opening {49 or (149, 249)} vertically extending through the second alternating stack (232, 246, 246D), the inter-tier dielectric layer 180, and the first alternating stack (132, 146, 146D); and a memory opening fill structure 58 located in the memory opening {49 or (149, 249)} and comprising a first vertical semiconductor channel 160 vertically extending through the first alternating stack and having a doping of a first conductivity type, a second vertical semiconductor channel 260 vertically extending through the second alternating stack and having a doping of the first conductivity type, and an inter-tier doped region 363 having a doping of a second conductivity type located between the first and the second vertical semiconductor channels, and providing a first p-n junction with the first vertical semiconductor channel 160 and providing a second p-n junction with the second vertical semiconductor channel 260.

In one embodiment, the first electrically conductive layers comprise first word lines 146 and at least one first dummy word line 146D, the second electrically conductive layers comprise second word lines 246 and at least one second dummy word line 246D, the at least one first dummy word line 146D and the at least one second dummy word line 246D are located between the first word lines 146 and the second word lines 246, and the inter-tier doped region 363 is located between the at least one first dummy word line and the at least one second dummy word line.

In one embodiment, the first p-n junction is located at an interface between the inter-tier doped region 363 and an annular top surface of the first vertical semiconductor channel 160, and the second p-n junction is located at an interface between the inter-tier doped region 363 and an annular bottom surface of the second vertical semiconductor channel 260.

In one embodiment, the memory opening fill structure 58 comprises: a first dielectric core 162 contacting an inner sidewall of the first vertical semiconductor channel 160 and a bottom surface of the inter-tier doped region 363; and a second dielectric core 262 contacting an inner sidewall of the second vertical semiconductor channel 260 and a top surface of the inter-tier doped region 363.

In one embodiment, an interface between the inter-tier doped region 363 and the second vertical semiconductor channel 260 is located above a horizontal plane including an interface between a bottom surface of the second dielectric core 262 and the inter-tier doped region 363, and an interface between the inter-tier doped region 363 and the first vertical semiconductor channel 160 is located below a horizontal plane including an interface between a top surface of the first dielectric core 162 and the inter-tier doped region 363.

In one embodiment, a cylindrical sidewall of the inter-tier doped region 363 contacts a cylindrical surface segment of the inter-tier dielectric layer 180.

In one embodiment, the memory opening fill structure 58 comprises: a first vertical stack of memory elements (such as portions of a first memory material layer 154) located at levels of the first electrically conductive layers (e.g., first word lines 146) adjacent to the first vertical semiconductor channel 160; and a second vertical stack of memory elements (such as portions of a second memory material layer 254) located at levels of the second electrically conductive layers (e.g., second word lines 246) adjacent to the second vertical semiconductor channel 260.

In one embodiment, the first vertical stack of memory elements (such as portions of a first memory material layer 154) and the second vertical stack of memory elements (such as portions of a second memory material layer 254) comprise portions of a memory film 50 located at the levels of the first electrically conductive layers and the second electrically conductive layers, wherein the memory film 50 continuously extends through the first electrically conductive layers and the second electrically conductive layers.

In one embodiment, the inter-tier doped region 363 contacts a cylindrical surface segment of an inner sidewall of the memory film 50.

In one embodiment, an outer periphery of the first p-n junction contacts an inner sidewall of the memory film 50, and an outer periphery of the second p-n junction contacts the inner sidewall of the memory film 50.

In one embodiment, an outer periphery of the first p-n junction coincides with an inner periphery of an annular top surface of the first vertical semiconductor channel 160, and an inner periphery of the second p-n junction coincides with an inner periphery of an annular bottom surface of the second vertical semiconductor channel 260.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a first alternating stack of first insulating layers and first electrically conductive layers;
   an inter-tier dielectric layer located over the first alternating stack;
   a second alternating stack of second insulating layers and second electrically conductive layers located over the inter-tier dielectric layer;
   a memory opening vertically extending through the second alternating stack, the inter-tier dielectric layer, and the first alternating stack; and
   a memory opening fill structure located in the memory opening and comprising a first vertical semiconductor channel vertically extending through the first alternating stack and having a doping of a first conductivity type, a second vertical semiconductor channel vertically extending through the second alternating stack and having a doping of the first conductivity type, and an inter-tier doped region having a doping of a second conductivity type located between the first and the second vertical semiconductor channels, and providing a first p-n junction with the first vertical semiconductor channel and providing a second p-n junction with the second vertical semiconductor channel.

2. The three-dimensional memory device of claim 1, wherein:
   the first electrically conductive layers comprise first word lines and at least one first dummy word line;
   the second electrically conductive layers comprise second word lines and at least one second dummy word line;
   the at least one first dummy word line and the at least one second dummy word line are located between the first word lines and the second word lines;
   the inter-tier doped region is located between the at least one first dummy word line and the at least one second dummy word line; and
   a gate induced drain leakage (GIDL) current is generated at the inter-tier doped region between the first and the second vertical semiconductor channel during an erase step of the three-dimensional memory device.

3. The three-dimensional memory device of claim 1, wherein:
   the first p-n junction is located at an interface between the inter-tier doped region and an annular top surface of the first vertical semiconductor channel; and
   the second p-n junction is located at an interface between the inter-tier doped region and an annular bottom surface of the second vertical semiconductor channel.

4. The three-dimensional memory device of claim 3, wherein:
   the memory opening fill structure further comprises:
      a first dielectric core contacting an inner sidewall of the first vertical semiconductor channel and a bottom surface of the inter-tier doped region; and
      a second dielectric core contacting an inner sidewall of the second vertical semiconductor channel and a top surface of the inter-tier doped region;
   an interface between the inter-tier doped region and the second vertical semiconductor channel is located above a horizontal plane including an interface between a bottom surface of the second dielectric core and the inter-tier doped region; and an interface between the inter-tier doped region and the first vertical semiconductor channel is located below a horizontal plane including an interface between a top surface of the first dielectric core and the inter-tier doped region.

5. The three-dimensional memory device of claim 1, wherein a cylindrical sidewall of the inter-tier doped region contacts a cylindrical surface segment of the inter-tier dielectric layer.

6. The three-dimensional memory device of claim 1, wherein the memory opening fill structure comprises:
   a first vertical stack of memory elements located at levels of the first electrically conductive layers adjacent to the first vertical semiconductor channel; and
   a second vertical stack of memory elements located at levels of the second electrically conductive layers adjacent to the second vertical semiconductor channel.

7. The three-dimensional memory device of claim 6, wherein the first vertical stack of memory elements and the second vertical stack of memory elements comprise portions of at least one memory film located at the levels of the first electrically conductive layers and the second electrically conductive layers.

8. The three-dimensional memory device of claim 6, wherein:
   the first vertical stack of memory elements comprises portions of a first memory film vertically extending through the first alternating stack and located below a horizontal plane including a top surface of the inter-tier dielectric layer; and
   the second vertical stack of memory elements comprises portions a second memory film vertically extending through the second alternating stack and located above a horizontal plane including a bottom surface of the inter-tier dielectric layer.

9. The three-dimensional memory device of claim 8, wherein:
   an annular top surface of the first memory film contacts a bottom surface of the inter-tier doped region; and
   an annular bottom surface of the second memory film contacts a top surface of the inter-tier doped region.

10. The three-dimensional memory device of claim 8, wherein:
    the inter-tier doped region contacts a cylindrical surface segment of an upper end of an inner sidewall of the first memory film; and
    the inter-tier doped region contacts a cylindrical surface segment of a lower end of an inner sidewall of the second memory film.

11. The three-dimensional memory device of claim 6, wherein the first vertical stack of memory elements and the second vertical stack of memory elements comprise portions of a memory film located at the levels of the first electrically conductive layers and the second electrically conductive layers, wherein the memory film continuously extends through the first electrically conductive layers and the second electrically conductive layers.

12. The three-dimensional memory device of claim 11, wherein the inter-tier doped region contacts a cylindrical surface segment of an inner sidewall of the memory film.

13. The three-dimensional memory device of claim 11, wherein:
    an outer periphery of the first p-n junction contacts an inner sidewall of the memory film; and
    an outer periphery of the second p-n junction contacts the inner sidewall of the memory film.

14. The three-dimensional memory device of claim 1, wherein:
    an inner periphery of the first p-n junction coincides with an inner periphery of an annular top surface of the first vertical semiconductor channel; and
    an inner periphery of the second p-n junction coincides with an inner periphery of an annular bottom surface of the second vertical semiconductor channel.

15. A method of forming a three-dimensional semiconductor device, comprising:
    forming a first alternating stack of first insulating layers and first spacer material layers, an inter-tier dielectric layer, and a second alternating stack of second insulating layers and second spacer material layers over a semiconductor material layer, wherein the first spacer material layers and the second spacer material layers are formed as, or are subsequently replaced with, first electrically conductive layers and second electrically conductive layers, respectively; and
    forming a memory opening fill structure through the first alternating stack, the inter-tier dielectric layer, and the second alternating stack, wherein the memory opening fill structure comprises a first vertical semiconductor channel vertically extending through the first alternating stack and having a doping of a first conductivity type, a second vertical semiconductor channel vertically extending through the second alternating stack and having a doping of the first conductivity type, and an inter-tier doped region having a doping of a second conductivity type located between the first and the second semiconductor channel and providing a first p-n junction with the first vertical semiconductor channel and providing a second p-n junction with the second vertical semiconductor channel.

16. The method of claim 15, further comprising:
    forming a first-tier memory opening through the first alternating stack and the inter-tier dielectric layer;
    forming the first vertical semiconductor channel in the first-tier memory openings; and
    forming the inter-tier doped region in an upper portion of the first-tier memory opening on a top surface of the first vertical semiconductor tunnel.

17. The method of claim 16, wherein:
    the second alternating stack is formed over the inter-tier doped region; and
    the method further comprises forming a second-tier memory opening through the second alternating stack such that a top surface of the inter-tier doped region is exposed at a bottom of the second-tier memory opening.

18. The method of claim 16, further comprising forming a first memory film in the first-tier memory opening, wherein the first memory film comprises a vertical stack of first memory elements at levels of the first spacer material layers.

19. The method of claim 15, further comprising:
    forming a memory opening vertically extending through the first alternating stack, the inter-tier dielectric layer, and the second alternating stack;
    forming a first vertical semiconductor channel by depositing a first vertical semiconductor channel material layer and removing portions of the first vertical semiconductor channel material layer located above a horizontal plane including a top surface of the inter-tier dielectric layer; and
    converting an upper end portion of the first vertical semiconductor channel into the inter-tier doped region by implanting dopants of the second conductivity type into the upper end portion of the first vertical semiconductor channel.

20. The method of claim 19, further comprising:

forming the second vertical semiconductor channel on a top surface of the inter-tier doped region in an upper portion of the memory opening; and forming a drain region having a doping of the second conductivity type at an upper end of the second vertical semiconductor channel.

* * * * *